US010295905B2

(12) United States Patent
Komuro et al.

(10) Patent No.: US 10,295,905 B2
(45) Date of Patent: May 21, 2019

(54) RESIST COMPOSITION, METHOD FOR FORMING RESIST PATTERN, AND POLYMER COMPOUND

(71) Applicant: TOKYO OHKA KOGYO CO., LTD., Kawasaki-shi (JP)

(72) Inventors: Yoshitaka Komuro, Kawasaki (JP); Masatoshi Arai, Kawasaki (JP); Koshi Onishi, Kawasaki (JP); KhanhTin Nguyen, Kawasaki (JP); Takaya Maehashi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 3 days.

(21) Appl. No.: 15/651,177

(22) Filed: Jul. 17, 2017

(65) Prior Publication Data

US 2018/0024433 A1 Jan. 25, 2018

(30) Foreign Application Priority Data

Jul. 22, 2016 (JP) ................................. 2016-144949

(51) Int. Cl.
*G03F 7/004* (2006.01)
*G03F 7/30* (2006.01)
(Continued)

(52) U.S. Cl.
CPC ............ *G03F 7/0392* (2013.01); *C08F 18/02* (2013.01); *C08F 220/30* (2013.01);
(Continued)

(58) Field of Classification Search
CPC ........ G03F 7/0397; G03F 7/0392; G03F 7/30; C08F 220/30; C08F 222/10
(Continued)

(56) References Cited

U.S. PATENT DOCUMENTS

2002/0015913 A1* 2/2002 Uetani .................. C07C 381/00 430/270.1
2009/0104559 A1* 4/2009 Houlihan ................ C07C 55/08 430/270.1
(Continued)

FOREIGN PATENT DOCUMENTS

| | | |
|---|---|---|
| JP | A-2009-114381 | 5/2009 |
| JP | A-2012-220800 | 11/2012 |

*Primary Examiner* — John S Chu
(74) *Attorney, Agent, or Firm* — Knobbe Martens Olson & Bear LLP

(57) ABSTRACT

A resist composition which generates an acid upon exposure and whose solubility on a developing solution changes under the action of the acid, including a polymer compound having units represented by formulas (a0-1), (a0-2), and (a0-3) in an amount of 0 to 10 mol %. In the formulas, R is a hydrogen atom, an alkyl group having 1 to 5 carbon atoms, or a halogenated alkyl group having 1 to 5 carbon atoms, $Va^{01}$ and $Va^{03}$ are a divalent hydrocarbon group, $n_{a01}$ and $n_{a03}$ each are an integer of 0 to 2, $Ra^{0''}$ is a specific acid dissociable group, $Va^{02}$ is a divalent linking group containing a hetero atom or a single bond, $Ra^{07}$ is a monovalent organic group, $n_{a021}$ is an integer of 0 to 3, and $n_{a022}$ is an integer of 1 to 3.

(a0-1)

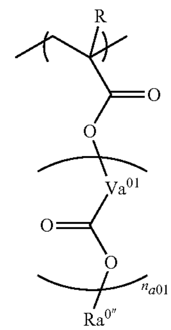

(a0-2)

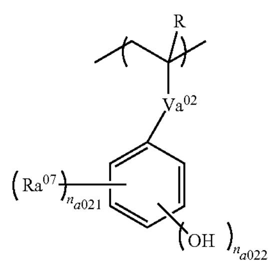

(a0-3)

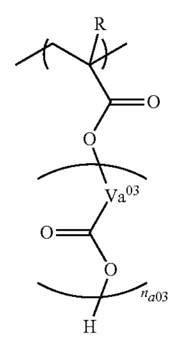

6 Claims, No Drawings

(51) Int. Cl.

| | |
|---|---|
| ***C08F 220/30*** | (2006.01) |
| ***C08F 222/10*** | (2006.01) |
| ***G03F 7/039*** | (2006.01) |
| ***G03F 7/038*** | (2006.01) |
| ***C08F 18/02*** | (2006.01) |
| *H01L 21/02* | (2006.01) |

(52) U.S. Cl.
CPC .......... *C08F 222/10* (2013.01); *G03F 7/0382* (2013.01); *G03F 7/0397* (2013.01); *G03F 7/30* (2013.01); *H01L 21/02* (2013.01)

(58) Field of Classification Search
USPC ..... 430/270.1, 905, 910, 326; 526/320, 321, 526/326
See application file for complete search history.

(56) References Cited

U.S. PATENT DOCUMENTS

2012/0258402 A1 10/2012 Sato et al.
2013/0209934 A1* 8/2013 Ongayi .................. G03F 7/004 430/285.1

* cited by examiner

RESIST COMPOSITION, METHOD FOR FORMING RESIST PATTERN, AND POLYMER COMPOUND

BACKGROUND OF THE INVENTION

Field of the Invention

The present invention relates to a resist composition, a method for forming a resist pattern, and a polymer compound.

This application claims priority to Japanese Patent Application No. 2016-144949 filed Jul. 22, 2016, the entire content of which is hereby incorporated by reference.

Background Art

A lithography technique includes steps of forming a resist film composed of a resist material on a substrate, selectively exposing the resist film and performing a developing treatment, thereby forming a resist pattern having a predetermined shape. A resist material in which an exposed area of the resist film is dissolved in a developing solution is referred to as a positive-type resist material, and a resist material in which an exposed area of the resist film is not dissolved in a developing solution is referred to as a negative-type resist material.

In recent years, in the manufacturing of semiconductor devices and liquid crystal display elements, pattern miniaturization has been rapidly progressed in accordance with the progress of the lithography technique. As a miniaturization technique, generally, shortening the wavelength (realizing high energy) of an exposure light source has been performed. Specifically, ultraviolet rays represented by a g-line and an i-line were used in the related art, but KrF excimer laser or ArF excimer laser has been used for the mass production of semiconductor devices these days. In addition, with such an excimer laser, studies regarding extreme ultraviolet rays (EUV) having a short wavelength (high energy), electron beams (EB), and an X-ray have been conducted.

The resist material is required to have lithography properties such as sensitivity with respect to the exposure light sources and resolution capable of reproducing patterns of minute dimensions.

In the related art, as a resist material satisfying such a requirement, a chemically amplified resist composition containing a base material component whose solubility in a developing solution changes under the action of an acid, and an acid generator component which generates an acid upon exposure has been used.

For example, in the case where the developing solution is an alkali developing solution (alkali developing process), a chemically amplified positive-type resist composition which contains a resin component (a base resin) whose solubility in the alkali developing solution increases under the action of the acid and an acid generator component is typically used. When a resist film formed by the resist composition is selectively exposed to the light at the time of forming a resist pattern, an acid is generated in the exposed area from the acid generator component, the polarity of the base resin is increased under the action of the acid, and thereby the exposed area of the resist film becomes soluble in the alkali developing solution. For this reason, a positive-type pattern in which an unexposed area of the resist film remains as a pattern is formed by the alkali developing solution.

On the other hand, in the case where such a chemically amplified resist composition is applied to a solvent developing process in which a developing solution (an organic developing solution) containing an organic solvent is used, the solubility in the organic developing solution is relatively decreased when the polarity of the base resin is increased, and thus the unexposed area of the resist film is dissolved and removed by the organic developing solution so as to form a negative-type resist pattern in which the exposed area of the resist film remains as a pattern. The solvent developing process in which such a negative-type resist pattern is formed is referred to as a negative-type developing process in some cases.

The base resin used for the chemically amplified resist composition generally has a plurality of structural units for improving the lithography properties.

For example, in the case of the resin component in which the solubility in the alkali developing solution is increased under the action of the acid, a structural unit including an acid-decomposable group which is decomposed by the action of an acid generated from the acid generator or the like so as to increase the polarity is used, and a structural unit including a lactone-containing cyclic group and a structural unit including a polar group such as a hydroxyl group are also used in combination.

As an acid generator component used in the chemically amplified resist composition, various kinds of acid generator components have been proposed. For example, an onium salt-based acid generator such as an iodonium salt and a sulfonium salt, an oxime sulfonate-based acid generator, a diazomethane-based acid generator, a nitrobenzylsulfonate-based acid generator, an iminosulfonate-based acid generator, and a disulfone-based acid generator have been known.

As the onium salt-based acid generator, those containing an onium ion such as triphenyl sulfonium in a cation part are mainly used. In an anion part of the onium salt-based acid generator, an alkylsulfonic acid ion or a fluorinated alkylsulfonic acid ion in which at least one hydrogen atom in an alkyl group is substituted with a fluorine atom is generally used.

In addition, in the forming of the resist pattern, behavior of the acid generated from the acid generator component upon exposure is regarded as one element that greatly affects lithography properties.

Particularly, at the time of exposing the resist material to extreme ultraviolet ray (EUV) or an electron beam (EB), acid diffusion controllability becomes a problem in the resist material. In order to control the acid diffusion, a method for variously changing the design of a polymer compound in the related art has been proposed.

For example, a resist composition in which reactivity to an acid is improved and solubility in a developing solution is improved by employing a polymer compound containing a specific acid dissociable functional group is disclosed (for example, refer to Japanese Unexamined Patent Application, Publication No. 2009-114381 and Japanese Unexamined Patent Application, Publication No. 2012-220800).

SUMMARY OF THE INVENTION

As the lithography technique further progresses and the miniaturization of the resist pattern progresses more and more, for example, a target of the lithography performed by electron beams and EUV is to form fine resist patterns of several tens of nanometers. As such, as the resist pattern dimension is small, the resist composition requires high sensitivity and lithography properties (resolution, reduced roughness, and the like) with respect to an exposure light source.

However, in the resist composition of the related art as described above, when high sensitivity with respect to the exposure light source such as EUV is realized, it is less likely to obtain a desired resist pattern shape, and it is difficult to satisfy any of the properties described above.

The present invention has been made in consideration of the circumstance, and an object thereof is to provide a new polymer compound which is useful as a base material component for a resist composition, a resist composition containing the polymer compound, and a method for forming a resist pattern by using the resist composition.

In the forming of the resist pattern, a polymer compound having a structural unit containing a hydroxystyrene skeleton, and a structural unit containing an acid-decomposable group which is decomposed by the action of the acid so as to increase the polarity is useful particularly at the time of exposing a resist film to EUV or EB.

However, according to studies, the inventors of the present invention have confirmed that in the case of using a resist composition which contains a polymer compound obtained by copolymerizing a monomer that derives two kinds of structural units at the time of forming a resist pattern by EUV or EB as an exposure light source, there is a problem in that the lithography properties tend to be adversely affected. In contrast, the inventors have found that the lithography properties are improved by employing a polymer compound obtained by having the two kinds of structural units and controlling a content of a structural unit derived from an (α-substituted) acrylic acid or a monomer of the derivative thereof, as a base material component, and thereby the present invention has been completed.

That is, according to a first aspect of the present invention, a resist composition which generates an acid upon exposure and whose solubility in a developing solution changes under the action of an acid, contains a base material component (A) whose solubility in the developing solution changes under the action of an acid and which contains a polymer compound (A1) having a structural unit (a01) represented by general formula (a0-1), a structural unit (a02) represented by general formula (a0-2), and a structural unit (a03) represented by general formula (a0-3), and a ratio of the structural unit (a03) in the polymer compound (A1) is greater than 0 mol % and equal to or less than 10 mol % with respect to the total of all the structural units constituting the polymer compound (A1).

(a0-1)

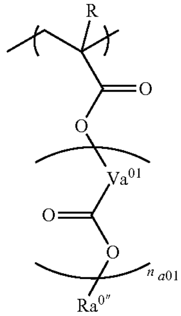

-continued (a0-r1-1)

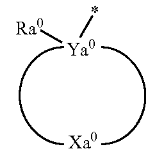

(a0-f1)

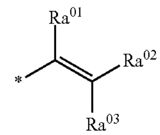

(a0-r1-2)

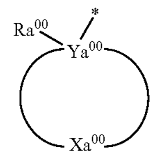

(a0-r1-3)

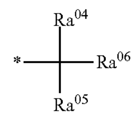

In general formula (a0-1), R is a hydrogen atom, an alkyl group having 1 to 5 carbon atoms, or a halogenated alkyl group having 1 to 5 carbon atoms, $Va^{01}$ is a divalent hydrocarbon group which may have an ether bond, $n_{a01}$ is an integer of 0 to 2, and $Ra^{0''}$ is an acid dissociable group represented by general formula (a0-r1-1), (a0-r1-2), or (a0-r1-3). In general formula (a0-r1-1), $Ya^{0}$ represents a carbon atom. $Xa^{0}$ is a group which forms an alicyclic hydrocarbon group together with $Ya^{0}$. $Ra^{0}$ is an aromatic hydrocarbon group which may have a substituent, or a group represented by general formula (a0-f1). In general formula (a0-f1), $Ra^{01}$ to $Ra^{03}$ are each independently an aliphatic hydrocarbon group which may have a substituent, or a hydrogen atom. Two or more of $Ra^{01}$ to $Ra^{03}$ may be bonded to each other to form a cyclic structure. In general formula (a0-r1-2), $Ya^{00}$ represents a carbon atom. $Xa^{00}$ is a group which forms a condensed ring of an alicyclic hydrocarbon group and an aromatic hydrocarbon group together with $Ya^{00}$. $Ra^{00}$ is an alkyl group having 1 to 10 carbon atoms, an aromatic hydrocarbon group which may have a substituent, or a group represented by general formula (a0-f1). In general formula (a0-r1-3), $Ra^{04}$ and $Ra^{05}$ are each independently a monovalent chain saturated hydrocarbon group having 1 to 10 carbon atoms or a hydrogen atom. At least one hydrogen atom of the chain saturated hydrocarbon group may be substituted. $Ra^{06}$ is an aromatic hydrocarbon group which may have a substituent. A symbol of * represents a bond.

(a0-2)

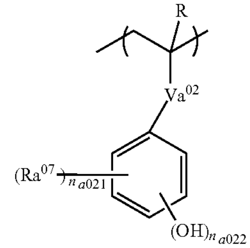

-continued (a0-3)

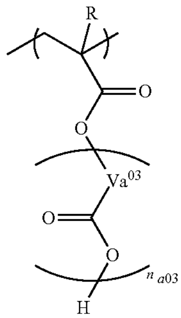

In general formula (a0-2), R is a hydrogen atom, an alkyl group having 1 to 5 carbon atoms, or a halogenated alkyl group having 1 to 5 carbon atoms. $Va^{02}$ is a divalent linking group containing a heteroatom, or a single bond. $Ra^{07}$ is a monovalent organic group. $n_{a021}$ is an integer 0 to 3. $n_{a022}$ is an integer of 1 to 3. In general formula (a0-3), R is a hydrogen atom, an alkyl group having 1 to 5 carbon atoms, or a halogenated alkyl group having 1 to 5 carbon atoms. $Va^{03}$ is a divalent hydrocarbon group which may have an ether bond. $n_{a03}$ is an integer of 0 to 2.

According to a second aspect of the present invention, a method for forming a resist pattern includes a step of forming a resist film on a support by using the resist composition according to the first aspect of the present embodiment, a step of exposing the resist film, and a step of forming a resist pattern developing the exposed resist film.

According to a third aspect of the present invention, a polymer compound has a structural unit (a01) represented by general formula (a0-1), a structural unit (a02) represented by general formula (a0-2), and a structural unit (a03) represented by general formula (a0-3), in which a ratio of the structural unit (a03) is greater than 0 mol % and equal to or less than 10 mol % with respect to the total of all the structural units constituting the polymer compound.

According to the present invention, it is possible to provide a new polymer compound which is useful as a base material component for a resist composition, a resist composition containing the polymer compound, and a method for forming a resist pattern by using the resist composition.

According to the resist composition of the present invention, in the forming of the resist pattern, it is possible to form a resist pattern having an excellent shape, and to improve the limit resolution.

DETAILED DESCRIPTION OF THE INVENTION

In the specification and claims of the present application, "aliphatic" is a relative concept with respect to aromatics, and is defined as a group, a compound, or the like having no aromaticity.

"Alkyl group" is assumed to contain a linear, branched, or cyclic monovalent saturated hydrocarbon group unless otherwise noted. The same is true for an alkyl group in an alkoxy group.

"Alkylene group" is assumed to contain a linear, branched, and cyclic divalent saturated hydrocarbon group unless otherwise noted.

"Halogenated alkyl group" is a group obtained by substituting at least one hydrogen atom in an alkyl group with halogen atoms, and examples of the halogen atom include a fluorine atom, a chlorine atom, a bromine atom, and an iodine atom.

"Fluorinated alkyl group" or "fluorinated alkylene group" means a group obtained by substituting at least one hydrogen atom in an alkyl group or an alkylene group with a fluorine atom.

"Structural unit" means a monomer unit constituting a polymer compound (a resin, a polymer, or a copolymer).

The phrase "may have a substituent" means both the case of substituting a hydrogen atom (—H) with a monovalent group and the case of substituting a methylene group (—$CH_2$—) with a divalent group.

"Exposure" is a concept including radiation irradiation in general.

"Structural unit derived from acrylic ester" means a structural unit formed by cleavage of an ethylenic double bond of the acrylic ester.

"Acrylic ester" is a compound obtained by substituting a hydrogen atom at a carboxy group terminal of an acrylic acid ($CH_2$═CH—COOH) with an organic group.

The acrylic ester may be obtained by substituting a hydrogen atom bonded to an α-position carbon atom with a substituent. The substituent)($R^{\alpha 0}$) with which the hydrogen atom bonded to the α-position carbon atom is substituted is an atom other than the hydrogen atom or a group, and examples thereof include an alkyl group having 1 to 5 carbon atoms and a halogenated alkyl group having 1 to 5 carbon atoms. In addition, it is assumed that the acrylic ester includes itaconic acid diester obtained by substituting the substituent ($R^{\alpha 0}$) with a substituent containing an ester bond, and α-hydroxyacrylic ester obtained by substituting the substituent ($R^{\alpha 0}$) with a group modified with a hydroxyalkyl group or a hydroxyl group thereof. Note that, the α-position carbon atoms in the acrylic ester is a carbon atom to which a carbonyl group of an acrylic acid is bonded unless otherwise noted.

Hereinafter, acrylic ester obtained by substituting the hydrogen atom bonded to an α-position carbon atom with a substituent may be referred to as α-substituted acrylic ester. In addition, both of the acrylic ester and the α-substituted acrylic ester may be referred to as "(α-substituted) acrylic ester". In addition, acrylic acid obtained by substituting a hydrogen atom bonded to an α-position carbon atom with a substituent may be referred to as α-substituted acrylic ester. In addition, both of the acrylic ester and the α-substituted acrylic acid may be referred to as "(α-substituted) acrylic ester".

"Structural unit derived from acrylamide" means a structural unit formed by cleavage of an ethylenic double bond of the acrylamide.

The acrylamide may be obtained by substituting a hydrogen atom bonded to an α-position carbon atom with a substituent or may be obtained by substituting one or both of hydrogen atoms in an amino group of acrylamide with a substituent. Note that, the α-position carbon atoms in the acrylamide are a carbon atom to which a carbonyl group of acrylamide is bonded unless otherwise noted.

As the substituent with which a hydrogen atom bonded to the α-position carbon atoms in the acrylamide is substituted, the same substituent as that (substituent ($R^{\alpha 0}$)) exemplified as an α-position substituent in the α-substituted acrylic ester can be used.

"Structural unit derived from hydroxystyrene" means a structural unit formed by cleavage of an ethylenic double bond of hydroxystyrene. "Structural unit derived from a hydroxystyrene derivative" means a structural unit formed by cleavage of an ethylenic double bond of a hydroxystyrene derivative.

"Hydroxystyrene derivative" includes those obtained by substituting an α-position hydrogen atom of hydroxystyrene with other substituents such as an alkyl group and a halogenated alkyl group, and derivatives thereof. Examples of the derivatives include a derivative obtained by substituting a hydrogen atom of a hydroxyl group of hydroxystyrene in which the α-position hydrogen atom may be substituted with a substituent with an organic group; and a derivative in which a substituent other than the hydroxyl group is bonded to a benzene ring of hydroxystyrene in which the α-position hydrogen atom may be substituted with a substituent. Here, the α-position (α-position carbon atom) means a carbon atom to which a benzene ring is bonded unless otherwise noted.

As the substituent with which the α-position hydrogen atoms in the hydroxystyrene are substituted, the same substituent as that exemplified as an α-position substituent in the α-substituted acrylic ester can be used.

"Structural unit derived from a vinylbenzoic acid or a vinylbenzoic acid derivative" means a structural unit formed by cleavage of an ethylenic double bond of a vinylbenzoic acid or a vinylbenzoic acid derivative.

"Vinylbenzoic acid derivative" includes those obtained by substituting an α-position hydrogen atom of a vinylbenzoic acid with other substituents such as an alkyl group and a halogenated alkyl group, and derivatives thereof. Examples of the derivatives include a derivative obtained by substituting a hydrogen atom of a carboxy group of the vinylbenzoic acid in which the α-position hydrogen atom may be substituted with a substituent with an organic group; and a derivative in which a substituent other than the hydroxyl group and the carboxy group is bonded to a benzene ring of the vinylbenzoic acid in which the α-position hydrogen atom may be substituted with a substituent. Here, the α-position (α-position carbon atom) means a carbon atom to which a benzene ring is bonded unless otherwise noted.

"Styrene" is a concept including styrene and those obtained by substituting an α-position hydrogen atom in the styrene with other substituents other than an alkyl group and a halogenated alkyl group.

"Styrene derivative" is a concept including those obtained by substituting the α-position hydrogen atoms in the styrene with other substituents such as an alkyl group and a halogenated alkyl group, and the derivatives thereof. Examples of the derivatives include a derivative in which a substituent is bonded to a benzene ring of hydroxystyrene in which the α-position hydrogen atom may be substituted with a substituent. Here, the α-position (α-position carbon atom) means a carbon atom to which a benzene ring is bonded unless otherwise noted.

"Structural unit derived from the styrene" and "structural unit derived from the styrene derivative" mean structural units formed by cleavage of an ethylenic double bond of the styrene or the styrene derivative.

The alkyl group as the α-position substituent is preferably a linear or branched alkyl group, and specifically, examples thereof include an alkyl group having 1 to 5 carbon atoms (a methyl group, an ethyl group, a propyl group, an isopropyl group, an n-butyl group, an isobutyl group, a tert-butyl group, a pentyl group, an isopentyl group, and a neopentyl group).

In addition, specific examples of the halogenated alkyl group as the α-position substituent include a group obtained by substituting at least one hydrogen atom in "the alkyl group as the α-position substituent" with a halogen atom. Examples of the halogen atom include a fluorine atom, a chlorine atom, a bromine atom, and an iodine atom, and particularly, a fluorine atom is preferable.

Further, specific examples of the hydroxyalkyl group as the α-position substituent include a group obtained by substituting at least one hydrogen atom in the "alkyl group as the α-position substituent" with a hydroxyl group. The number of the hydroxyl groups in the hydroxyalkyl group is preferably 1 to 5, and is most preferably 1.

Resist Composition

In the resist composition of the present embodiment, an acid is generated upon exposure, and the solubility in a developing solution changes under the action of an acid.

The resist composition contains a base material component (A) (hereinafter, also referred to as "(A) component") whose solubility in the developing solution changes under the action of an acid.

When a resist film is formed by using the resist composition of the present embodiment, and the resist film is selectively exposed to the light, an acid is generated in the exposed area of the resist film, and the solubility of the (A) component in the developing solution changes under the action of an acid; on the other hand, the solubility of the (A) component in the developing solution is not changed in the unexposed area of the resist film. Therefore, a difference in the solubility in the developing solution occurs between the exposed area and the unexposed area of the resist film. For this reason, when the resist film is developed, in the case where the resist composition is a positive-type, the exposed area of the resist film is dissolved and removed so as to form a positive-type resist pattern, and in the case where the resist composition is a negative-type, the unexposed area of the resist film is dissolved and removed so as to form a negative-type resist pattern.

In the present specification, the resist composition with which the exposed area of the resist film is dissolved and removed so as to form the positive-type resist pattern is referred to as a positive-type resist composition, and the resist composition with which the unexposed area of the resist film is dissolved and removed so as to form a negative-type resist pattern is referred to as a negative-type resist composition.

The resist composition of the present embodiment may be a positive-type resist composition, or may be a negative-type resist composition.

Further, the resist composition of the present embodiment may be used for an alkali developing process in which an alkali developing solution is used for a developing treatment at the time of forming a resist pattern, or may be used for a solvent developing process in which a developing solution (an organic developing solution) containing an organic solvent is used for the developing treatment.

The resist composition of the present embodiment has an acid generating ability to generate an acid upon exposure, and the (A) component may generate an acid upon exposure, and an additive component compounded separately from the (A) component may generate an acid upon exposure.

Specifically, the resist composition of the present embodiment may be (1) a composition containing an acid generator component (B) (hereinafter, referred to as "(B) component") which generates an acid upon exposure, (2) a composition containing the (A) component which is a component which generates an acid upon exposure, or (3) a composition containing the (A) component which is a component which generates an acid upon exposure and further containing the (B) component.

That is, in the case of the above descriptions (2) and (3), the (A) component is "a base material component which generates an acid upon exposure and whose solubility in the developing solution changes under the action of an acid". In the case where the (A) component is the base material component which generates an acid upon exposure and whose solubility in the developing solution changes under the action of an acid, an (A1) component described below is preferably a polymer compound which generates an acid upon exposure and whose solubility in developing solution changes under the action of an acid. Examples of such a polymer compound include a resin having a structural unit which generates an acid upon exposure. As the structural unit which generates an acid upon exposure, well-known structural units can be used.

The resist composition of the present embodiment is particularly preferably the case of the above (1).

Component (A)

The (A) component is a base material component whose solubility in a developing solution changes under the action of an acid.

The "base material component" in the present invention is an organic compound having film-forming ability, and is preferably an organic compound having the molecular weight of 500 or more. When the molecular weight of the organic compound is 500 or more, the film-forming ability is improved, and a resist pattern at a nano level is easily formed.

The organic compound used as a base material component is generally classified into a non-polymer and a polymer.

Generally, a non-polymer having the molecular weight which is equal to or greater than 500 and less than 4,000 is used as the non-polymer. Hereinafter, a non-polymer having the molecular weight which is equal to or greater than 500 and less than 4,000 is referred to as "low molecule compound".

Generally, a polymer having a molecular weight of 1,000 or more is used. Hereinafter, a polymer having a molecular weight of 1,000 or more is referred to as "resin", "polymer compound", or "polymer".

As the molecular weight of the polymer, the mass average molecular weight expressed in terms of polystyrene by gel permeation chromatography (GPC) is used.

In the case where the resist composition of the present embodiment is the "negative-type resist composition for an alkali developing process", which forms a negative-type resist pattern in the alkali developing process, or is the "positive-type resist composition for a solvent developing process", which forms a positive-type resist pattern in the solvent developing process, a base material component (A-2) (hereinafter, referred to as "(A-2) component") which is soluble in the alkali developing solution is preferably used as the (A) component, and a crosslinking agent component is further mixed thereto. In the resist composition, when the acid is generated from the (B) component upon exposure, the crosslinking occurs between the (A-2) component and the crosslinking agent component under the action of the acid, and as a result, the solubility in the alkali developing solution is decreased (the solubility in the organic developing solution is increased).

For this reason, in the forming of the resist pattern, when the resist film obtained by coating the support with the resist composition is selectively exposed to the light, the exposed area of the resist film is changed to be sparingly soluble (the solubility in the organic developing solution) in the alkali developing solution; on the other hand, the solubility of the unexposed area of the resist film in the alkali developing solution is not changed (sparing solubility in the organic developing solution), and thus a negative-type resist pattern is formed by developing the resist film with the alkali developing solution. At this time, a positive-type resist pattern is formed by developing the resist film with the organic developing solution.

Preferred examples of the (A-2) component include a resin (hereinafter, referred to as an "alkali-soluble resin") which is soluble in the alkali developing solution.

As the alkali-soluble resin, a resin having a structural unit derived from at least one selected from α-(hydroxyalkyl) acrylate and α-(hydroxyalkyl) acrylic acid alkyl ester (preferably, alkyl ester having 1 to 5 carbon atoms), which is disclosed in Japanese Unexamined Patent Application, Publication No. 2000-206694; an acrylic resin in which a hydrogen atom bonded to an α-position carbon atom having a sulfonamide group may be substituted with a substituent, or a polycycloolefin resin, which is disclosed in U.S. Pat. No. 6,949,325; an acrylic resin which contains fluorinated alcohol and in which a hydrogen atom bonded to the α-position carbon atom may be substituted with a substituent, which is disclosed in U.S. Pat. No. 6,949,325, Japanese Unexamined Patent Application, Publication No. 2005-336452, and Japanese Unexamined Patent Application, Publication No. 2006-317803; and a polycycloolefin resin containing fluorinated alcohol, which is disclosed in Japanese Unexamined Patent Application, Publication No. 2006-259582 are preferably used since it is possible to form an excellent resist pattern with little swelling.

Note that, the α-(hydroxyalkyl)acrylate represents one or both of an acrylic acid in which a hydrogen atom is bonded to the α-position carbon atom to which a carboxy group is bonded, and α-hydroxyalkyl acrylate in which a hydroxyalkyl group (preferably, a hydroxyalkyl group having 1 to 5 carbon atoms) is bonded to the α-position carbon atom, among acrylic acids in which a hydrogen atom bonded to the α-position carbon atom may be substituted with a substituent.

As the crosslinking agent component, an amino-based crosslinking agent such as glycoluril having a methylol group or an alkoxy methyl group, or a melamine-based crosslinking agent is preferably used, for example, from the viewpoint that it is easy to form an excellent resist pattern with little swelling. The mixing content of the crosslinking agent component is preferably 1 to 50 parts by mass with respect to 100 parts by mass of the alkali-soluble resin.

In the case where the resist composition of the present embodiment is the "positive-type resist composition for an alkali developing process", which forms a positive-type resist pattern in the alkali developing process, or is "negative-type resist composition for a solvent developing process", which forms a negative-type resist pattern in the solvent developing process, a base material component (A-1) (hereinafter, referred to as "(A-1) component") whose polarity is increased under the action of the acid is preferably used as the (A) component. When the (A-1) component is used, the polarity of the base material component is changed before and after exposure, and thus it is possible to obtain satisfactory development contrast not only in the alkali developing process, but also in the solvent developing process.

In the case of the alkali developing process, the (A-1) component has a sparing solubility in the alkali developing solution before exposure, and for example, when an acid is generated from the (B) component upon exposure, the polarity is increased under the action of the acid and thus the solubility in the alkali developing solution is increased. For this reason, in the forming of the resist pattern, when the resist film obtained by coating the support with the resist composition is selectively exposed to the light, the sparing solubility of the exposed area of the resist film is changed to be soluble in the alkali developing solution; on the other hand, the solubility of the unexposed area of the resist film remains to be alkali sparing solubility without being changed, and thus the positive-type resist pattern is formed by alkali developing the resist film.

On the other hand, in the case of the solvent developing process, the (A-1) component has the increased solubility in the organic developing solution before exposure, and when the acid is generated from the (B) component upon exposure, the polarity is increased under the action of the acid, and thus the solubility in the organic developing solution is decreased. For this reason, in the forming of the resist pattern, when the resist film obtained by coating the support with the resist composition is selectively exposed to the light, the solubility of the exposed area of the resist film is changed to the sparing solubility in the organic developing solution; on the other hand, the solubility of the unexposed area of the resist film is not changed, and thus it is possible to impart a contrast between the exposed area and the unexposed area by developing the resist film with the organic developing solution, thereby forming the negative-type resist pattern.

In the resist composition of the present embodiment, the (A) component is preferably the (A-1) component. That is, the resist composition of the present embodiment is preferably the "positive-type resist composition for an alkali developing process", which forms the positive-type resist pattern in the alkali developing process, or the "negative-type resist composition for a solvent developing process", which forms the negative-type resist pattern in the solvent developing process.

The (A) component in the resist composition of the present embodiment contains a polymer compound (A1) (hereinafter, also referred to as "(A1) component") having a structural unit (a01) represented by general formula (a0-1), a structural unit (a02) represented by general formula (a0-2), a structural unit (a03) represented by general formula (a0-3).

The (A) component may contain other polymer compounds and/or a low molecule compound in addition to the (A1) component.

(A1) Component

The (A1) component is a polymer compound having a structural unit (a01) represented by general formula (a0-1), a structural unit (a02) represented by general formula (a0-2), and a structural unit (a03) represented by general formula (a0-3).

In the (A1) component, the ratio of the structural unit (a03) is greater than 0 mol % and equal to or less than 10 mol % with respect to the total of the entire structural units constituting (A1) component.

Structural Unit (a01)

The structural unit (a01) is a structural unit represented by general formula (a0-1).

The structural unit (a01) contains a specific acid-decomposable group in which the polarity is increased under the action of the acid.

"Acid-decomposable group" is a group having the acid decomposability with which at least a portion of the bonds in the structure of the acid-decomposable group can be cleaved under the action of the acid. In the structural unit (a01), under the action of the acid, a bond between the acid dissociable group ($Ra^{0''}$) and an oxygen atom adjacent to $Ra^{0''}$ is cleaved so as to dissociate $Ra^{0''}$ and a polar group (carboxy group) having high polarity is generated, thereby increasing the polarity. Examples of the acid dissociable group ($Ra^{0''}$) in the present embodiment include groups capable of dissociating with relatively low energy are selected.

(a0-1)

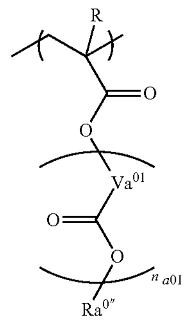

In general formula (a0-1), R is a hydrogen atom, an alkyl group having 1 to 5 carbon atoms, or a halogenated alkyl group having 1 to 5 carbon atoms. $Va^{01}$ is a divalent hydrocarbon group which may have an ether bond. $n_{a01}$ is an integer of 0 to 2. $Ra^{0''}$ is an acid dissociable group represented by general formula (a0-r1-1), (a0-r1-2), or (a0-r1-3).

In general formula (a0-1), R is a hydrogen atom, an alkyl group having 1 to 5 carbon atoms, or a halogenated alkyl group having 1 to 5 carbon atoms.

An alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms for R is a group obtained by substituting at least one hydrogen atom of "an alkyl group having 1 to 5 carbon atoms for R" with a halogen atom. Examples of the halogen atom include a fluorine atom, a chlorine atom, a bromine atom, and an iodine atom, and particularly, a fluorine atom is preferable.

R is preferably a hydrogen atom, an alkyl group having 1 to 5 carbon atoms, or a fluorinated alkyl group having 1 to 5 carbon atoms, is further preferably a hydrogen atom or a methyl group, and is still further preferably a methyl group in terms of industrial availability.

In general formula (a0-1), $Va^{01}$ is a divalent hydrocarbon group which may have an ether bond.

A divalent hydrocarbon group for $Va^{01}$ may be an aliphatic hydrocarbon group, or may be an aromatic hydrocarbon group.

An aliphatic hydrocarbon group as a divalent hydrocarbon group for $Va^{01}$ may be saturated or unsaturated, and is usually preferably saturated.

More specifically, examples of the aliphatic hydrocarbon group include a linear or branched aliphatic hydrocarbon group, or an aliphatic hydrocarbon group containing a ring in the structure.

The number of carbon atoms of the linear aliphatic hydrocarbon group is preferably 1 to 10, is further preferably 1 to 6, is further still preferably 1 to 4, and is most preferably 1 to 3.

As a linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms of the branched aliphatic hydrocarbon group is preferably 2 to 10, is further preferably 3 to 6, is still further preferably 3 or 4, and is most preferably 3.

As a branched aliphatic hydrocarbon group, a branched alkylene group is preferable, and specific examples thereof include an alkyl alkylene group such as an alkyl methylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkyl ethylene group such as —$CH(CH_3)CH_2$—, —$CH(CH_3)CH(CH_3)$—, —$C(CH_3)_2CH_2$—, —$CH(CH_2CH_3)CH_2$—, —$C(CH_2CH_3)_2$—$CH_2$—; an alkyl trimethylene group such as —$CH(CH_3)CH_2CH_2$— and —$CH_2CH(CH_3)CH_2$—; and an alkyl tetramethylene group such as —$CH(CH_3)CH_2CH_2CH_2$— and —$CH_2CH(CH_3)CH_2CH_2$—. As an alkyl group in an alkyl alkylene group, a linear alkyl group having 1 to 5 carbon atoms is preferable.

As the aliphatic hydrocarbon group containing a ring in the structure, an alicyclic hydrocarbon group (a group obtained by removing two hydrogen atoms from an aliphatic hydrocarbon ring), a group in which the alicyclic hydrocarbon group is bonded to a terminal of the linear or branched aliphatic hydrocarbon group, and a group in which the alicyclic hydrocarbon group is present in the middle of the linear or branched aliphatic hydrocarbon group. Examples of the linear or branched aliphatic hydrocarbon group include the same group as the linear aliphatic hydrocarbon group or the branched aliphatic hydrocarbon group.

The number of carbon atoms of the alicyclic hydrocarbon group is preferably 3 to 20, and is further preferably 3 to 12.

The alicyclic hydrocarbon group may be a polycyclic group, and may be a monocyclic group. The monocyclic alicyclic hydrocarbon group is preferably a group obtained by removing two hydrogen atoms from the monocycloalkane. The number of the carbon atoms of the monocycloalkane is preferably 3 to 6, and specific examples thereof include cyclopentane and cyclohexane. The polycyclic alicyclic hydrocarbon group is preferably a group obtained by removing two hydrogen atoms from the polycycloalkane, and the number of the carbon atoms of the polycycloalkane is preferably 7 to 12. Specific examples thereof include adamantane, norbornane, isobornane, tricyclodecane, and tetracyclododecane.

An aromatic hydrocarbon group as a divalent hydrocarbon group for $Va^{01}$ is a hydrocarbon group having an aromatic ring.

The number of carbon atoms of the aromatic hydrocarbon group is preferably 3 to 30, is further preferably 5 to 30, is still further preferable of 5 to 20, is particularly, preferably 6 to 15, and is most preferably 6 to 10. Here, it is assumed that the number of carbon atoms does not include the number of carbon atoms in the substituent.

Specific examples of the aromatic ring having an aromatic hydrocarbon group include an aromatic hydrocarbon ring such as benzene, biphenyl, fluorene, naphthalene, anthracene, and phenanthrene; and aromatic heterocycle in which a portion of the carbon atoms which constitute the aromatic hydrocarbon ring is substituted with a heteroatom. Examples of the heteroatom in the aromatic heterocycle include an oxygen atom, a sulfur atom, and a nitrogen atom.

Specific examples of the aromatic hydrocarbon group include a group (an arylene group) obtained by removing two hydrogen atoms from the above-mentioned aromatic hydrocarbon ring; and a group (for example, a group obtained by further removing one hydrogen atom from an aryl group in an aryl alkyl group such as a benzyl group, a phenethyl group, a 1-naphthyl methyl group, a 2-naphthyl methyl group, a 1-naphthyl ethyl group, and a 2-naphthyl ethyl group) in which one hydrogen atom of a group (an aryl group) obtained by removing one hydrogen atom from the above-mentioned aromatic hydrocarbon ring is substituted with an alkylene group. The number of carbon atoms of the alkylene group (an alkyl chain in the aryl alkyl group) is preferably 1 to 4, is further preferably 1 or 2, and is particularly preferably 1.

In general formula (a0-1), $n_{a01}$ is an integer of 0 to 2, is preferably 0 or 1, and is further preferably 0.

In general formula (a0-1), $Ra^{0''}$ is an acid dissociable group represented by general formula (a0-r1-1), (a0-r1-2), or (a0-r1-3).

(a0-r1-1)

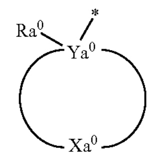

(a0-f1)

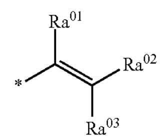

In general formula (a0-r1-1), $Ya^0$ represents a carbon atom. $Xa^0$ is a group which forms an alicyclic hydrocarbon group together with $Ya^0$. $Ra^0$ is an aromatic hydrocarbon group which may have a substituent, or a group represented by general formula (a0-f1).

In general formula (a0-f1), $Ra^{01}$ to $Ra^{03}$ are each independently an aliphatic hydrocarbon group which may have a substituent, or a hydrogen atom. Two or more of $Ra^{01}$ to $Ra^{03}$ may be bonded to each other to form a cyclic structure. A symbol of * represents a bond.

In general formula (a0-r1-1), $Ya^0$ represents a carbon atom. $Xa^0$ is a group which forms an alicyclic hydrocarbon group together with $Ya^0$.

The alicyclic hydrocarbon group which is formed by $Xa^0$ and $Ya^0$ may be a polycyclic group or a monocyclic group.

The alicyclic hydrocarbon group which is a monocyclic group is preferably a group obtained by removing one hydrogen atom from monocycloalkane. The number of carbon atoms of the monocycloalkane is preferably 3 to 6, and specific examples thereof include cyclopentane and cyclohexane.

The alicyclic hydrocarbon group which is the polycyclic group is preferably a group obtained by removing one hydrogen atom from polycycloalkane. The number of the carbon atoms of polycycloalkane is preferably 7 to 12, and specific examples thereof include adamantane, norbornane, isobornane, tricyclodecane, and tetracyclododecane.

In general formula (a0-r1-1), the alicyclic hydrocarbon group which is formed by $Xa^0$ and $Ya^0$ in general formula (a0-r1-1) may have a substituent. Examples of the substituent include a methyl group, an ethyl group, a propyl group, a hydroxyl group, a hydroxyalkyl group, a carboxyl group, a halogen atom (a fluorine atom, a chlorine atom, a bromine atom, or the like), an alkoxy group (a methoxy group, an ethoxy group, a propoxy group, a butoxy group, or the like), an acyl group, and an alkyloxycarbonyl group, and an alkylcarbonyloxy group.

In general formula (a0-r1-1), $Ra^0$ is an aromatic hydrocarbon group which may have a substituent, or a group represented by general formula (a0-f1).

Regarding aromatic hydrocarbon group which may have substituent:

The aromatic hydrocarbon group for $Ra^0$ is a hydrocarbon group having at least one aromatic ring. The aromatic ring is not particularly limited as long as it is a cyclic conjugated system having (4n+2) π-electrons, and it may be monocyclic or polycyclic. The number of the carbon atoms of the aromatic ring is preferably 5 to 30, is further preferably 5 to 20, is still further preferably 6 to 15, and is particularly preferably 6 to 12.

Specific examples of the aromatic ring include an aromatic hydrocarbon ring such as benzene, naphthalene, anthracene, and phenanthrene; and aromatic heterocycle in which a portion of the carbon atoms which constitute the aromatic hydrocarbon ring is substituted with a heteroatom. Examples of the heteroatom in the aromatic heterocycle include an oxygen atom, a sulfur atom, and a nitrogen atom. Specific examples of the aromatic heterocycle include a pyridine ring, a thiophene ring, and a furan ring.

Specific examples of the aromatic hydrocarbon group for $Ra^0$ include a group (an aryl group or a heteroaryl group) obtained by removing one hydrogen atom from an aromatic hydrocarbon ring or an aromatic heterocycle; a group obtained by removing one hydrogen atom from an aromatic compound (for example, biphenyl and fluorene) containing two or more aromatic rings; and a group (for example, an aryl alkyl group such as a benzyl group, a phenethyl group, a 1-naphthyl methyl group, a 2-naphthyl methyl group, a 1-naphthyl ethyl group, and a2-naphthyl ethyl group) obtained by substituting one hydrogen atom of the aromatic hydrocarbon ring or the aromatic heterocycle with an alkylene group. The number of the carbon atoms of the alkylene group which is bonded to the aromatic hydrocarbon ring or the aromatic heterocycle is preferably 1 to 4, is further preferably 1 to 2, and is particularly preferably 1.

Examples of the substituent that the aromatic hydrocarbon group for $Ra^0$ may have include a methyl group, an ethyl group, a propyl group, a hydroxyl group, a carboxyl group, and a halogen atom (a fluorine atom, a chlorine atom, and a bromine atom), an alkoxy group (such as a methoxy group, an ethoxy group, a propoxy group, and a butoxy group), and an alkyloxycarbonyl group.

Regarding Group Represented by General Formula (a0-f1):

In general formula (a0-f1), $Ra^{01}$ to $Ra^{03}$ are each independently an aliphatic hydrocarbon group which may have a substituent, or a hydrogen atom.

The aliphatic hydrocarbon group for $Ra^{01}$ to $Ra^{03}$ may be saturated or unsaturated, and is usually preferably saturated. Preferred examples of the aliphatic hydrocarbon group for $Ra^{01}$ to $Ra^{03}$ include a chain saturated hydrocarbon group which may have a substituent, a chain unsaturated hydrocarbon group which may have a substituent, and an alicyclic saturated hydrocarbon group which may have a substituent.

The number of carbon atoms of the chain saturated hydrocarbon group for $Ra^{01}$ to $Ra^{03}$ is preferably 1 to 10, and is further preferably 1 to 5, and examples of the chain saturated hydrocarbon group include a methyl group, an ethyl group, a propyl group, a butyl group, a pentyl group, a hexyl group, a heptyl group, an octyl group, and a decyl group.

Examples of the chain unsaturated hydrocarbon group for $Ra^{01}$ to $Ra^{03}$ include a vinyl group, a propenyl group (allyl group), a butynyl group, a 1-methyl propenyl group, and a 2-methyl propenyl group.

The number of carbon atoms in the alicyclic saturated hydrocarbon group for $Ra^{01}$ to $Ra^{03}$ is preferably 3 to 20, and examples of the alicyclic saturated hydrocarbon group include a monocyclic group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic group such as a bicyclo[2.2.2]octanyl group, a tricyclo[5.2.1.$0^{2,6}$]decanyl group, a tricyclo[3.3.1.$1^{3,7}$]decanyl group, a tetracyclo[6.2.1.$1^{3,6}$.$0^{2,7}$]dodecanyl group, and an adamantyl group.

Among them, from the viewpoint of the ease of synthesis of a monomer compound that derives the structural unit (a01), $Ra^{01}$ to $Ra^{03}$ are preferably a hydrogen atom and a monovalent chain saturated hydrocarbon group having 1 to 10 carbon atoms, and among them, a hydrogen atom, a methyl group, and an ethyl group are further preferable, and a hydrogen atom is particularly preferable.

Examples of the substituent that the aliphatic hydrocarbon group represented by $Ra^{01}$ to $Ra^{03}$ may have include the same substituent that the aromatic hydrocarbon group for $Ra^0$ may have.

In general formula (a0-f1), two or more of $Ra^{01}$ to $Ra^{03}$ may be bonded to each other to form a cyclic structure.

Examples of the group containing a carbon-carbon double bond which is generated by forming a cyclic structure in which two or more of $Ra^{01}$ to $Ra^{03}$ are bonded to each other include a cyclopentenyl group, a cyclohexenyl group, a methyl cyclopentenyl group, a methyl cyclohexenyl group, a cyclopentylideneethenyl group, and a cyclohexylideneethenyl group. Among them, from the viewpoint of the ease of synthesis of the monomer compound that derives the structural unit (a01), a cyclopentenyl group, a cyclohexenyl group, and a cyclopentylideneethenyl group are preferable.

Hereinafter, specific examples of the acid dissociable group represented by general formula (a0-r1-1) will be described. A symbol of * represents a bond.

(r-pr-sa1)

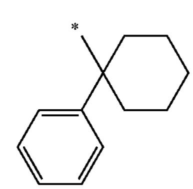

(r-pr-sa2)

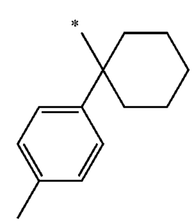

-continued
(r-pr-sa3)
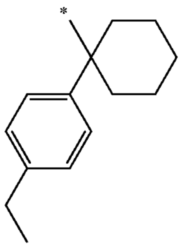
(r-pr-sa4)
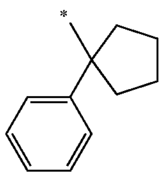
(r-pr-sa5)
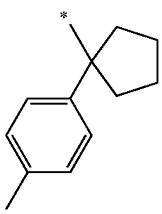
(r-pr-sa6)
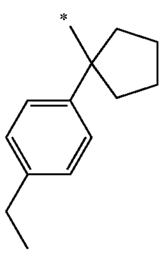
(r-pr-sa7)
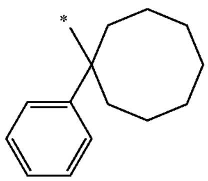
(r-pr-sa8)
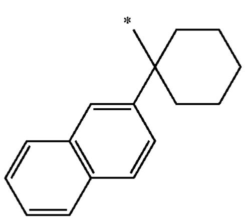
(r-pr-sa9)
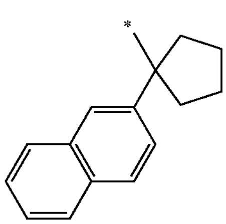
-continued
(r-pr-sa10)
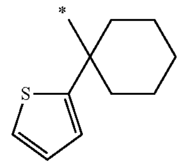
(r-pr-sa11)
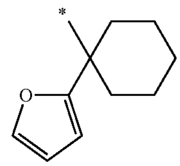
(r-pr-sa12)
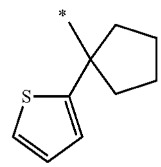
(r-pr-sa13)
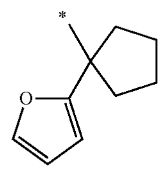
(r-pr-ma1)
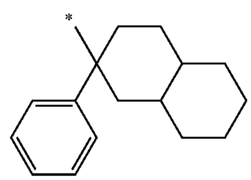
(r-pr-ma2)
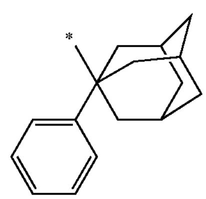
(r-pr-sv1)
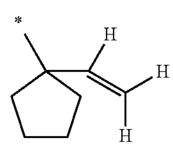
(r-pr-sv2)
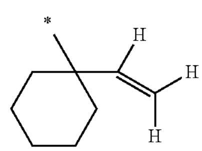
(r-pr-sv3)
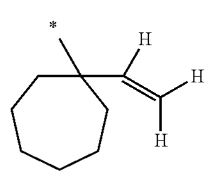

-continued
(r-pr-sv4)
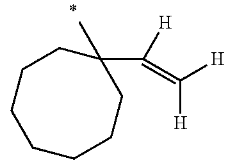
(r-pr-sv5)
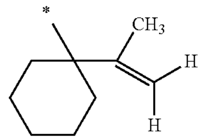
(r-pr-sv6)
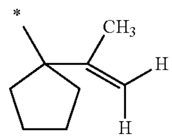
(r-pr-sv7)
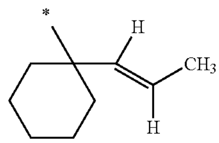
(r-pr-sv8)
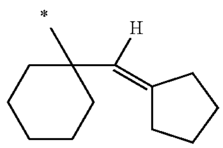
(r-pr-sv9)
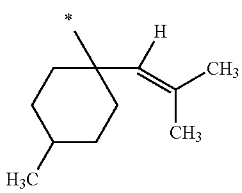
(r-pr-sv10)
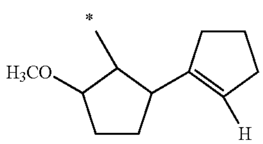
(r-pr-sv11)
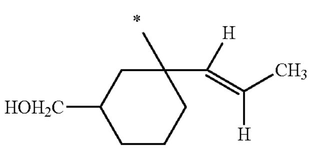
(r-pr-vs12)
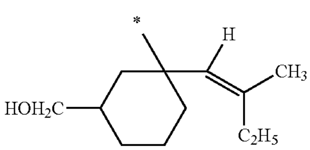
(r-pr-mv1)
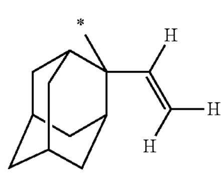
-continued
(r-pr-mv2)
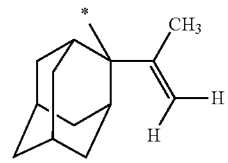
(r-pr-mv3)
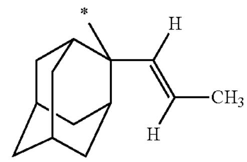
(r-pr-mv4)
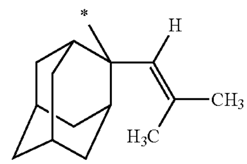
(r-pr-mv5)
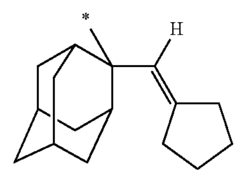
(r-pr-mv6)
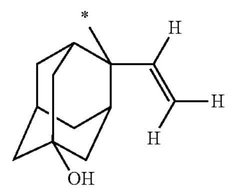
(r-pr-mv7)
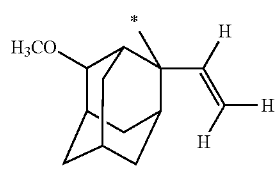
(r-pr-mv8)
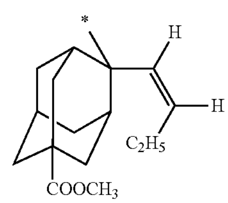
(r-pr-mv9)
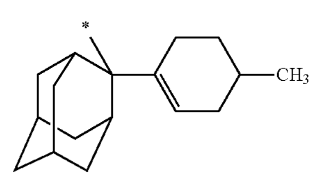
(r-pr-mv10)
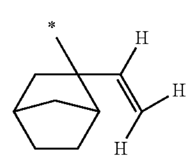

-continued (r-pr-mv11)

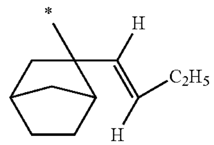

(r-pr-mv12)

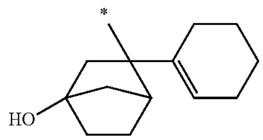

(r-pr-mv13)

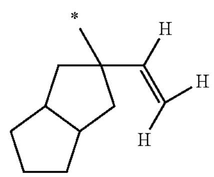

(r-pr-mv14)

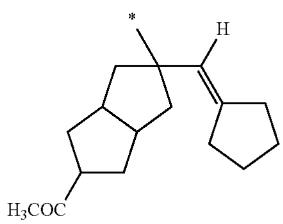

(r-pr-mv15)

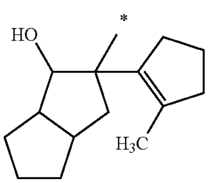

(r-pr-mv16)

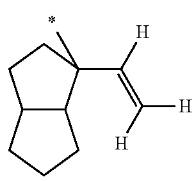

(r-pr-mv17)

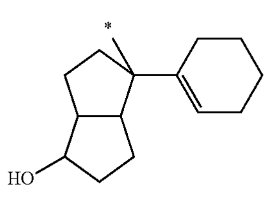

(r-pr-mv18)

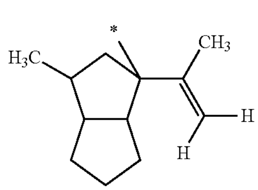

-continued (r-pr-mv19)

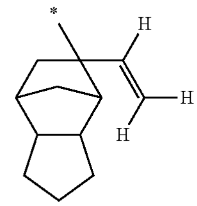

(r-pr-mv20)

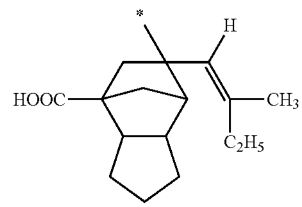

(r-pr-mv21)

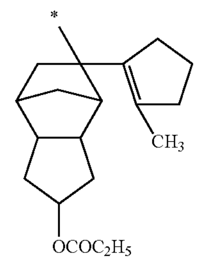

(a0-r1-2)

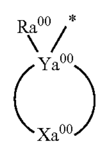

In general formula (a0-r1-2), $Ya^{00}$ represents a carbon atom. $Xa^{00}$ is a group which forms a condensed ring of an alicyclic hydrocarbon group and an aromatic hydrocarbon group together with $Ya^{00}$. $Ra^{00}$ is an alkyl group having 1 to 10 carbon atoms, an aromatic hydrocarbon group which may have a substituent, or a group represented by general formula (a0-f1). A symbol of * represents a bond.

In general formula (a0-r1-2), $Ya^{00}$ represents a carbon atom. $Xa^{00}$ is a group which forms a condensed ring of an alicyclic hydrocarbon group and an aromatic hydrocarbon group together with $Ya^{00}$.

A part of the alicyclic hydrocarbon group in the condensed ring formed by $Xa^{00}$ and $Ya^{00}$ may be monocyclic or polycyclic, and a part of the aromatic hydrocarbon group may be monocyclic or polycyclic.

In addition, the condensed ring formed by $Xa^{00}$ and $Ya^{00}$ may have a substituent. Examples of the substituent include a methyl group, an ethyl group, a propyl group, a hydroxyl group, a hydroxyalkyl group, a carboxyl group, a halogen atom (a fluorine atom, a chlorine atom, a bromine atom, or the like), an alkoxy group (a methoxy group, an ethoxy group, a propoxy group, a butoxy group, or the like), an acyl group, and an alkyloxycarbonyl group, and an alkylcarbonyloxy group.

In general formula (a0-r1-2), $Ra^{00}$ is an alkyl group having 1 to 10 carbon atoms, an aromatic hydrocarbon group which may have a substituent, or a group represented by general formula (a0-f1).

The number of carbon atoms of the alkyl group for $Ra^{00}$ is preferably 1 to 10, and is preferably 1 to 5. Examples of the alkyl group for $Ra^{00}$ include a methyl group, an ethyl group, a propyl group, an isopropyl group, an n-butyl group, an isobutyl group, a tert-butyl group, a pentyl group, an isopentyl group, a neopentyl group, a hexyl group, a heptyl group, an octyl group, a nonyl group, and a decyl group.

An aromatic hydrocarbon group which may have a substituent for $Ra^{00}$, and a group represented by general formula (a0-f1) are the same as the aromatic hydrocarbon group which may have a substituent for $Ra^{0}$, and a group represented by general formula (a0-f1).

Among them for $Ra^{00}$, an alkyl group having 1 to 10 carbon atoms is preferable, and an alkyl group having 1 to 5 carbon atoms is further preferable.

Hereinafter, specific examples of the acid dissociable group represented by general formula (a0-r1-2) will be described. A symbol of * represents a bond.

(r-pr-ac1)

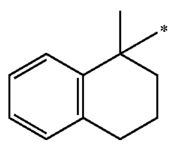

(r-pr-ac2)

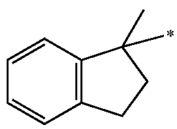

(r-pr-ac3)

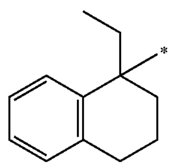

(r-pr-ac4)

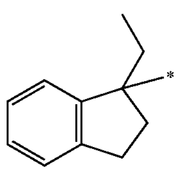

(r-pr-ac5)

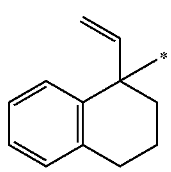

(r-pr-ac6)

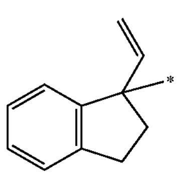

(r-pr-ac7)

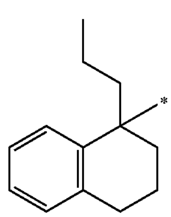

-continued (r-pr-ac8)

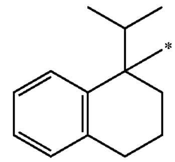

(r-pr-ac9)

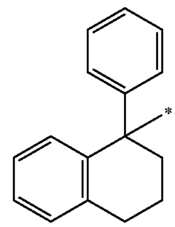

(r-pr-ac10)

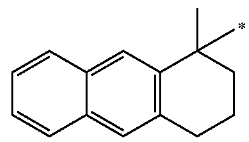

(r-pr-ac11)

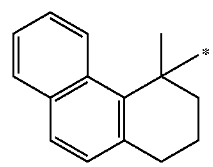

(r-pr-ac12)

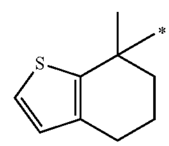

(r-pr-ac13)

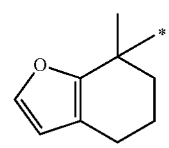

(a0-r1-3)

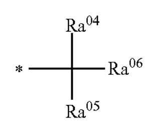

In general formula (a0-r1-3), $Ra^{04}$ and $Ra^{05}$ are each independently a monovalent chain saturated hydrocarbon group having 1 to 10 carbon atoms or a hydrogen atom. At least one hydrogen atom of the chain saturated hydrocarbon group may be substituted. $Ra^{06}$ is an aromatic hydrocarbon group which may have a substituent. A symbol of * represents a bond.

In general formula (a0-r1-3), $Ra^{04}$ and $Ra^{05}$ are each independently a monovalent chain saturated hydrocarbon group having 1 to 10 carbon atoms or a hydrogen atom.

Examples of the monovalent chain saturated hydrocarbon group having 1 to 10 carbon atoms for $Ra^{04}$ and $Ra^{05}$ include the same group as the alkyl group having 1 to 10 carbon atoms for $Ra^{00}$ of general formula (a0-r1-2). At least one hydrogen atom of the chain saturated hydrocarbon group may be substituted. Among the groups for $Ra^{04}$ and $Ra^{05}$, a hydrogen atom and an alkyl group having 1 to 5 carbon atoms are preferable, an alkyl group having 1 to 5 carbon atoms is further preferable, a methyl group and an ethyl group are still further preferable, and a methyl group is particularly preferable.

In the case where the chain saturated hydrocarbon group represented by $Ra^{04}$ and $Ra^{05}$ is substituted, examples of the substituent include the same group as the substituent that an aromatic hydrocarbon group for $Ra^{0}$ may have.

In general formula (a0-r1-3), $Ra^{06}$ is an aromatic hydrocarbon group which may have a substituent. Examples of the aromatic hydrocarbon group for $Ra^{06}$ include the same group as that of the aromatic hydrocarbon group for $Ra^{0}$. Among the groups for $Ra^{06}$, a group obtained by removing one or more hydrogen atoms from an aromatic hydrocarbon ring having 6 to 15 carbon atoms is preferable, a group obtained by removing one or more hydrogen atoms from benzene, naphthalene, anthracene, or phenanthrene is further preferable, a group obtained by removing one or more hydrogen atoms from benzene, naphthalene, or anthracene is still further preferable, a group obtained by removing one or more hydrogen atoms from naphthalene or anthracene is particularly preferable, and a group obtained by removing one or more hydrogen atoms from naphthalene is most preferable.

Examples of the substituent that $Ra^{06}$ may have include the same group as the substituent that the aromatic hydrocarbon group for $Ra^{0}$ may have.

In the case where $Ra^{06}$ is a naphthyl group in general formula (a0-r1-3), a position which is bonded to a tertiary carbon atom in general formula (a0-r1-3) may be 1-position and 2-position of a naphthyl group.

In the case where $Ra^{06}$ in general formula (a0-r1-3) is an anthryl group, a position which is bonded to a tertiary carbon atom in general formula (a0-r1-3) may be 1-position, 2-position, or 9-position of an anthryl group.

Hereinafter, specific examples of the acid dissociable group represented by general formula (a0-r1-3) will be described. A symbol of * represents a bond.

(r-pr-cm1)

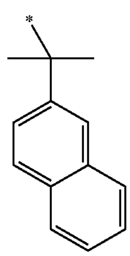

(r-pr-cm2)

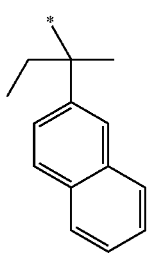

(r-pr-cm3)

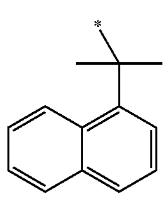

-continued (r-pr-cm4)

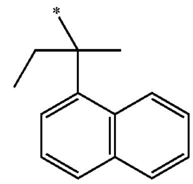

(r-pr-cs1)

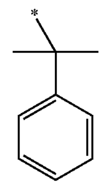

(r-pr-cs2)

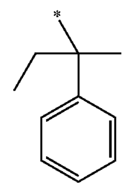

Hereinafter, specific examples of the structural unit (a01) will be described. In the formula, $R^{\alpha}$ represents a hydrogen atom, a methyl group, or a trifluoromethyl group.

(a0-1-11)

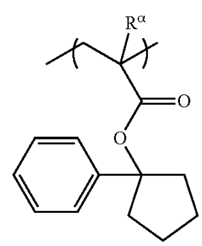

(a0-1-12)

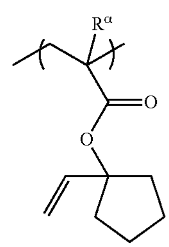

(a0-1-13)

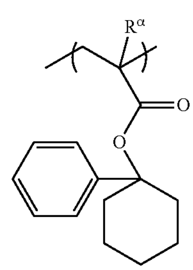

-continued (a0-1-14)

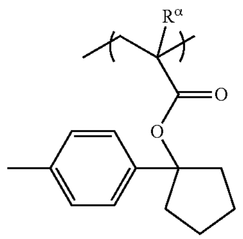

(a0-1-15)

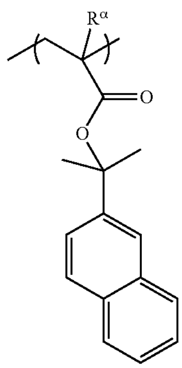

(a0-1-16)

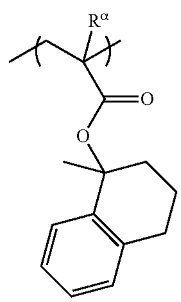

The structural unit (a01) that the (A1) component has may be used alone, or two or more kinds thereof may be used in combination.

Particularly, from the viewpoint that the properties of the lithography (sensitivity, shape, and the like) by extreme ultraviolet ray (EUV) or an electron beam (EB) are likely to be enhanced, in general formula (a0-1), the structural unit (a01) is preferably a structural unit in which $Ra^{0}$" is an acid dissociable group represented by general formula (a0-r1-1).

Among them, from the viewpoint that the properties of the lithography by EUV or EB are more likely to be enhanced, the structural unit (a01) is further preferably a structural unit in the case where the total number of the carbon atoms contained in $Ya^0$, $Xa^0$, and $Ra^0$ in general formula (a0-r1-1) is equal to or less than 11. By selecting such a structural unit (the total number of carbon atoms is equal to or less than 11), in the forming of the resist pattern, the resolution is improved, and the resist pattern shape becomes more excellent. Although the reason why this effect can be obtained is unknown, since the acid dissociable group can dissociate with relatively low energy, in addition, as the molecular size of the (A1) component is decreased, the density of the acid-decomposable group in the resist film is increased.

The ratio of the structural unit (a01) in the (A1) component is preferably 5 to 95 mol %, is further preferably 10 to 90 mol %, and is still further preferably 20 to 80 mol %, with respect to the total ratio of the entire structural units which constitute the (A1) component.

When the ratio of the structural unit (a01) is set to be equal to or greater than the lower limit in the preferred range, it is possible to easily obtain a resist pattern, and thereby the sensitivity, the resolution, and the lithography properties such as the reduced roughness are also improved. On the other hand, when the ratio of the structural unit (a01) is set to be equal to or less than the upper limit in the preferred range, it is possible to make balance with other structural units.

Structural Unit (a02)

The structural unit (a02) is a structural unit represented by general formula (a0-2).

(a0-2)

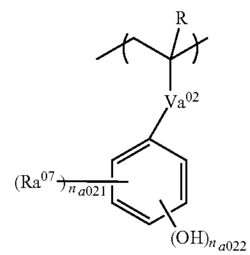

In general formula (a0-2), R is a hydrogen atom, an alkyl group having 1 to 5 carbon atoms, or a halogenated alkyl group having 1 to 5 carbon atoms. $Va^{02}$ is a divalent linking group containing a heteroatom, or a single bond. $Ra^{07}$ is a monovalent organic group. $n_{a021}$ is an integer of 0 to 3. $n_{a022}$ is an integer of 1 to 3.

In general formula (a0-2), R is a hydrogen atom, an alkyl group having 1 to 5 carbon atoms, or a halogenated alkyl group having 1 to 5 carbon atoms.

An alkyl group having 1 to 5 carbon atoms and a halogenated alkyl group having 1 to 5 carbon atoms for R are the same as those for R in general formula (a0-1).

R is preferably a hydrogen atom, an alkyl group having 1 to 5 carbon atoms, or a fluorinated alkyl group having 1 to 5 carbon atoms, is further preferably a hydrogen atom or a methyl group, and is still further preferably a hydrogen atom in terms of industrial availability.

R in general formula (a0-2) may be the same as or different from R in general formula (a0-1) or general formula (a0-3).

In general formula (a0-2), $Va^{02}$ is a divalent linking group containing a heteroatom, or a single bond.

Preferred examples of the divalent linking group containing a heteroatom for $Va^{02}$ include —O—, —C(═O)—O—, —C(═O)—, —O—C(═O)—O—, —C(═O)—NH—, —NH—, —NH—C(═NH)— (H may be substituted with a substituent such as an alkyl group and an acyl group), —S—, —$S(═O)_2$—, —$S(═O)_2$—O—, and a group represented by general formulae —$Y^{21}$—O—$Y^{22}$—, —$Y^{21}$—O—, —$Y^{21}$—C(═O)—O—, —C(═O)—O—$Y^{21}$—, —$[Y^{21}—C(═O)—O]_{m''}$—$Y^{22}$—, —$Y^{21}$—O—C(═O)—$Y^{22}$— and —$Y^{21}$—$S(═O)_2$—O—$Y^{22}$— (In the formulae, $Y^{21}$ and $Y^{22}$ each independently represent a divalent hydrocarbon group which may have a substituent, O represents an oxygen atom, and m" represents an integer of 0 to 3).

In the case where the divalent linking group containing the heteroatom is —C(═O)—NH—, —C(═O)—NH—C(═O)—, —NH—, or —NH—C(═NH)—, H may be substituted with a substituent such as an alkyl group and an acyl group. The substituent (an alkyl group, an acyl group, or the like) preferably has 1 to 10 carbon atoms, further preferably has 1 to 8 carbon atoms, and particularly preferably has 1 to 5 carbon atoms.

In general formulae —$Y^{21}$—O—$Y^{22}$, —$Y^{21}$—O—, —$Y^{21}$—C(═O)—O—, —C(═O)—O—$Y^{21}$—, —[$Y^{21}$—C(═O)—O]$_{m''}$—$Y^{22}$—, —$Y^{21}$—O—C(═O)—$Y^{22}$—, and —$Y^{21}$—S (═O)$_2$—O—$Y^{22}$—, $Y^{21}$ and $Y^{22}$ each independently represent a divalent hydrocarbon group which may have a substituent. Examples of the divalent hydrocarbon group include the same group as that exemplified as the divalent linking group for $Va^{01}$ in general formula (a0-1).

$Y^{21}$ is preferably a linear aliphatic hydrocarbon group, is further preferably a linear alkylene group, is still further preferably a linear alkylene group having 1 to 5 carbon atoms, and is particularly preferably a methylene group or an ethylene group.

$Y^{22}$ is preferably a linear or branched aliphatic hydrocarbon group, and is further preferably a methylene group, an ethylene group, or an alkyl methylene group. An alkyl group in the alkyl methylene group is preferably a linear alkyl group having 1 to 5 carbon atoms, is further preferably a linear alkyl group having 1 to 3 carbon atoms, and is most preferably a methyl group.

In the group represented by general formula —[$Y^{21}$—C(═O)—O]$_{m''}$—$Y^{22}$—, m" is an integer of 0 to 3, is preferably an integer of 0 to 2, is further preferably 0 or 1, and is particularly preferably 1. That is, as a group represented by general formula —[$Y^{21}$—C(═O)—O]$_{m''}$—$Y^{22}$—, a group represented by general formula —$Y^{21}$—C(═O)—O—$Y^{22}$— is particularly preferable. Among them, a group represented by general formula —$(CH_2)_{a'}$—C(═O)—O—$(CH_2)_{b'}$— is preferable. In the formula, a' is an integer of 1 to 10, is preferably an integer of 1 to 8, is further preferably an integer of 1 to 5, is still further preferably 1 or 2, and is most preferably 1. b' is an integer of 1 to 10, is preferably an integer of 1 to 8, is further preferably an integer of 1 to 5, is still further preferably 1 or 2, and is most preferably 1.

$Va^{02}$ is preferably a single bond, an ester bond [—C(═O)—O—], an ether bond (—O—), a linear or branched alkylene group, or a combination thereof, is further preferably a single bond or an ester bond, and is still further preferably a single bond.

In general formula (a0-2), $Ra^{07}$ is a monovalent organic group. Examples of the organic group for $Ra^{07}$ include a methyl group, an ethyl group, a propyl group, a hydroxyl group, a carboxyl group, and a halogen atom (a fluorine atom, a chlorine atom, and a bromine atom), an alkoxy group (such as a methoxy group, an ethoxy group, a propoxy group, and a butoxy group), and an alkyloxycarbonyl group.

In general formula (a0-2), $n_{a021}$ is an integer of 0 to 3, is preferably 0.1, or 2, is further preferably 0 or 1, and is still further preferably 0.

In general formula (a0-2), $n_{a022}$ is an integer of 1 to 3, is preferably 1 or 2, and is further preferably 1.

Hereinafter, specific examples of the structural unit (a02) will be described. In the formula, $R^{\alpha}$ represents a hydrogen atom, a methyl group, or a trifluoromethyl group.

(a0-2-11)

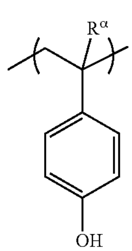

-continued (a0-2-12)

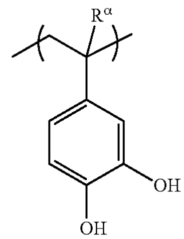

(a0-2-13)

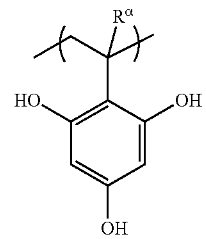

(a0-2-14)

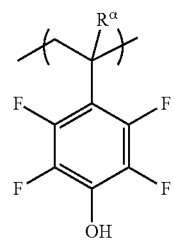

(a0-2-15)

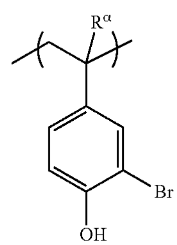

(a0-2-16)

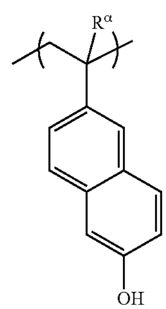

(a0-2-17)

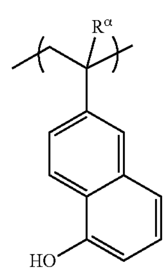

-continued (a0-2-18)

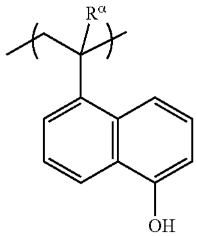

(a0-2-21)

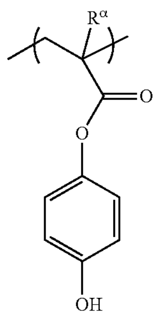

(a0-2-22)

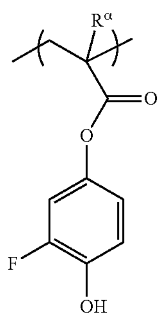

(a0-2-23)

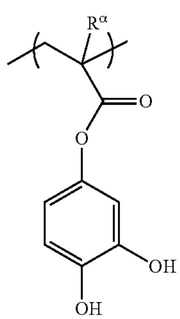

(a0-2-24)

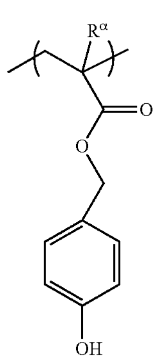

-continued (a0-2-25)

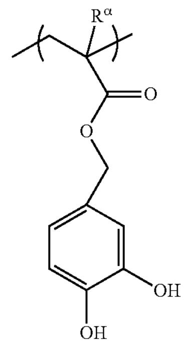

(a0-2-26)

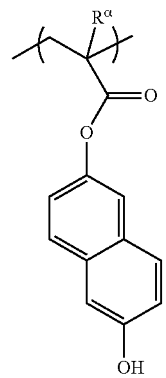

(a0-2-27)

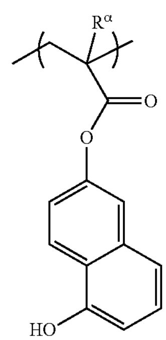

(a0-2-28)

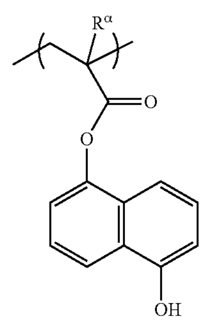

The structural unit (a02) that the (A1) component has may be used alone, or two or more kinds thereof may be used in combination.

The ratio of the structural unit (a02) in the (A1) component is preferably 5 to 95 mol %, is further preferably 10 to 90 mol %, and is still further preferably 20 to 80 mol %, with respect to the total ratio of the entire structural units which constitute the (A1) component.

When the ratio of the structural unit (a02) is set to be equal to or greater than the lower limit in the preferred range, the sensitivity and the developing properties are improved. On the other hand, when the ratio of the structural unit (a02) is set to be equal to or less than the upper limit in the preferred range, it is possible to make balance with other structural units.

Structural Unit (a03)

The structural unit (a03) is a structural unit represented by general formula (a0-3).

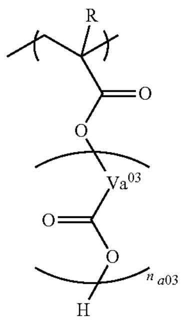
(a0-3)

In general formula (a0-3), R is a hydrogen atom, an alkyl group having 1 to 5 carbon atoms, or a halogenated alkyl group having 1 to 5 carbon atoms. $Va^{03}$ is a divalent hydrocarbon group which may have an ether bond. $n_{a03}$ is an integer of 0 to 2.

In general formula (a0-3), R is a hydrogen atom, an alkyl group having 1 to 5 carbon atoms, or a halogenated alkyl group having 1 to 5 carbon atoms.

An alkyl group having 1 to 5 carbon atoms and a halogenated alkyl group having 1 to 5 carbon atoms for R are the same as those for R in general formula (a0-1).

R is preferably a hydrogen atom, an alkyl group having 1 to 5 carbon atoms, or a fluorinated alkyl group having 1 to 5 carbon atoms, is further preferably a hydrogen atom or a methyl group, and is still further preferably a methyl group in terms of industrial availability.

R in general formula (a0-3) may be the same as or different from R in general formula (a0-1) or general formula (a0-2).

In general formula (a0-3), $Va^{03}$ is a divalent hydrocarbon group which may have an ether bond, and is the same as $Va^{01}$ in general formula (a0-1).

In general formula (a0-3), $n_{a03}$ is an integer of 0 to 2, and is the same as $n_{a01}$ in general formula (a0-1).

Hereinafter, specific examples of the structural unit (a03) will be described. In the formula, $R^{\alpha}$ represents a hydrogen atom, a methyl group, or a trifluoromethyl group.

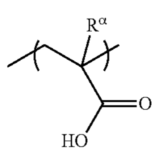
(a0-3-1)

The structural unit (a03) that the (A1) component has may be used alone, or two or more kinds thereof may be used in combination.

The ratio of the structural unit (a03) in the (A1) component is preferably greater than 0 mol % and equal to or less than 10 mol %, is preferably greater than 0 mol % and equal to or less than 8 mol %, is further preferably greater than 0 mol % and equal to or less than 5 mol % with respect to the entire structural units which constitute the (A1) component.

When the ratio of the structural unit (a03) is equal to or lower than the upper limit of the above-described range, the lithography properties are improved in the forming of the resist pattern. Particularly, it is possible to form a resist pattern having excellent shape, and thus the limit resolution can be improved.

On the other hand, when the ratio of the structural unit (a03) is greater than the lower limit, the developing properties are improved, and thereby the balance between sensitivity, resolution and roughness reduction is improved and the defects are improved.

Other Structural Unit

The (A1) component may have other structural units in addition to the structural unit (a01), the structural unit (a02), and the structural unit (a03).

Examples of other structural units include a lactone-containing cyclic group, a structural unit (a2) containing an —$SO_2$— containing cyclic group or a carbonate-containing cyclic group, a structural unit (a9) represented by general formula (a9-1), a structural unit (here, except for the structural unit (a01)) containing an acid-decomposable group in which the polarity is increased under the action of the acid, a structural unit derived from a styrene, a structural unit (here, except for a unit corresponding to the structural unit (a02)) derived from a styrene derivative, a structural unit (here, except for a group corresponding to the structural unit (a01), the structural unit (a02), or the structural unit (a03)) containing a polar group-containing aliphatic hydrocarbon group, and a structural unit containing an acid non-dissociable aliphatic cyclic group.

Regarding Structural Unit (a2):

The (A1) component may further include a structural unit (a2) containing a lactone-containing cyclic group, an —$SO_2$— containing cyclic group, or a carbonate-containing cyclic group in addition to the structural unit (a01), the structural unit (a02), and thus structural unit (a03).

The lactone-containing cyclic group, and the —$SO_2$— containing cyclic group or the carbonate-containing cyclic group of the structural unit (a2) are effective for enhancing the adhesion of the resist film to the substrate when the (A1) component is used to form a resist film. In addition, with the structural unit (a2), in the alkali developing process, the solubility of the resist film in an alkali developing solution is enhanced during development.

The "lactone-containing cyclic group" means a cyclic group containing a ring (lactone ring) including —O—C(=O)— in the cyclic skeleton. When the lactone ring is counted as the first ring, if there is only the lactone ring, the cyclic group is referred to as a monocyclic group, and if there are other ring structures in addition to the lactone ring, the cyclic group is referred to as a polycyclic group regardless of its structure. The lactone-containing cyclic group may be a monocyclic group, or may be a polycyclic group.

The lactone-containing cyclic group in the structural unit (a2) is not particularly limited, and any lactone-containing cyclic group can be used. Specific examples thereof include groups respectively represented by general formulae (a2-r-1) to (a2-r-7).

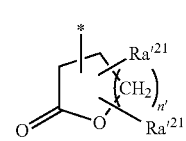
(a2-r-1)

-continued (a2-r-2)

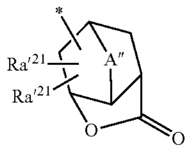

(a2-r-3)

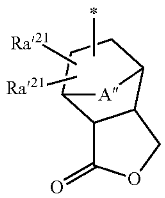

(a2-r-4)

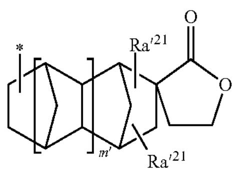

(a2-r-5)

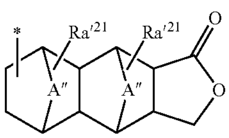

(a2-r-6)

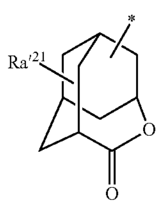

(a2-r-7)

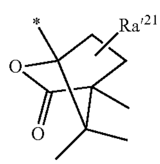

In the formula, $Ra'^{21}$'s each independently represent a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone-containing cyclic group, a carbonate-containing cyclic group, or a —$SO_2$— containing cyclic group; A" is an alkylene group having 1 to 5 carbon atoms, which may have an oxygen atom (—O—) or a sulfur atom (—S—), an oxygen atom, or a sulfur atom; n' is an integer of 0 to 2; and m' is an integer of 0 or 1.

In general formulae (a2-r-1) to (a2-r-7), the alkyl group for $Ra'^{21}$ is preferably an alkyl group having 1 to 6 carbon atoms. The alkyl group is preferably a linear or branched alkyl group. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among them, the methyl group or the ethyl group is preferable, and the methyl group is particularly preferable.

The alkoxy group for $Ra'^{21}$ is preferably an alkoxy group having 1 to 6 carbon atoms.

The alkoxy group is preferably a linear or branched alkoxy group. Specifically, examples thereof include a group in which the alkyl group exemplified as the alkyl group for $Ra'^{21}$ and an oxygen atom (—O—) are linked with each other.

Examples of the halogen atom for $Ra'^{21}$ include a fluorine atom, a chlorine atom, a bromine atom, and an iodine atom, and among them, a fluorine atom is preferable.

Examples of the halogenated alkyl group for $Ra'^{21}$ include a group obtained by substituting at least one hydrogen atom of the alkyl group for $Ra'^{21}$ with the halogen atom. The halogenated alkyl group is preferably a fluorinated alkyl group, and is particularly preferably a perfluoroalkyl group.

In —COOR" and —OC(=O)R" for $Ra'^{21}$, R"'s are a hydrogen atom, an alkyl group, a lactone-containing cyclic group, a carbonate-containing cyclic group, or a —$SO_2$— containing cyclic group.

The alkyl group for R" may be a linear, branched, or cyclic alkyl group, and the number of carbon atoms thereof is preferably 1 to 15.

In the case where R" is a linear or branched alkyl group, the number of carbon atoms is preferably 1 to 10, and is further preferably 1 to 5. Particularly, a methyl group or an ethyl group is preferable.

In the case where R" is a cyclic alkyl group, the number of carbon atoms is preferably 3 to 15, is further preferably 4 to 12, and is most preferably 5 to 10. Specifically, examples of the cyclic alkyl group include a group obtained by removing one or more hydrogen atoms from monocycloalkane which may be or may be not substituted with a fluorine atom or a fluorinated alkyl group; and a group obtained by removing one or more hydrogen atoms from polycycloalkane such as bicycloalkane, tricycloalkane, and tetracycloalkane. More specifically, examples of the cyclic alkyl group include a group obtained by removing one or more hydrogen atoms from monocycloalkane such as cyclopentane and cyclohexane; and a group obtained by removing one or more hydrogen atoms from polycycloalkane such as adamantane, norbornane, isobornane, tricyclodecane, and tetracyclododecane.

Examples of the lactone-containing cyclic group for R" include the same groups which are represented by general formulae (a2-r-1) to (a2-r-7).

The carbonate-containing cyclic group for R" is the same as a carbonate-containing cyclic group described below, and specific examples thereof include the same groups which are represented by general formulae (ax3-r-1) to (ax3-r-3).

The —$SO_2$— containing cyclic group for R" is the same as a —$SO_2$— containing cyclic group described below, and specific examples thereof include the same groups which are represented by general formulae (a5-r-1) to (a5-r-4).

The hydroxyalkyl group for $Ra'^{21}$ is preferably a hydroxyalkyl group having 1 to 6 carbon atoms, and specific examples thereof include a group obtained by substituting at least one hydrogen atom of the alkyl group for $Ra'^{21}$ with a hydroxyl group.

In general formulae (a2-r-2), (a2-r-3), and (a2-r-5), the alkylene group having 1 to 5 carbon atoms for A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— is present at a terminal of the alkylene group or between carbon atoms, and examples of the group include —O—$CH_2$—, —$CH_2$—O—$CH_2$—, —S—$CH_2$—, and —$CH_2$—S—$CH_2$—. The A" is preferably an alkylene group having 1 to 5 carbon atoms or —O—, is further preferably an alkylene group having 1 to 5 carbon atoms, and is most preferably a methylene group.
Specific examples of the groups represented by general formulae (a2-r-1) to (a2-r-7) are described as follows.
(r-lc-1-1)
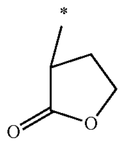
(r-lc-1-2)
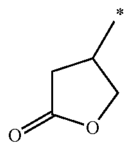
(r-lc-1-3)
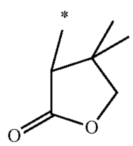
(r-lc-1-4)
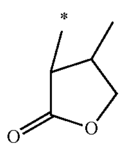
(r-lc-1-5)
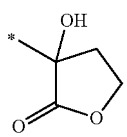
(r-lc-1-6)
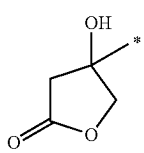
(r-lc-1-7)
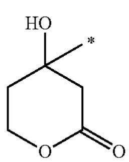
(r-lc-2-1)
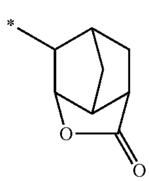
(r-lc-2-2)
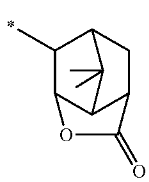
-continued
(r-lc-2-3)
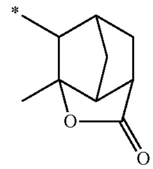
(r-lc-2-4)
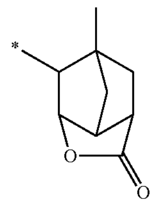
(r-lc-2-5)
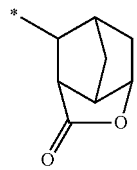
(r-lc-2-6)
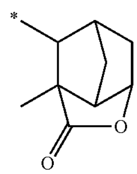
(r-lc-2-7)
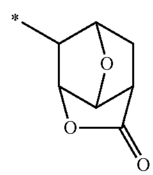
(r-lc-2-8)
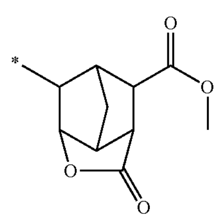
(r-lc-2-9)
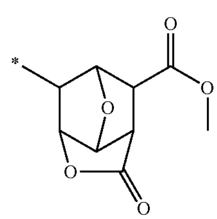
(r-lc-2-10)
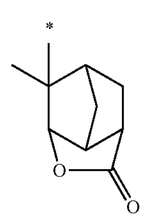

-continued
(r-lc-2-11)
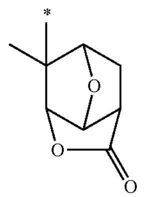
(r-lc-2-12)
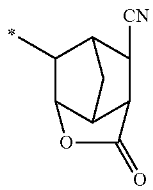
(r-lc-2-13)
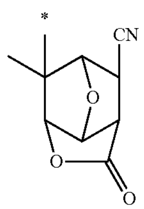
(r-lc-2-14)
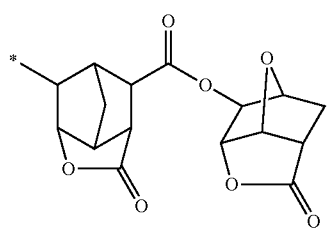
(r-lc-2-15)
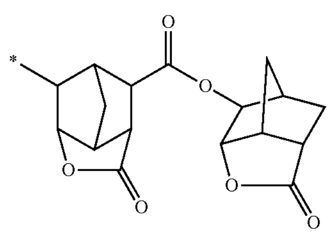
(r-lc-2-16)
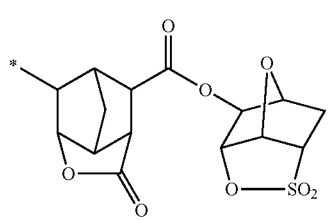
(r-lc-2-17)
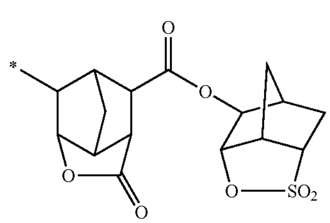
-continued
(r-lc-2-18)
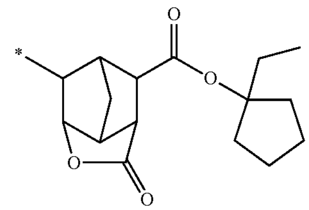
(r-lc-3-1)
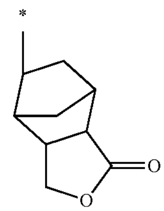
(r-lc-3-2)
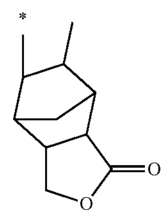
(r-lc-3-3)
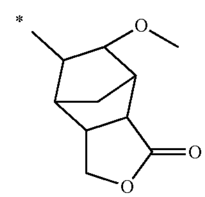
(r-lc-3-4)
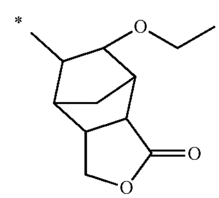
(r-lc-3-5)
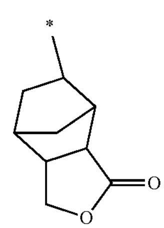
(r-lc-4-1)
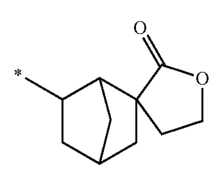
(r-lc-4-2)
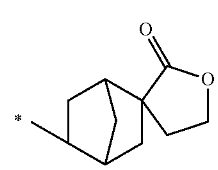

-continued (r-lc-4-3)

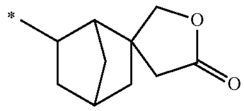

(r-lc-4-4)

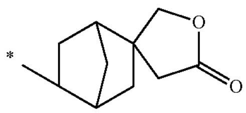

(r-lc-4-5)

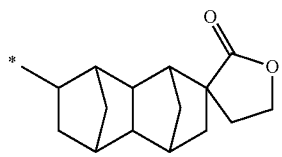

(r-lc-4-6)

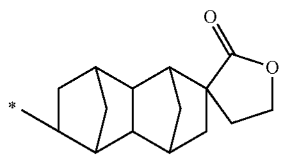

(r-lc-4-7)

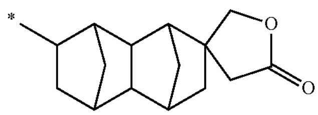

(r-lc-4-8)

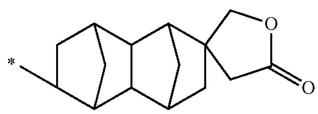

(r-lc-4-9)

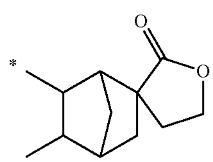

(r-lc-5-1)

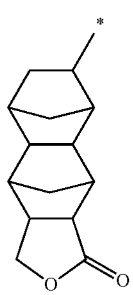

(r-lc-5-2)

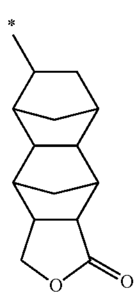

-continued (r-lc-5-3)

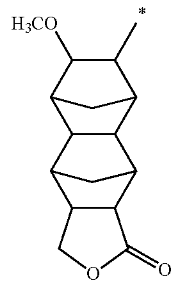

(r-lc-5-4)

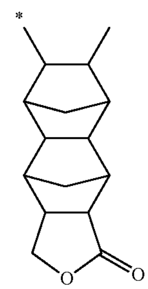

(r-lc-6-1)

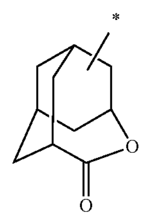

(r-lc-7-1)

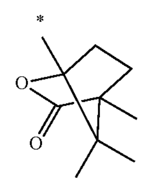

The "—$SO_2$— containing cyclic group" means a cyclic group which contains a ring having —$SO_2$— in the cyclic skeleton, and specifically, the sulfur atom (S) in —$SO_2$— is a cyclic group which forms a portion of the cyclic skeleton of the cyclic group. When the ring containing —$SO_2$— in the cyclic skeleton is counted as the first ring, if there is only the ring, the cyclic group is referred to as a monocyclic group, and if there are other ring structures in addition to the ring, the cyclic group is referred to as a polycyclic group regardless of its structure. The —$SO_2$— containing cyclic group may be a monocyclic group or may be a polycyclic group.

The —$SO_2$— containing cyclic group is particularly preferably a cyclic group containing —O—$SO_2$— in the cyclic skeleton, that is, —O—S— in —O—$SO_2$— is preferably a cyclic group containing a sultone ring which forms a portion of the cyclic skeleton.

More specifically, examples of the —$SO_2$— containing cyclic group include the same groups which are represented by general formulae (a5-r-1) to (a5-r-4).

(a5-r-1)

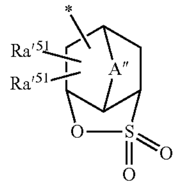

(a5-r-2)

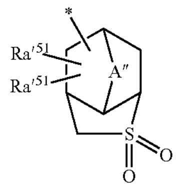

(a5-r-3)

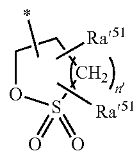

(a5-r-4)

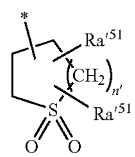

In the formula, Ra'[51]'s each independently represent a hydrogen atom, an alkyl group, an alkoxy group, a halogen atom, a halogenated alkyl group, a hydroxyl group, —COOR", —OC(═O)R", a hydroxyalkyl group, or a cyano group; R" is a hydrogen atom, an alkyl group, a lactone-containing cyclic group, a carbonate-containing cyclic group, or a —$SO_2$— containing cyclic group; A" is an alkylene group having 1 to 5 carbon atoms, which may have an oxygen atom or a sulfur atom, an oxygen atom, or a sulfur atom; and n' is an integer of 0 to 2.

In general formulae (a5-r-1) and (a5-r-2), A" is the same as A" in general formulae (a2-r-2), (a2-r-3), and (a2-r-5).

An alkyl group, an alkoxy group, a halogen atom, a halogenated alkyl group, —COOR", —OC(═O)R", and a hydroxyalkyl group for Ra'[51] are the same as those exemplified in the description for Ra'[21] in general formulae (a2-r-1) to (a2-r-7).

Specific examples of the groups represented by general formulae (a5-r-1) to (a5-r-4) are described as follows. "Ac" in the formulae represents an acetyl group.

(r-s1-1-1)

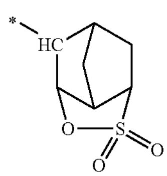

(r-s1-1-2)

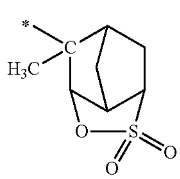

-continued (r-s1-1-3)

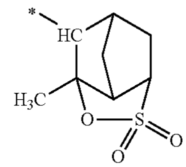

(r-s1-1-4)

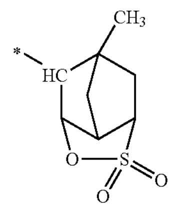

(r-s1-1-5)

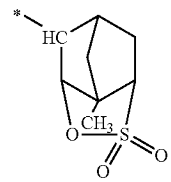

(r-s1-1-6)

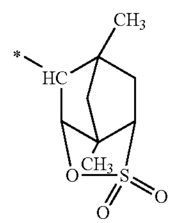

(r-s1-1-7)

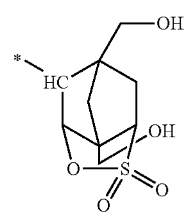

(r-s1-1-8)

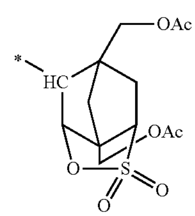

(r-s1-1-9)

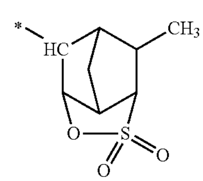

(r-s1-1-10)

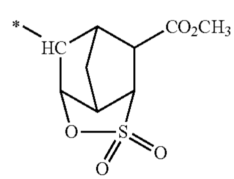

-continued
(r-s1-1-11)
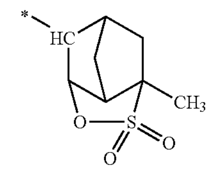
(r-s1-1-12)
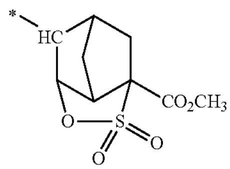
(r-s1-1-13)
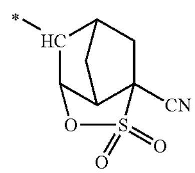
(r-s1-1-14)
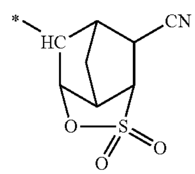
(r-s1-1-15)
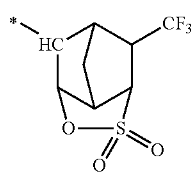
(r-s1-1-16)
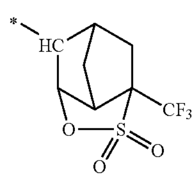
(r-s1-1-17)
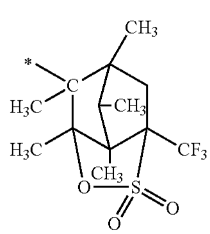
(r-s1-1-18)
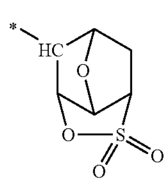
-continued
(r-s1-1-19)
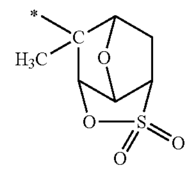
(r-s1-1-20)
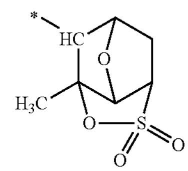
(r-s1-1-21)
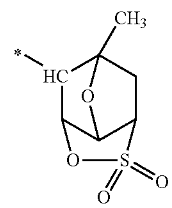
(r-s1-1-22)
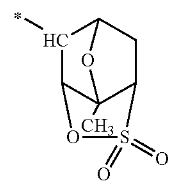
(r-s1-1-23)
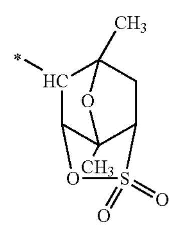
(r-s1-1-24)
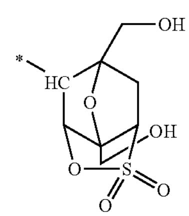
(r-s1-1-25)
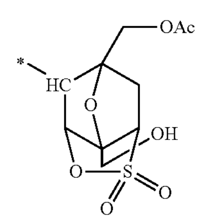
(r-s1-1-26)
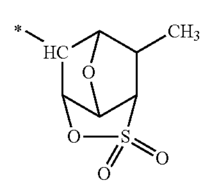

-continued (r-s1-1-27)

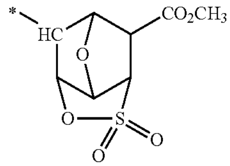

(r-s1-1-28)

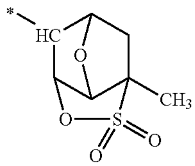

(r-s1-1-29)

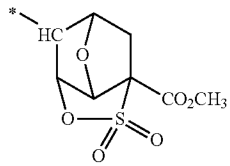

(r-s1-1-30)

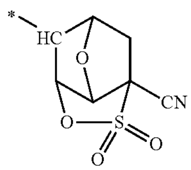

(r-s1-1-31)

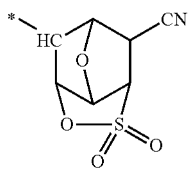

(r-s1-1-32)

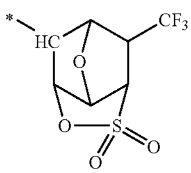

(r-s1-1-33)

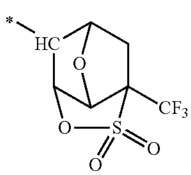

(r-s1-2-1)

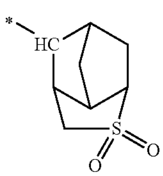

(r-s1-2-2)

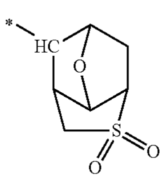

-continued (r-s1-3-1)

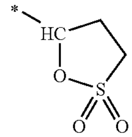

(r-s1-4-1)

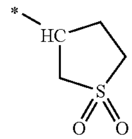

The "carbonate-containing cyclic group" means a cyclic group containing a ring (carbonate ring) including —O—C(═O)—O— in the cyclic skeleton. When the carbonate ring is counted as the first ring, if there is only the carbonate ring, the cyclic group is referred to as a monocyclic group, and if there are other ring structures in addition to the carbonate ring, the cyclic group is referred to as a polycyclic group regardless of its structure. The carbonate-containing cyclic group may be a monocyclic group, or may be a polycyclic group.

The carbonate ring-containing cyclic group is not particularly limited, and any carbonate ring-containing cyclic group can be used. Specific examples thereof include the same groups which are represented by general formulae (ax3-r-1) to (ax3-r-3).

(ax3-r-1)

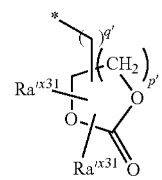

(ax3-r-2)

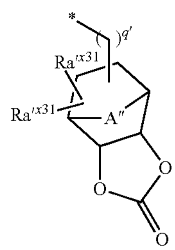

(ax3-r-3)

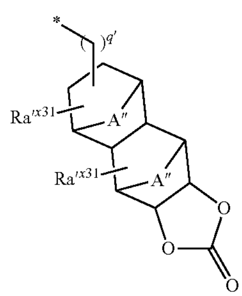

In the formula, $Ra'^{x31}$'s each independently represent a hydrogen atom, an alkyl group, an alkoxy group, a halogen atom, a halogenated alkyl group, a hydroxyl group, —COOR", —OC(═O)R", a hydroxyalkyl group, or a cyano group; R" is a hydrogen atom, an alkyl group, a lactone-containing cyclic group, a carbonate-containing cyclic group, or a —$SO_2$— containing cyclic group; A" is an alkylene group having 1 to 5 carbon atoms, which may have an oxygen atom or a sulfur atom, an oxygen atom, or a sulfur atom; p' is an integer of 0 to 3; and q' is 0 or 1.

In general formulae (ax3-r-2) and (ax3-r-3), A" is the same as A" in general formulae (a2-r-2), (a2-r-3), and (a2-r-5).

An alkyl group, an alkoxy group, a halogen atom, a halogenated alkyl group, —COOR", —OC(═O)R", and a hydroxyalkyl group for $Ra'^{31}$ are the same as those exemplified in the description for $Ra'^{21}$ in general formulae (a2-r-1) to (a2-r-7).

Specific examples of the groups represented by general formulae (ax3-r-1) to (ax3-r-3) are described as follows.

(r-cr-1-1)

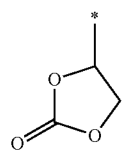

(r-cr-1-2)

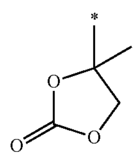

(r-cr-1-3)

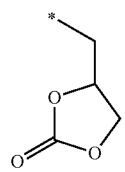

(r-cr-1-4)

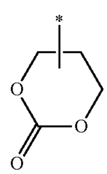

(r-cr-1-5)

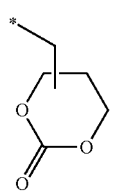

(r-cr-1-6)

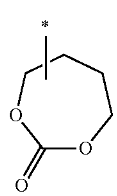

-continued (r-cr-1-7)

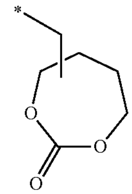

(r-cr-2-1)

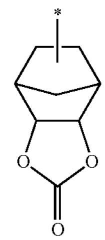

(r-cr-2-2)

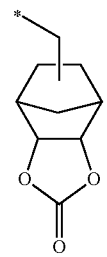

(r-cr-2-3)

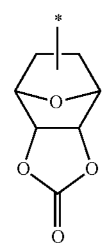

(r-cr-2-4)

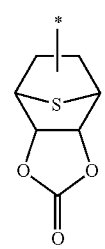

(r-cr-3-1)

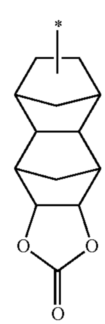

-continued (r-cr-3-2)

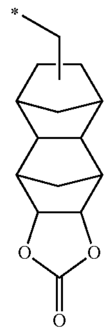

(r-cr-3-3)

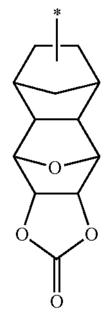

(r-cr-3-4)

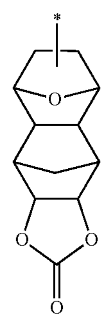

(r-cr-3-5)

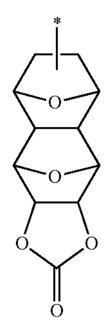

Among the structural units (a2), it is preferably a structural unit derived from acrylic ester which may be obtained by substituting a hydrogen atom bonded to an α-position carbon atom with a substituent.

The structural unit (a2) is preferably a structural unit represented by general formula (a2-1).

(a2-1)

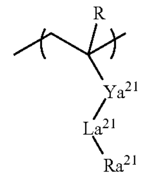

In the formula, R is a hydrogen atom, an alkyl group having 1 to 5 carbon atoms, or a halogenated alkyl group having 1 to 5 carbon atoms. $Ya^{21}$ is a single bond or a divalent linking group. $La^{21}$ is —O—, —COO—, —CON(R')—, —COO—, —CONHCO—, or —CONHCS—, and R' represents a hydrogen atom or a methyl group. Here, in the case where $La^{21}$ is —O—, $Ya^{21}$ is not —CO—. $Ra^{21}$ is a lactone-containing cyclic group, a carbonate-containing cyclic group, or a —$SO_2$— containing cyclic group.

In general formula (a2-1), R is the same as described above. R is preferably a hydrogen atom, an alkyl group having 1 to 5 carbon atoms, or a fluorinated alkyl group having 1 to 5 carbon atoms, and a hydrogen atom or a methyl group is particularly preferable in terms of industrial availability.

In general formula (a2-1), the divalent linking group of $Ya^{21}$ is not particularly limited, and preferred examples thereof include a divalent hydrocarbon group which may have a substituent and a divalent linking group containing a heteroatom.

Examples of the divalent hydrocarbon group for $Ya^{21}$ include the same groups exemplified in the description of the divalent hydrocarbon group for $Va^{01}$ in general formula (a0-1). Examples of the substituent that the divalent hydrocarbon group for $Ya^{21}$ may have include an alkyl group having 1 to 5 carbon atoms, an alkoxy group, a halogen atom, a halogenated alkyl group having 1 to 5 carbon atoms, a hydroxyl group, and a carbonyl group.

Examples of the divalent linking group containing a heteroatom for $Ya^{21}$ include the same groups exemplified in the description for the divalent linking group containing a heteroatom for $Va^{02}$ in general formula (a0-2).

$Ya^{21}$ is preferably a single bond, an ester bond [—C(═O)—O—], an ether bond (—O—), a linear or branched alkylene group, or a combination thereof.

In general formula (a2-1), $La^{21}$ is —O—, —COO—, —CON(R')—, —OCO—, —CONHCO—, or —CONHCS—.

R' represents a hydrogen atom or a methyl group.

Here, in the case where $La^{21}$ is —O—, $Ya^{21}$ is not —CO—.

In general formula (a2-1), $Ra^{21}$ is a lactone-containing cyclic group, a —$SO_2$— containing cyclic group and a carbonate-containing cyclic group.

Preferred examples of the lactone-containing cyclic group for $Ra^{21}$, for the —$SO_2$— containing cyclic group, and the carbonate-containing cyclic group for $Ra^{21}$ include groups represented by general formulae (a2-r-1) to (a2-r-7), groups represented by general formulae (a5-r-1) to (a5-r-4), and groups represented by general formulae (ax3-r-1) to (ax3-r-3).

Among them, as $Ra^{21}$, the lactone-containing cyclic group or the —$SO_2$— containing cyclic group are preferable, the group represented by general formula (a2-r-1), (a2-r-2), (a2-r-6), or (a5-r-1) is further preferable. Specifically, any one of the groups represented by each of Chemical formulae (r-lc-1-1) to (r-lc-1-7), (r-lc-2-1) to (r-lc-2-18), (r-lc-6-1), (r-sl-1-1), and (r-sl-1-18) is further preferable.

The structural unit (a2) that the (A1) component has may be used alone, or two or more kinds thereof may be used in combination.

In the case where the (A1) component has the structural unit (a2), the ratio of the structural unit (a2) is preferably 1 to 70 mol %, is further preferably 3 to 60 mol %, and is still further preferably 5 to 50 mol %, with respect to the total ratio (100 mol %) of the entire structural units which constitute the (A1) component.

When the ratio of the structural unit (a2) is set to be equal to or greater than the lower limit in the preferred range, it is possible to obtain sufficient effect by containing the structural unit (a2). On the other hand, when the ratio of the structural unit (a2) is set to equal to or less than the upper limit in the preferred range, it is possible to make balance with other structural units, and thus various lithography properties and the pattern shape are improved.

Regarding Structural Unit (a9):

The (A1) component may further include a structural unit (a9) represented by general formula (a9-1) in addition to the structural unit (a01), the structural unit (a02), and the structural unit (a03).

(a9-1)

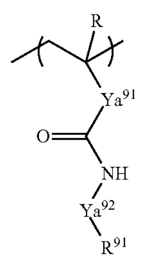

In the formula, R is a hydrogen atom, an alkyl group having 1 to 5 carbon atoms, or a halogenated alkyl group having 1 to 5 carbon atoms. $Ya^{91}$ represents a single bond or a divalent linking group. $Ya^{92}$ is a divalent linking group. $R^{91}$ is a hydrocarbon group which may have a substituent.

In general formula (a9-1), R is the same as described above.

R is preferably a hydrogen atom, an alkyl group having 1 to 5 carbon atoms, or a fluorinated alkyl group having 1 to 5 carbon atoms, and a hydrogen atom or a methyl group is particularly preferable in terms of industrial availability.

In general formula (a9-1), the divalent linking group for $Ya^{91}$ is not particularly limited, and examples thereof include a divalent hydrocarbon group which may have a substituent, and a divalent linking group containing a heteroatom.

Examples of the divalent hydrocarbon group for $Ya^{91}$ include the same groups exemplified in the description of the divalent hydrocarbon group for $Va^{01}$ in general formula (a0-1). Examples of the substituent that the divalent hydrocarbon group for $Ya^{91}$ may have include an alkyl group having 1 to 5 carbon atoms, an alkoxy group, a halogen atom, a halogenated alkyl group having 1 to 5 carbon atoms, a hydroxyl group, and a carbonyl group.

Examples of the divalent linking group containing a heteroatom for $Ya^{91}$ include the same groups exemplified in the description for the divalent linking group containing a heteroatom for $Va^{02}$ in general formula (a0-2).

$Ya^{91}$ is preferably a single bond, an ester bond [—C(═O)—O—], an ether bond (—O—), a linear or branched alkylene group, or a combination thereof, is further preferably a single bond or an ester bond, and is still further preferably a single bond.

In general formula (a9-1), examples of the divalent linking group for $Ya^{92}$ include the same groups as those of the divalent linking group for $Ya^{91}$ in general formula (a9-1).

In the divalent linking group for $Ya^{92}$, a divalent hydrocarbon group which may have a substituent is preferably a linear or branched aliphatic hydrocarbon group.

The number of carbon atoms in the linear aliphatic hydrocarbon group is preferably 1 to 10, is further preferably 1 to 6, is further still preferably 1 to 4, and is most preferably 1 to 3. As the linear aliphatic hydrocarbon group, the linear alkylene group is preferable, and specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms in the branched aliphatic hydrocarbon group is preferably 3 to 10, is further preferably 3 to 6, is still further preferably 3 or 4, and is most preferably 3. As the branched aliphatic hydrocarbon group, a branched alkylene group is preferable, and specifically, examples thereof include an alkyl alkylene group such as an alkyl methylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkyl ethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyl trimethylene group such as —$CH(CH_3)CH_2CH_2$—, and —$CH_2CH(CH_3)CH_2$—; and an alkyl tetramethylene group such as —$CH(CH_3)CH_2CH_2CH_2$— and —$CH_2CH(CH_3)CH_2CH_2$—. As an alkyl group in the alkyl alkylene group, a linear alkyl group having 1 to 5 carbon atoms is preferable.

In addition, in the divalent linking group for $Ya^{92}$, examples of the divalent linking group which may have a heteroatom include —O—, —C(═O)—O—, —C(═O)—, —O—C(═O)—O—, —C(═O)—NH—, —NH—, —NH—C(═NH)— (H may be substituted with a substituent such as an alkyl group and an acyl group), —S—, —$S(=O)_2$—, —$S(=O)_2$—O—, —C(═S)—, and a group represented by general formula —$Y^{21}$—O—$Y^{22}$—, —$Y^{21}$—O—, —$Y^{21}$—C(═O)—O—, —C(═O)—O—$Y^{21}$, $[Y^{21}—C(=O)—O]_{m'}$—$Y^{22}$— or —$Y^{21}$—O—C(═O)—$Y^{22}$— [in the formula, $Y^{21}$ and $Y^{22}$ each independently represent a divalent hydrocarbon group which may a substituent, O is an oxygen atom, and m' is an integer of 0 to 3]. Among them, —C(═O)— and —C(═S)— are preferable.

In general formula (a9-1), examples of the hydrocarbon group for $R^{91}$ include an alkyl group, a monovalent alicyclic hydrocarbon group, an aryl group, and an aralkyl group.

The number of carbon atoms in the alkyl group for $R^{91}$ is preferably 1 to 8, is further preferably 1 to 6, and is further still preferably 1 to 4, and the alkyl group may be a linear or branched group. Specifically, preferred examples thereof include a methyl group, an ethyl group, a propyl group, a butyl group, a hexyl group, and an octyl group.

The number of carbon atoms in the monovalent alicyclic hydrocarbon group for $R^{91}$ is preferably 3 to 20, and is further preferably 3 to 12, and the monovalent alicyclic hydrocarbon group may be a polycyclic group, and may be a monocyclic group. The monocyclic alicyclic hydrocarbon group is preferably a group obtained by removing one or more hydrogen atoms from monocycloalkane. The number of carbon atoms in the monocycloalkane is preferably 3 to 6, and specifically, is preferably cyclobutane, cyclopentane, cyclohexane, or the like. The polycyclic alicyclic hydrocarbon group is preferably a group obtained by removing one or more hydrogen atoms from polycycloalkane, and the number of carbon atoms in the polycycloalkane is preferably 7 to 12. Specifically, examples thereof include adamantane, norbornane, isobornane, tricyclodecane, and tetracyclododecane.

The number of carbon atoms in the aryl group for $R^{91}$ is preferably 6 to 18, and is further preferably 6 to 10, and specifically, a phenyl group is particularly preferable.

As the aralkyl group for $R^{91}$, an aralkyl group in which an alkylene group having 1 to 8 carbon atoms and "the aryl group for $R^{91}$" are bonded to each other is preferable, an aralkyl group in which an alkylene group having 1 to 6 carbon atoms and "the aryl group for $R^{91}$" are bonded to each other is further preferable, and an aralkyl group in which an alkylene group having 1 to 4 carbon atoms and "the aryl group for $R^{91}$" are bonded to each other is particularly preferable.

Regarding the hydrocarbon group for $R^{91}$, at least one hydrogen atom in the hydrocarbon group are preferably substituted with a fluorine atom, 30% to 100% of hydrogen atoms in the hydrocarbon group is preferably substituted with a fluorine atom. Among them, a perfluoroalkyl group in which all of the hydrogen atoms in the alkyl group are substituted with a fluorine atom is particularly preferable.

The hydrocarbon group for $R^{91}$ may have a substituent. Examples of the substituent include a halogen atom, an oxy group (═O), a hydroxyl group (—OH), an amino group (—$NH_2$), and —$SO_2$—$NH_2$. In addition, a portion of a carbon atom forming a hydrocarbon group may be substituted with a substituent containing a heteroatom. Examples of the substituent containing the heteroatom include —O—, —NH—, —N═, —C(═O)—O—, —S—, —S(═O)$_2$—, and —S(═O)$_2$—O—.

In $R^{91}$, examples of the hydrocarbon group having a substituent include a lactone-containing cyclic group represented by general formulae (a2-r-1) to (a2-r-7).

In addition, with respect to $R^{91}$, examples of a hydrocarbon group having a substituent include a —$SO_2$— containing cyclic group represented by general formulae (a5-r-1) to (a5-r-4); a substituted aryl group represented by general formulae (r-ar-1) to (r-ar-8); and a monovalent heterocyclic group represented by general formulae (r-hr-1) to (r-hr-16).

(r-ar-1)

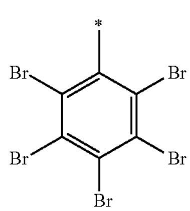

(r-ar-2)

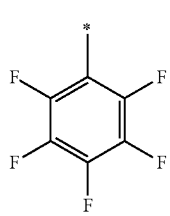

-continued (r-ar-3)

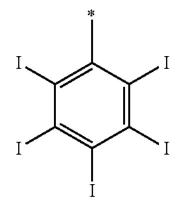

(r-ar-4)

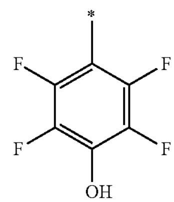

(r-ar-5)

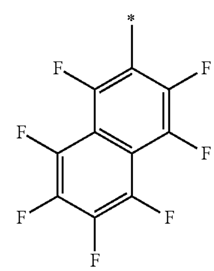

(r-ar-6)

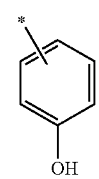

(r-ar-7)

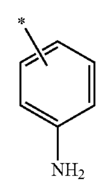

(r-ar-8)

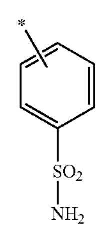

(r-hr-1)

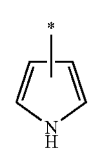

(r-hr-2)

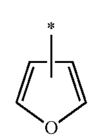

-continued (r-hr-3)

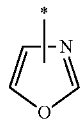

(r-hr-4)

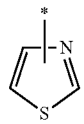

(r-hr-5)

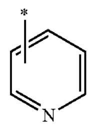

(r-hr-6)

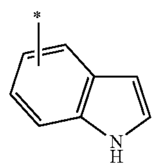

(r-hr-7)

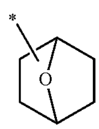

(r-hr-8)

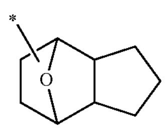

(r-hr-9)

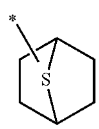

(r-hr-10)

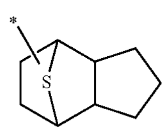

(r-hr-11)

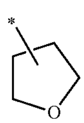

(r-hr-12)

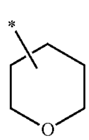

(r-hr-13)

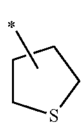

-continued (r-hr-14)

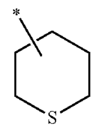

(r-hr-15)

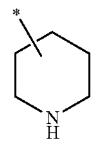

(r-hr-16)

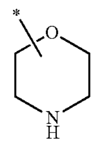

Among the structural units (a9), a structural unit represented by general formula (a9-1-1) is preferable.

(a9-1-1)

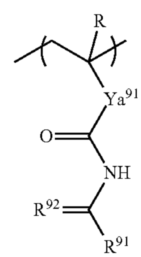

In the formula, R is the same as described above. $Ya^{91}$ is a single bond or a divalent linking group. $R^{91}$ is a hydrocarbon group which may have a substituent. $R^{92}$ is an oxygen atom or a sulfur atom.

In general formula (a9-1-1), the description of $Ya^{91}$, $R^{91}$, and R is the same as that of $Ya^{91}$, $R^{91}$, and R in general formula (a9-1).

Hereinafter, specific examples of the structural unit represented by general formula (a9-1) or general formula (a9-1-1) will be described. In the formula, $R^{\alpha}$ represents a hydrogen atom, a methyl group, or a trifluoromethyl group.

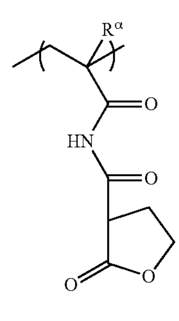

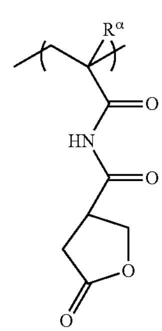

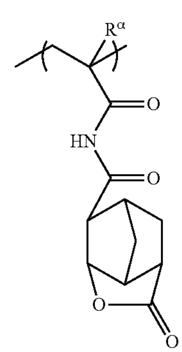

-continued

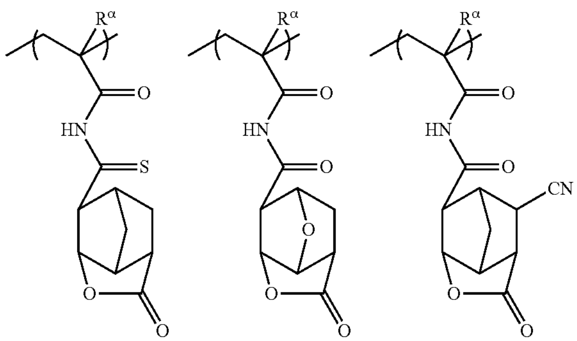
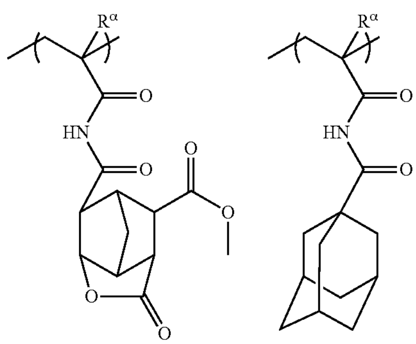
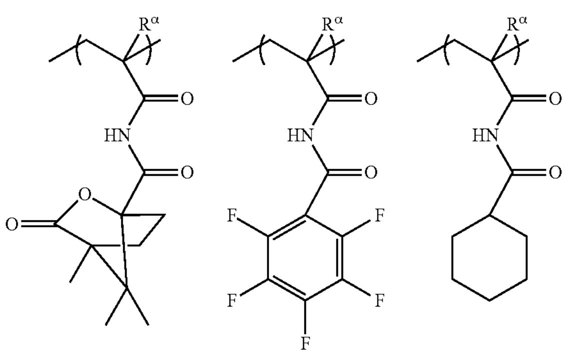
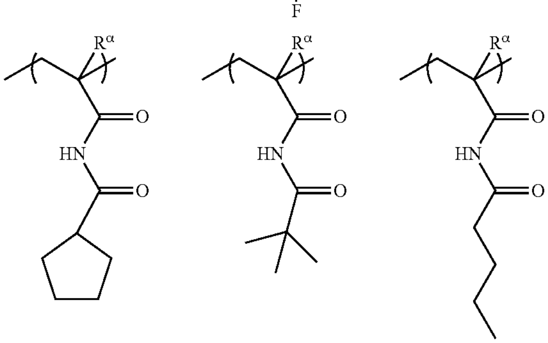
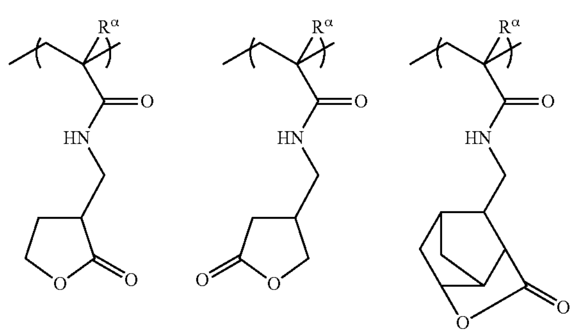

-continued

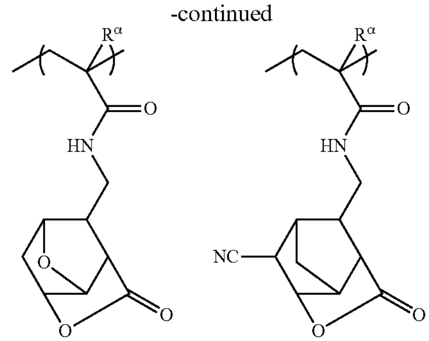
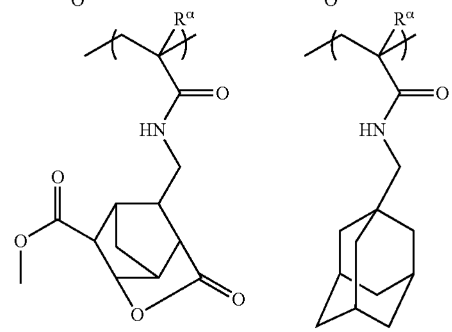
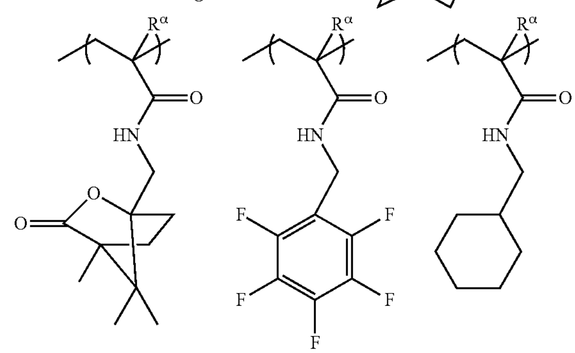
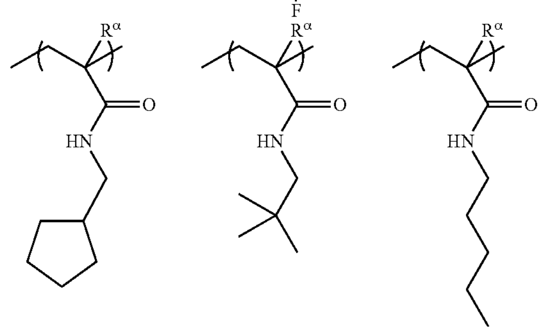

The structural unit (a9) that the (A1) component has may be used alone, or two or more kinds thereof may be used in combination.

In the case where the (A1) component has the structural unit (a9), the ratio of the structural unit (a9) is preferably 1 to 70 mol %, is further preferably 3 to 60 mol %, and is still further preferably 5 to 50 mol %, with respect to the total ratio (100 mol %) of the entire structural units which constitute the (A1) component.

When the ratio of the structural unit (a9) is set to be equal to or greater than the lower limit in the preferred range, the lithography properties such as the sensitivity and the developing properties are likely to be improved; on the other hand, when the ratio of the structural unit (a9) is set to be equal to or lower than the preferred upper limit, it is possible to make balance with other structural units, and thus various lithography properties and the pattern shape are improved.

In the resist composition of the present embodiment, the (A) component contains a polymer compound (A1) having a structural unit (a01), a structural unit (a02), and a structural unit (a03) having a specific ration.

Specific examples of the (A1) component include a polymer compound including a repeated structure of the structural unit (a01), the structural unit (a02), and the structural unit (a03) in which the ratio is greater than 0 mol % and equal to or less than 10 mol % with respect to the total of the entire structural units constituting the (A1) component.

The mass average molecular weight (Mw) (standard polystyrene determined by gel permeation chromatography (GPC)) of the (A1) component is not particularly limited, and is preferably about 1,000 to 500,000, is further preferably about 2,000 to 100,000, and is still further preferably about 3,000 to 50,000.

When the Mw of the (A1) component is equal to or less than the preferred upper limit, the solubility in a resist solvent is sufficient in the case where the (A1) component is used as a resist, and when the Mw of the (A1) component is equal to or greater than the preferred lower limit, dry etching resistance and a resist pattern cross-sectional shape are improved.

The molecular weight dispersivity (Mw/Mn) of the (A1) component is not particularly limited, and is preferably about 1.0 to 4.0, is preferably about 1.0 to 3.0, and is particularly preferably about 1.5 to 2.5. Note that, Mn represents a number average molecular weight.

The (A1) component may be used alone, or two or more kinds thereof may be used in combination.

The ratio of the (A1) component in the (A) component is preferably equal to or greater than 25% by mass, is further preferably equal to or greater than 50% by mass, is still further preferably equal to or greater than 75% by mass, and may be 100% by mass, with respect to the total mass of the (A) component.

When the ratio of the (A1) component is equal to or greater than the lower limit in the preferred range, it is easy to form a resist pattern which is excellent in other lithography properties such as high sensitivity and the reduced roughness.

(A2) Component

In the resist composition of the present embodiment, a base material component (hereinafter, also referred to as "(A2) component) which does not correspond to the above-described (A1) component and whose solubility in a developing solution changes under action of an acid may be used also as the (A) component.

The (A2) component is not particularly limited as long as a base material component for chemically amplified resist composition is used by optionally selected from conventionally well-known components. Examples of the (A2) component include a polymer compound having at least one structural unit selected from the group consisting of a structural unit containing an acid-decomposable group in which the polarity is increased under the action of the acid, the structural unit (a2), the structural unit (a9), a structural unit derived from a styrene, a structural unit derived from a styrene derivative, a structural unit containing a polar group-containing aliphatic hydrocarbon group, and a structural unit containing an acid non-dissociable aliphatic cyclic group. The (A2) component preferably has a structural unit containing an acid-decomposable group in which the polarity is increased under the action of the acid, and examples of such structural unit include the structural unit (a01). Preferable examples of the structural unit (a01) for the (A2) component include the same examples exemplified in the description of the (A1) component. Preferably, the (A2) component further has the structural unit (a2) or the structural unit (a9). Preferable examples of the structural unit (a2) and the structural unit (a9) for the (A2) compound include the same examples exemplified in the description of the (A1) compound. More preferably, the (A2) component is a polymer compound having the structural unit (a01), the structural unit (a2) and the structural unit (a9).

The (A2) component may be used alone, and two or more kinds thereof may be used in combination.

In the resist composition of the present embodiment, the (A) component may be used alone, or two or more kinds thereof may be used in combination. The (A) component may preferably contain the (A1) component and the (A2) component.

In the resist composition of the present embodiment, the content of the (A) component may be adjusted in accordance with a film thickness of a resist film to be formed.

Other Components

In addition to the (A) component, the resist composition of the present embodiment may further contain components other than the (A) component. Examples of other components include a (B) component, a (D) component, an (E) component, an (F) component, and an (S) component, which are described below.

Acid Generator Component (B)

The resist composition of the present embodiment may further contain an acid generator component (hereinafter, also referred to as "(B) component") in addition to the (A) component.

The component (B) is not particularly limited, and examples thereof include components which have been suggested as acid generators for chemically amplified resist compositions.

Examples of such an acid generator include various kinds of acid generators such as an onium salt-based acid generator such as an iodonium salt and a sulfonium salt, an oxime sulfonate-based acid generator; bisalkyl or bisaryl sulfonyl diazomethane, a diazomethane-based acid generator such as poly (bissulfonyl) diazomethane; a nitro benzyl sulfonate-based acid generator, an iminosulfonate-based acid generator, and a disulfone-based acid generator. Among them, the onium salt-based acid generator is preferably used.

Examples of the onium salt-based acid generator include a compound (hereinafter, also referred to as "(b-1) component") represented by general formula (b-1), a compound (hereinafter, also referred to as "(b-2) component") represented by general formula (b-2), or a compound (hereinafter, also referred to as "(b-3) component") represented by general formula (b-3).

(b-1)

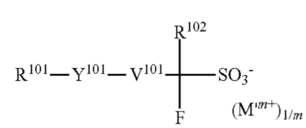

(b-2)

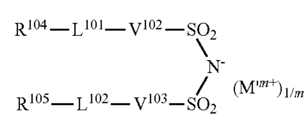

-continued

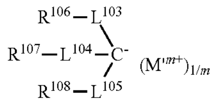

(b-3)

In the formula, $R^{101}$, $R^{104}$ to $R^{108}$ each independently represent a cyclic group which may have a substituent, a chain alkyl group which may have a substituent, or a chain alkenyl group which may have a substituent. $R^{104}$ and $R^{105}$ may be bonded to each other so as to form a ring.

$R^{102}$ is a fluorine atom or a fluorinated alkyl group having 1 to 5 carbon atoms. $Y^{101}$ is a divalent linking group containing a single bond or an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO— or —$SO_2$—. m is an integer of equal to or greater than 1, and $M'^{m+}$ is an m-valent onium cation.

Anion Part

Anion Part of (b-1) Component

In general formula (b-1), $R^{101}$ is a cyclic group which may have a substituent, a chain alkyl group which may have a substituent, or a chain alkenyl group which may have a substituent.

Cyclic Group which May have a Substituent:

The cyclic group is preferably a cyclic hydrocarbon group, and the cyclic hydrocarbon group may be an aromatic hydrocarbon group, or may be an aliphatic hydrocarbon group. The aliphatic hydrocarbon group means a hydrocarbon group having no aromaticity. In addition, the aliphatic hydrocarbon group may be saturated or unsaturated, and is usually preferably saturated.

The aromatic hydrocarbon group for $R^{101}$ is a hydrocarbon group having an aromatic ring. The number of carbon atoms in the aromatic hydrocarbon group is preferably 3 to 30, is further preferably 5 to 30, is still further preferably 5 to 20, is particularly preferably 6 to 15, and is most preferably 6 to 10. Here, it is assumed that the number of carbon atoms does not include the number of carbon atoms in the substituent.

Specific examples of an aromatic ring having an aromatic hydrocarbon group for $R^{101}$ include benzene, fluorene, naphthalene, anthracene, phenanthrene, biphenyl, or an aromatic heterocycle in which a portion of carbon atoms constituting these aromatic rings is substituted with heteroatoms. Examples of the heteroatom in the aromatic heterocycle include an oxygen atom, a sulfur atom, and a nitrogen atom.

Specific examples of the aromatic hydrocarbon group for $R^{101}$ include a group obtained by removing one hydrogen atom from the aromatic ring (aryl group: for example, a phenyl group and a naphthyl group), a group in which one hydrogen atom in the aromatic ring is substituted with an alkylene group (for example, an aryl alkyl group such as a benzyl group, a phenethyl group, a 1-naphthyl methyl group, a 2-naphthyl methyl group, a 1-naphthyl ethyl group, and a 2-naphthyl ethyl group). The number of carbon atoms in the alkylene group (an alkyl chain in an aryl alkyl group) is preferably 1 to 4, is more preferably 1 or 2, and is particularly preferably 1.

Examples of the cyclic aliphatic hydrocarbon group for $R^{101}$ include an aliphatic hydrocarbon group including a ring in the structure.

Examples of the aliphatic hydrocarbon group including a ring in this structure include an alicyclic hydrocarbon group (a group obtained by removing one hydrogen atom from an aliphatic hydrocarbon ring), a group in which an alicyclic hydrocarbon group is bonded to a terminal of a linear or branched aliphatic hydrocarbon group, and a group in which an alicyclic hydrocarbon group is present in the middle of the linear or branched aliphatic hydrocarbon group.

The number of carbon atoms in the alicyclic hydrocarbon group is preferably 3 to 20, and is further preferably 3 to 12.

The alicyclic hydrocarbon group may be a polycyclic group, or may be a monocyclic group. As the monocyclic alicyclic hydrocarbon group, a group obtained by removing one or more hydrogen atoms from the monocycloalkane is preferable. As the monocycloalkane, a group having 3 to 6 carbon atoms is preferable, and specific examples thereof include cyclopentane and cyclohexane. As the polycyclic alicyclic hydrocarbon group, a group obtained by removing one or more hydrogen atoms from the polycycloalkane is preferable, and as the polycycloalkane, a group having 7 to 30 carbon atoms is preferable. Among them, as polycycloalkane, polycycloalkane having a bridged ring polycyclic skeleton such as adamantane, norbornane, isobornane, tricyclodecane, and tetracyclododecane; and polycycloalkane having a condensed ring-based polycyclic skeleton such as a cyclic group having a steroid skeleton is further preferable.

Among them, as the cyclic aliphatic hydrocarbon group for $R^{101}$, a group obtained by removing one or more hydrogen atoms from monocycloalkane or polycycloalkane is preferable, a group obtained by excluding one hydrogen atom from polycycloalkane is further preferable, an adamantyl group and a norbornyl group are particularly preferable, and an adamantyl group is most preferable.

The number of carbon atoms in a linear or branched aliphatic hydrocarbon group that may be bonded to an alicyclic hydrocarbon group is preferably 1 to 10, is further preferably 1 to 6, is further still preferably 1 to 4, and is most preferably 1 to 3.

As a linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As a branched aliphatic hydrocarbon group, a branched alkylene group is preferable, and specific examples thereof include an alkyl alkylene group such as an alkyl methylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkyl ethylene group such as —$CH(CH_3)CH_2$—, —$CH(CH_3)CH(CH_3)$—, —$C(CH_3)_2CH_2$—, —$CH(CH_2CH_3)CH_2$—, —$C(CH_2CH_3)_2$—$CH_2$—; an alkyl trimethylene group such as —$CH(CH_3)CH_2CH_2$— and —$CH_2CH(CH_3)CH_2$—; and an alkyl tetramethylene group such as —$CH(CH_3)CH_2CH_2CH_2$— and —$CH_2CH(CH_3)CH_2CH_2$—. As an alkyl group in an alkyl alkylene group, a linear alkyl group having 1 to 5 carbon atoms is preferable.

In addition, a cyclic hydrocarbon group for $R^{101}$ may include a heteroatom such as a heterocycle. Specific examples include lactone-containing cyclic groups respectively represented by general formulae (a2-r-1) to (a2-r-7), —$SO_2$— containing cyclic groups respectively represented by general formulae (a5-r-1) to (a5-r-4), and other heterocyclic groups respectively represented by Chemical formulae (r-hr-1) to (r-hr-16).

Examples of the substituent in a cyclic group for $R^{101}$ include an alkyl group, an alkoxy group, a halogen atom, a halogenated alkyl group, a hydroxyl group, a carbonyl group, and a nitro group.

The alkyl group as a substituent is preferably an alkyl group having 1 to 5 carbon atoms, and is most preferably a methyl group, an ethyl group, a propyl group, an n-butyl group, and a tert-butyl group.

The alkoxy group as a substituent is preferably an alkoxy group having 1 to 5 carbon atoms, is further preferably a methoxy group, an ethoxy group, an n-propoxy group, an iso-propoxy group, an n-butoxy group, and a tert-butoxy group, and is most preferably a methoxy group and an ethoxy group.

Examples of the halogen atom as a substituent include a fluorine atom, a chlorine atom, a bromine atom, and an iodine atom, and among them, the fluorine atom is preferable.

Examples of the halogenated alkyl group as a substituent include an alkyl group having 1 to 5 carbon atoms such as a methyl group, an ethyl group, a propyl group, an n-butyl group, and a tert-butyl group in which at least one hydrogen atom is substituted with a halogen atom.

A carbonyl group as a substituent is a group in which a methylene group (—$CH_2$—) constituting a cyclic hydrocarbon group is substituted.

Chain Alkyl Group which May have Substituent:

A chain alkyl group for $R^{101}$ may be a linear alkyl group or a branched alkyl group.

The number of carbon atoms in the linear alkyl group is preferably 1 to 20, is further preferably 1 to 15, and is most preferably 1 to 10. Specific examples include a methyl group, an ethyl group, a propyl group, a butyl group, a pentyl group, a hexyl group, a heptyl group, an octyl group, a nonyl group, a decanyl group, a undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a heneicosyl group, and a docosyl group.

The number of carbon atoms in the branched alkyl group is preferably 3 to 20, is further preferably 3 to 15, and is most preferably 3 to 10. Specifically, examples thereof include a 1-methyl ethyl group, a 1-methyl propyl group, a 2-methyl propyl group, a 1-methyl butyl group, a 2-methyl butyl group, a 3-methyl butyl group, a 1-ethyl butyl group, a 2-ethyl butyl group, a 1-methyl pentyl group, a 2-methyl pentyl group, a 3-methyl pentyl group, and a 4-methyl pentyl group.

Chain Alkenyl Group which May have Substituent:

A chain alkenyl group for $R^{101}$ may be a linear alkenyl group or a branched alkenyl group, and the number of carbon atoms in the chain alkenyl group for $R^{101}$ is preferably 2 to 10, is further preferably 2 to 5, and is further preferably 2 to 4, and is particularly preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methyl propenyl group, and a 2-methyl propenyl group.

Among them, as a chain alkenyl group, a linear alkenyl group is preferable, a vinyl group and a propenyl group are further preferable, and a vinyl group is particularly preferable.

Examples of a substituent in a chain alkyl group or a chain alkenyl group for $R^{101}$ include an alkoxy group, a halogen atom, a halogenated alkyl group, a hydroxyl group, a carbonyl group, a nitro group, an amino group, and a cyclic group for $R^{101}$ above.

Among them, $R^{101}$ is preferably the cyclic group which may have a substituent, and is further preferably the cyclic hydrocarbon group which may have a substituent. More specific examples thereof include a group obtained by removing one or more hydrogen atoms from a phenyl group, a naphthyl group, and polycycloalkane; lactone-containing cyclic groups respectively represented by general formulae (a2-r-1) to (a2-r-7); and —$SO_2$— containing cyclic groups respectively represented by general formulae (a5-r-1) to (a5-r-4).

In general formula (b-1), $Y^{101}$ is a divalent linking group containing a single bond or an oxygen atom.

In the case where $Y^{101}$ is a divalent linking group containing an oxygen atom, $Y^{101}$ contain atoms other than the oxygen atom. Examples of the atoms other than the oxygen atom include a carbon atom, a hydrogen atom, a sulfur atom, and a nitrogen atom.

Examples of the divalent linking group containing an oxygen atom include a non-hydrocarbon-based oxygen atom-containing linking group such as an oxygen atom (ether bond: —O—), an ester bond (—C(=O)—O—), an oxycarbonyl group (—O—C(=O)—), an amide bond (—C(=O)—NH—), a carbonyl group (—C(=O)—), and a carbonate bond (—O—C(=O)—O—); and a combination of the non-hydrocarbon-based oxygen atom-containing linking group with an alkylene group. A sulfonyl group (—$SO_2$—) may be further linked to the combination. Examples of the divalent linking group containing an oxygen atom include linking groups respectively represented by general formulae (y-al-1) to (y-al-7).

(y-al-1)

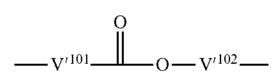

(y-al-2)

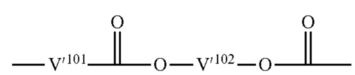

(y-al-3)

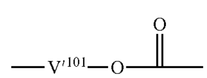

(y-al-4)

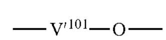

(y-al-5)

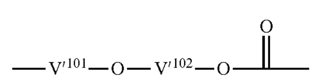

(y-al-6)

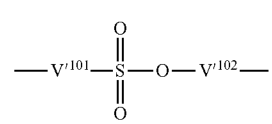

(y-al-7)

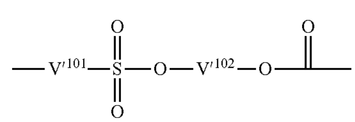

In the formulae, $V'^{101}$ is a single bond or an alkylene group having 1 to 5 carbon atoms, and $V'^{102}$ is a divalent saturated hydrocarbon group having 1 to 30 carbon atoms.

The divalent saturated hydrocarbon group for $V'^{102}$ is preferably an alkylene group having 1 to 30 carbon atoms, is further preferably an alkylene group having 1 to 10 carbon atoms, and is still further preferably an alkylene group having 1 to 5 carbon atoms.

The alkylene group for $V'^{101}$ and $V'^{102}$ may be a linear alkylene group or a branched alkylene group, and is preferably a linear alkylene group.

Specific examples of the alkylene group for $V'^{101}$ and $V'^{102}$ include a methylene group [$—CH_2—$]; an alkyl methylene group such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, and $—C(CH_2CH_3)_2—$; an ethylene group [$—CH_2CH_2—$]; an alkyl ethylene group such as $—CH(CH_3)CH_2—$, $—CH(CH_3)CH(CH_3)—$, $—C(CH_3)_2CH_2—$, and $—CH(CH_2CH_3)CH_2—$; a trimethylene group (an n-propylene group) [$—CH_2CH_2CH_2—$]; an alkyl trimethylene group such as $—CH(CH_3)CH_2CH_2—$, and $—CH_2CH(CH_3)CH_2—$; a tetramethylene group [$—CH_2CH_2CH_2CH_2—$]; an alkyl tetramethylene group such as $—CH(CH_3)CH_2CH_2CH_2—$ and $—CH_2CH(CH_3)CH_2CH_2—$; and a pentamethylene group [$—CH_2CH_2CH_2CH_2CH_2—$].

Further, a portion of methylene groups in the alkylene group for $V'^{101}$ or $V'^{102}$ may be substituted with a divalent aliphatic cyclic group having 5 to 10 carbon atoms. The aliphatic cyclic group is preferably a divalent group obtained by further removing one hydrogen atom from a cyclic aliphatic hydrocarbon group (a monocyclic alicyclic hydrocarbon group and a polycyclic alicyclic hydrocarbon group) of $R^{101}$ in general formula (b-1), and is further preferably a cyclohexylene group, a 1,5-adamantylene group, or a 2,6-adamantylene group.

As $Y^{101}$, a divalent linking group containing an ester bond, or a divalent linking group containing an ether bond is preferable, and linking groups respectively represented by general formulae (y-al-1) to (y-al-5) are further preferable.

In general formula (b-1), $V^{101}$ is a single bond, an alkylene group, or a fluorinated alkylene group. The alkylene group and the fluorinated alkylene group for $V^{101}$ preferably have 1 to 4 carbon atoms. Examples of the fluorinated alkylene group for $V^{101}$ include a group in which at least one hydrogen atom in the alkylene group for $V^{101}$ is substituted with a fluorine atom. Among them, $V^{101}$ is preferably a single bond or a fluorinated alkylene group having 1 to 4 carbon atoms.

In general formula (b-1), $R^{102}$ is a fluorine atom or a fluorinated alkyl group having 1 to 5 carbon atoms. $R^{102}$ is preferably a fluorine atom or a perfluoroalkyl group having 1 to 5 carbon atoms, and is further preferably a fluorine atom.

Specific examples of the anion part of the (b-1) component include a fluorinated alkyl sulfonate anion such as trifluoromethane sulfonate anion and perfluorobutane sulfonate anion in the case where $Y^{101}$ is a single bond; and the anion represented by any one of general formulae (an-1) to (an-3) in the case where $Y^{101}$ is a divalent linking group containing an oxygen atom.

(an-1)

$$R''^{101}—(CH_2)_{v''}—\overset{O}{\overset{\|}{C}}—O—(CH_2)_{q''}—\left[O—\overset{O}{\overset{\|}{C}}\right]_{n''}—(CF_2)_{t''}—SO_3^-$$

(an-2)

$$R''^{102}—(CH_2)_{v''}—O—\overset{O}{\overset{\|}{C}}—(CF_2)_{t''}—SO_3^-$$

-continued (an-3)

$$R''^{103}—(CH_2)_{v''}—O—\left[(CH_2)_{q''}—O—\overset{O}{\overset{\|}{C}}\right]_{n''}—(CF_2)_{t''}—SO_3^-$$

In the formulae, $R''^{101}$ is an aliphatic cyclic group which may have a substituent, groups respectively represented by general formulae (r-hr-1) to (r-hr-6), or a chain alkyl group which may have a substituent; $R''^{102}$ is an aliphatic cyclic group which may have a substituent, a lactone-containing cyclic group represented by general formulae (a2-r-1) to (a2-r-7), or a $—SO_2—$ containing cyclic group represented by general formulae (a5-r-1) to (a5-r-4); $R''^{103}$ is an aromatic cyclic group which may have a substituent, an aliphatic cyclic group which may have a substituent, or a chain alkenyl group which may have a substituent; v"'s are each independently an integer of 0 to 3, q"'s are each independently an integer of 1 to 20, t" are each independently an integer of 1 to 3, and n" is an integer of 0 or 1.

The aliphatic cyclic group which may have a substituent for $R''^{101}$, $R''^{102}$, and $R''^{103}$ is preferably a group exemplified as a cyclic aliphatic hydrocarbon group for $R^{101}$. Examples of the substituents include the same substituents as those with which the cyclic aliphatic hydrocarbon group for $R^{101}$ may be substituted.

The aromatic cyclic group which may have a substituent for $R''^{103}$ is preferably a group exemplified as an aromatic hydrocarbon group of a cyclic hydrocarbon group for $R^{101}$. Examples of the substituents include the same substituents as those with which an aromatic hydrocarbon group for $R^{101}$ may be substituted.

The chain alkyl group which may have a substituent for $R''^{101}$ is preferably a group exemplified as a chain alkyl group for $R^{101}$. The chain alkenyl group which may have a substituent for $R''^{103}$ is preferably a group exemplified as a chain alkenyl group for $R^{101}$.

Anion Part of (b-2) Component

In the formula (b-2), $R^{104}$ and $R^{105}$ each independently represent a cyclic group which may have a substituent, a chain alkyl group which may have a substituent, or a chain alkenyl group which may have a substituent, which is the same as a cyclic group which may have a substituent, a chain alkyl group which may have a substituent, or a chain alkenyl group which may have a substituent, which is the same as the group for $R^{101}$ in general formula (b-1). Here, $R^{104}$ and $R^{105}$ may be bonded to each other so as to form a ring.

$R^{104}$ and $R^{105}$ are preferably a chain alkyl group which may have a substituent, and are further preferably a linear or branched alkyl group, or a linear or branched fluorinated alkyl group.

The number of the carbon atoms in the chain alkyl group is preferably 1 to 10, is further preferably 1 to 7, and is still further preferably 1 to 3. The number of the carbon atoms in the chain alkyl group for $R^{104}$ and $R^{105}$ is preferably as small as possible within the range of the carbon number from the viewpoint that the solubility in the resist solvent is improved or the like. In the chain alkyl group for $R^{104}$ and $R^{105}$, a large number of the hydrogen atoms which are substituted with a fluorine atom is preferable since the strength of the acid becomes stronger and transparency to high energy light of 200 nm or less or electron beam is improved.

The ratio of a fluorine atom in the chain alkyl group, that is, a fluorination rate is preferably 70% to 100%, and is further preferably 90% to 100%, and a perfluoroalkyl group in which all hydrogen atoms are substituted with fluorine atoms is most preferable.

In the formula (b-2), $V^{102}$ and $V^{103}$ each independently represent a single bond, an alkylene group, or a fluorinated alkylene group, which is the same as that in $V^{101}$ in the formula (b-1).

In the formula (b-2), $L^{101}$ and $L^{102}$ each independently represent a single bond or an oxygen atom.

Anion Part of (b-3) Component

In the formula (b-3), $R^{106}$ to $R^{108}$ each independently represent an acyclic group which may have a substituent, a chain alkyl group which may have a substituent, or a chain alkenyl group which may have a substituent, which is the same as the group for $R^{101}$ in general formula (b-1).

$L^{103}$ to $L^{105}$ each independently represent a single bond, —CO—, or —$SO_2$—.

Cation Part

In general formulae (b-1), (b-2), and (b-3), m is an integer of equal to or greater than 1, $M'^{m+}$ is an m-valent onium cation, and preferred examples thereof include a sulfonium cation and an iodonium cation. The organic cations respectively represented by general formulae (ca-1) to (ca-5) are particularly preferable.

(ca-1)

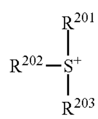

(ca-2)

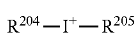

(ca-3)

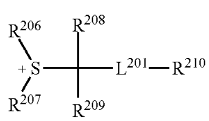

(ca-4)

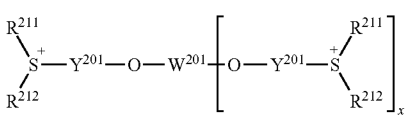

(ca-5)

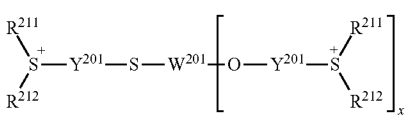

In the formulae, $R^{201}$ to $R^{207}$, and $R^{211}$ and $R^{212}$ each independently represent an aryl group which may have a substituent, an alkyl group, or an alkenyl group, and $R^{201}$ to $R^{203}$, $R^{206}$ and $R^{207}$, and $R^{211}$ and $R^{212}$ may be bonded to each other so as to form a ring together with a sulfur atom in the formula. $R^{208}$ and $R^{209}$ each independently represent a hydrogen atom or an alkyl group having 1 to 5 carbon atoms. $R^{210}$ represents an aryl group which may have a substituent, an alkyl group which may have a substituent, an alkenyl group which may have a substituent, or a —$SO_2$— containing cyclic group may have a substituent. $L^{201}$ represents —C(═O)— or —C(═O)—O—. $Y^{201}$'s each independently represent an arylene group, an alkylene group, or an alkenylene group. x is 1 or 2. $W^{201}$ represents a (x+1) valent linking group.

Examples of the aryl group for $R^{201}$ to $R^{207}$ and $R^{211}$ and $R^{212}$ include an unsubstituted aryl group having 6 to 20 carbon atoms, and a phenyl group and a naphthyl group are preferable.

As the alkyl group for $R^{201}$ to $R^{207}$ and $R^{211}$ and $R^{212}$, a chain or cyclic alkyl group having 1 to 30 carbon atoms is preferable.

As the alkenyl group for $R^{201}$ to $R^{207}$ and $R^{211}$ and $R^{212}$, an alkenyl group having 2 to 10 carbon atoms is preferable.

Examples of the substituents that $R^{201}$ to $R^{207}$ and $R^{210}$ to $R^{212}$ which may have include an alkyl group, a halogen atom, a halogenated alkyl group, a carbonyl group, a cyano group, an amino group, an aryl group, and the same groups which are represented by general formulae (ca-r-1) to (ca-r-7).

[ca-r-1]

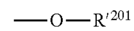

[ca-r-2]

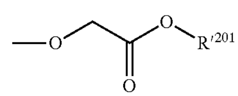

[ca-r-3]

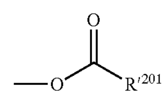

[ca-r-4]

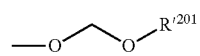

[ca-r-5]

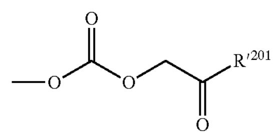

[ca-r-6]

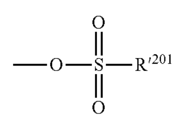

[ca-r-7]

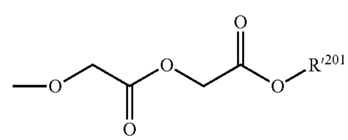

In the formulae, $R'^{201}$'s each independently represent a hydrogen atom, a cyclic group which may have a substituent, a chain alkyl group which may have a substituent, or a chain alkenyl group which may have a substituent.

Examples of the cyclic group which may have a substituent, the chain alkyl group which may have a substituent, or the chain alkenyl group which may have a substituent of $R'^{201}$ include the same groups of $R^{101}$ in general formula (b-1), and examples of the cyclic group which may have a substituent or the chain alkyl group which may have a substituent also include the same group as that of an acid dissociable group represented by general formula (a0-r1-1), (a0-r1-2), or (a0-r1-3).

In the case where $R^{201}$ to $R^{203}$, $R^{206}$ and $R^{207}$, $R^{211}$ and $R^{212}$ are bonded to each other so as to form a ring together with a sulfur atom in the formula, the bonding may be performed via a heteroatom such as a sulfur atom, an oxygen atom, and a nitrogen atom, or a functional group such as a carbonyl group, —SO—, —$SO_2$—, —$SO_3$—, —COO—, —CONH— and —N($R_N$)— ($R_N$ is an alkyl group having 1 to 5 carbon atoms). As a ring to be formed, a ring including a sulfur atom in the formula in the ring skeleton is preferably 3- to 10-membered rings including a sulfur atom, and is particularly preferably 5- to 7-membered rings including a sulfur atom. Specific examples of rings to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms, and a hydrogen atom or an alkyl group having 1 to 3 carbon atoms is preferable, and in the case of the alkyl group, the alkyl groups may be bonded to each other so as to form a ring.

$R^{210}$ is an aryl group which may have a substituent, an alkyl group which may have a substituent, an alkenyl group which may have a substituent, or a —$SO_2$— containing cyclic group which may have a substituent.

Examples of the aryl group for $R^{210}$ include an unsubstituted aryl group having 6 to 20 carbon atoms, and a phenyl group and a naphthyl group are preferable.

The alkyl group for $R^{210}$ is a chain or cyclic alkyl group, and preferably has 1 to 30 carbon atoms.

The alkenyl group for $R^{210}$ preferably has 2 to 10 carbon atoms.

The —$SO_2$— containing cyclic group which may have a substituent for $R^{210}$ include the same group as the "—$SO_2$— containing monocyclic group" or "—$SO_2$— containing polycyclic group". Among them, the "—$SO_2$— containing polycyclic group" is preferable, and a group represented by general formula (a5-r-1) is further preferable.

In general formulae (ca-4) and (ca-5), $Y^{201}$s each independently represent an arylene group, an alkylene group, and an alkenylene group.

Examples of the arylene group for $Y^{201}$ include a group obtained by removing one hydrogen atom from the aryl group exemplified as an aromatic hydrocarbon group for $R^{101}$ in general formula (b-1).

Examples of the alkylene group and the alkenylene group for $Y^{201}$ include a group obtained by removing one hydrogen atom from a group exemplified as a chain alkyl group and a chain alkenyl group for $R^{101}$ in general formula (b-1).

In general formulae (ca-4) and (ca-5), x is 1 or 2.

$W^{201}$ is (x+1) valent, that is, a divalent or trivalent linking group.

The divalent linking group for $W^{201}$ is preferably a divalent hydrocarbon group which may have a substituent, and a divalent hydrocarbon group which may have a substituent, which is the same as that for $Ya^{21}$ in general formula (a2-1). The divalent linking group for $W^{201}$ may be linear, branched, or cyclic, and is preferably cyclic. Among them, a group in which two carbonyl groups are bonded at both ends of the arylene group is preferable. Examples of the arylene group include a phenylene group and a naphthylene group, and the phenylene group is particularly preferable.

Examples of the trivalent linking group for $W^{201}$ include a group obtained by removing one hydrogen atom from the divalent linking group for $W^{201}$ and a group to which the divalent linking group is further bonded to the divalent linking group. The trivalent linking group for $W^{201}$ is preferably a group in which two carbonyl groups are bonded to the arylene group.

Preferred examples of the cation represented by general formula (ca-1) include cations represented by general formulae (ca-1-1) to (ca-1-67).

(ca-1-1)

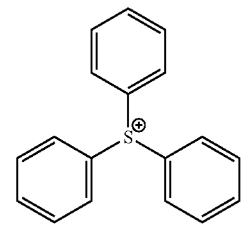

(ca-1-2)

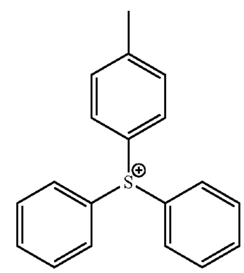

(ca-1-3)

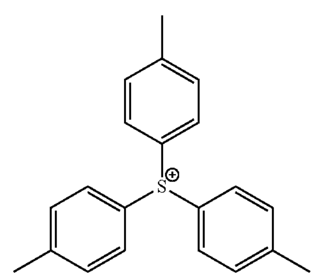

(ca-1-4)

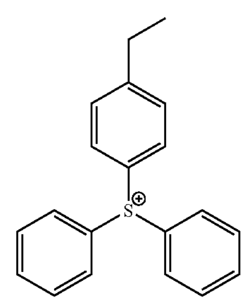

(ca-1-5)

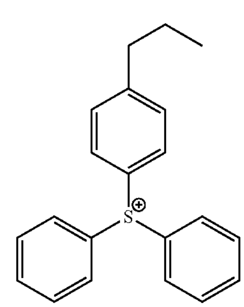

-continued
(ca-1-6)
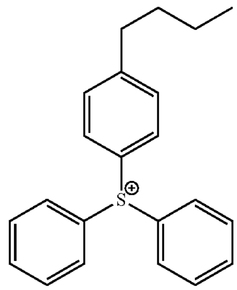
(ca-1-7)
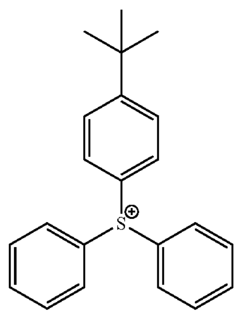
(ca-1-8)
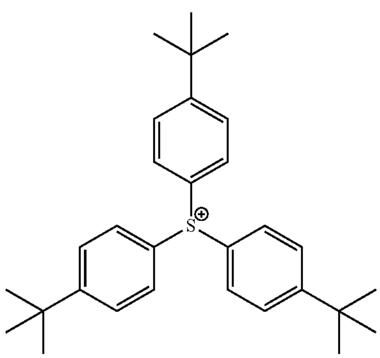
(ca-1-9)
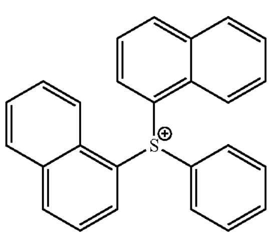
(ca-1-10)
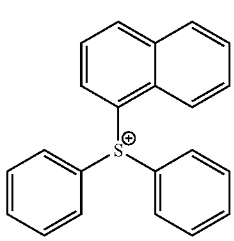
-continued
(ca-1-11)
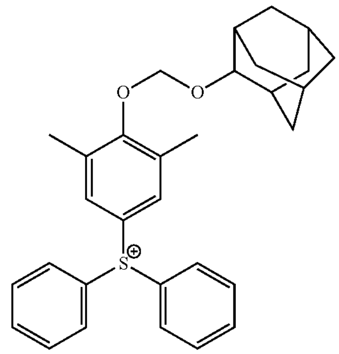
(ca-1-12)
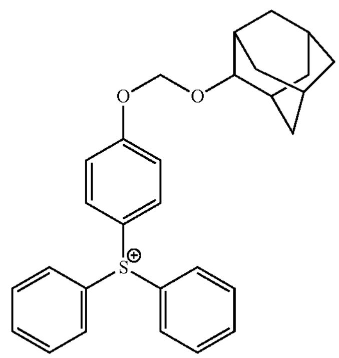
(ca-1-13)
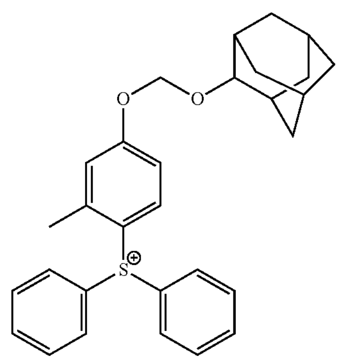
(ca-1-14)
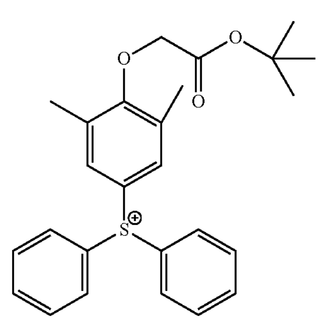

-continued
(ca-1-15)
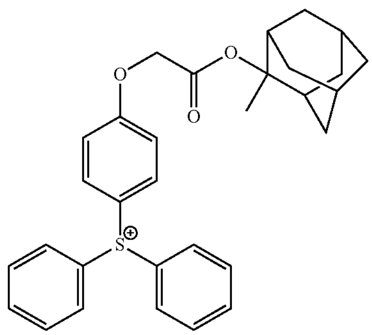
(ca-1-16)
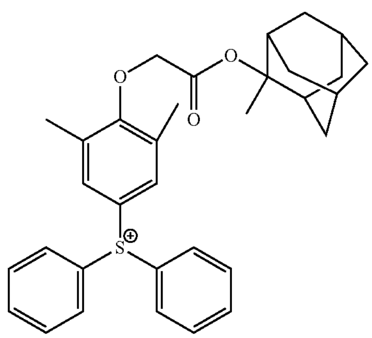
(ca-1-17)
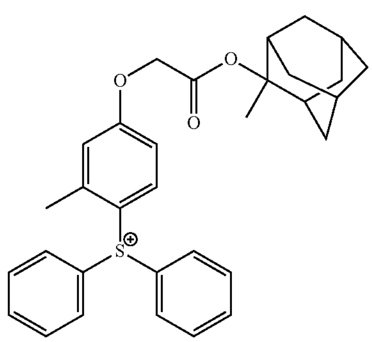
(ca-1-18)
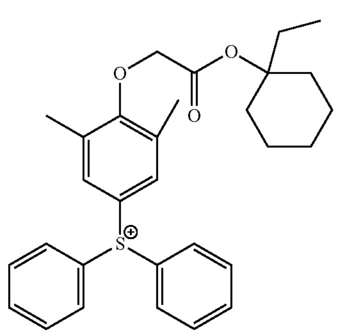
-continued
(ca-1-19)
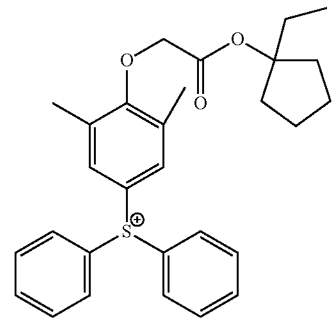
(ca-1-20)
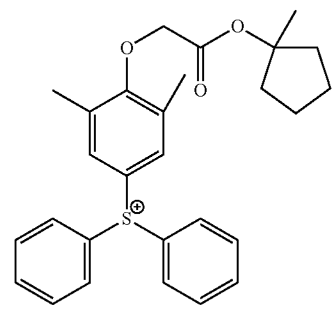
(ca-1-21)
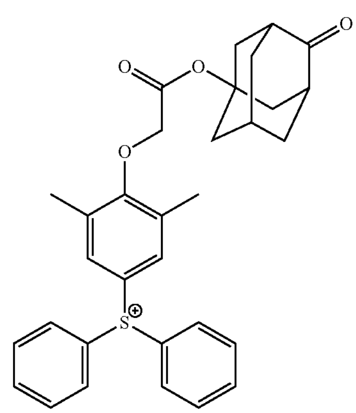
(ca-1-22)
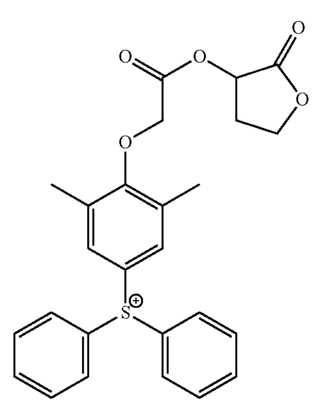

-continued
(ca-1-23)
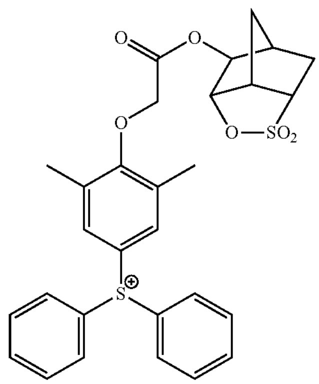
(ca-1-24)
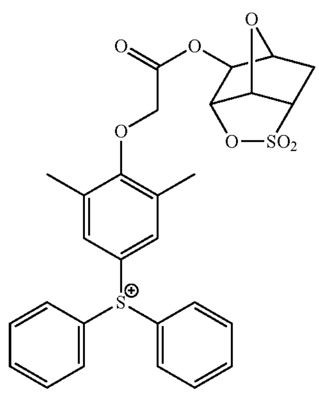
(ca-1-25)
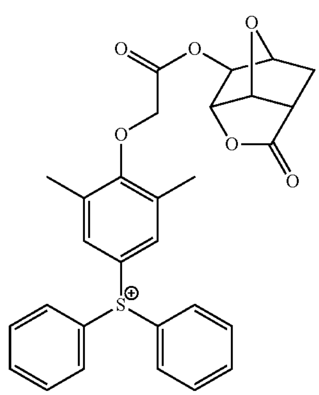
(ca-1-26)
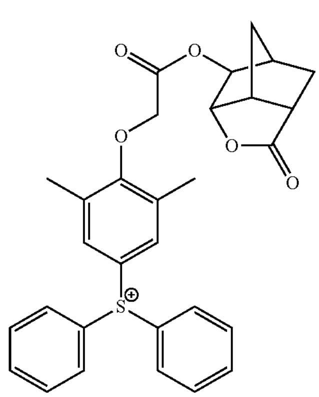
-continued
(ca-1-27)
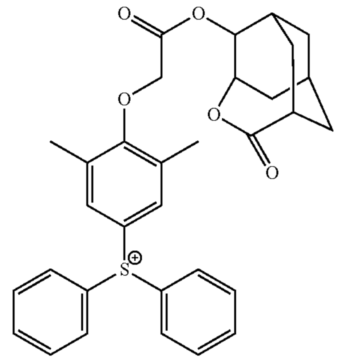
(ca-1-28)
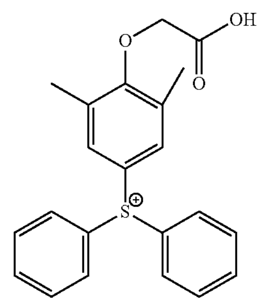
(ca-1-29)
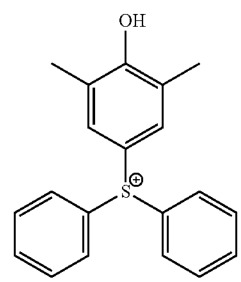
(ca-1-30)
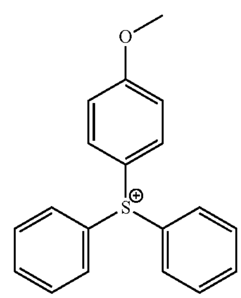
(ca-1-31)
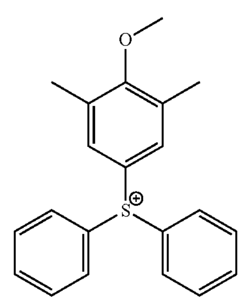

-continued
(ca-1-32)
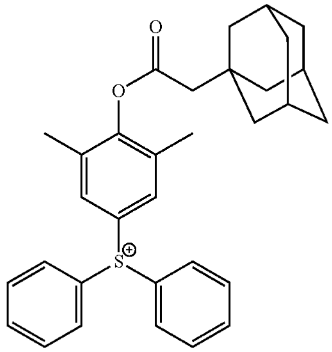
(ca-1-33)
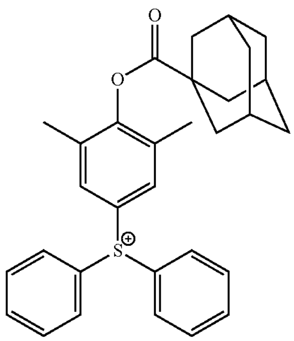
(ca-1-34)
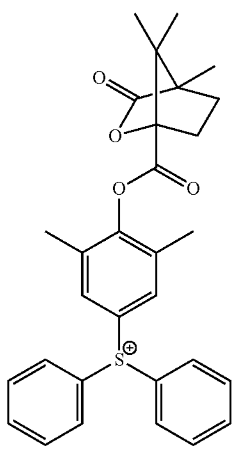
(ca-1-35)
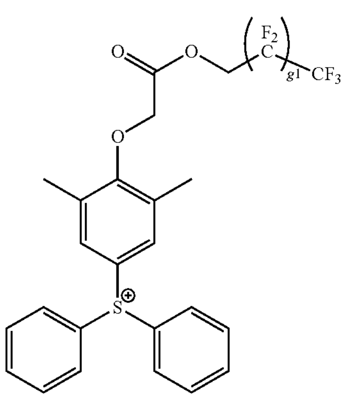
-continued
(ca-1-36)
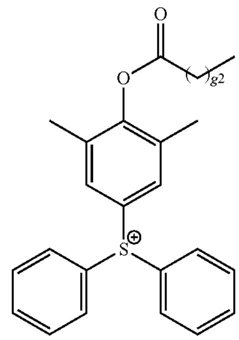
(ca-1-37)
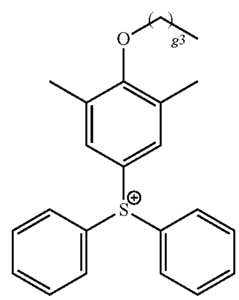
(ca-1-38)
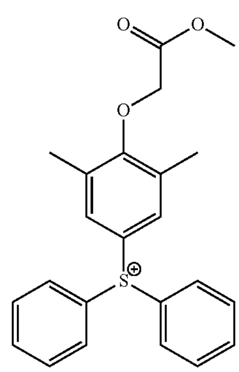
(ca-1-39)
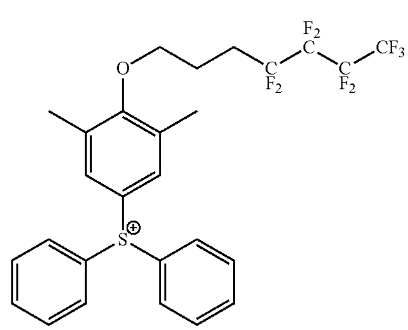

-continued
(ca-1-40)
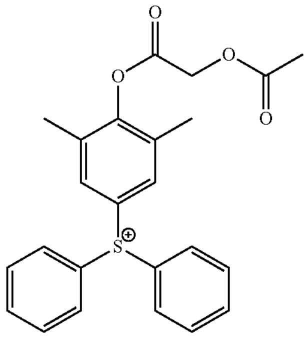
(ca-1-41)
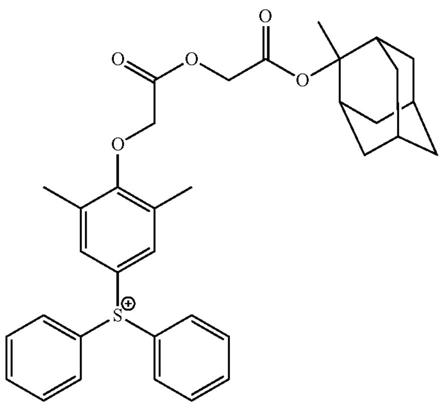
(ca-1-42)
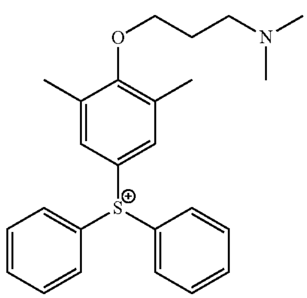
(ca-1-43)
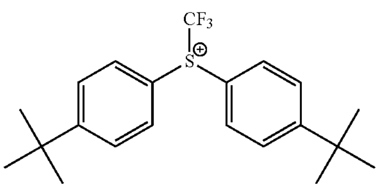
(ca-1-44)
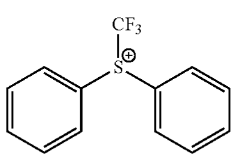
(ca-1-45)
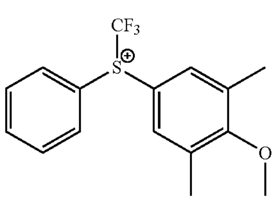
-continued
(ca-1-46)
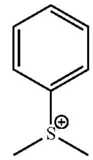
(ca-1-47)
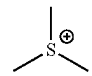
(ca-1-48)
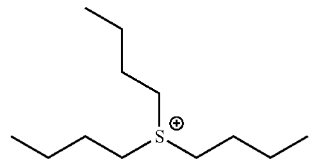
(ca-1-49)
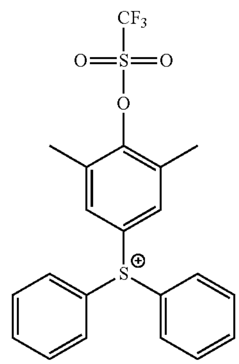
(ca-1-50)
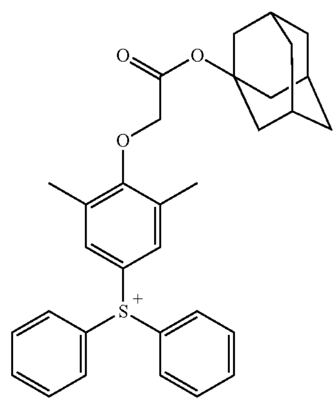
(ca-1-51)
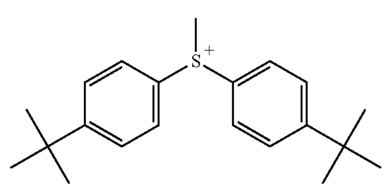
In the formulae, g1, g2, and g3 represent repeated numbers; g1 is an integer of 1 to 5, g2 is an integer of 0 to 20, and g3 is an integer of 0 to 20.

(ca-1-52)
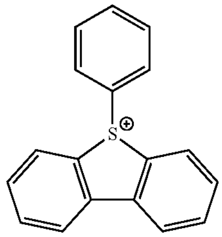
(ca-1-53)
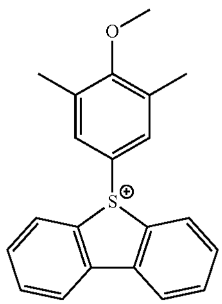
(ca-1-54)
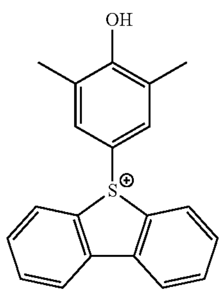
(ca-1-55)
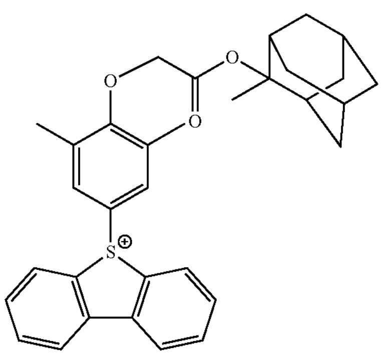
(ca-1-56)
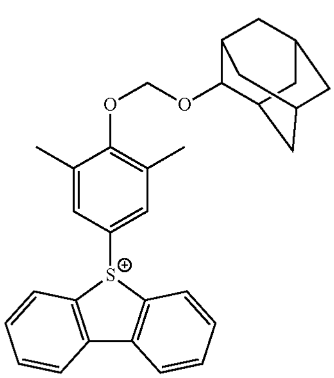
-continued
(ca-1-57)
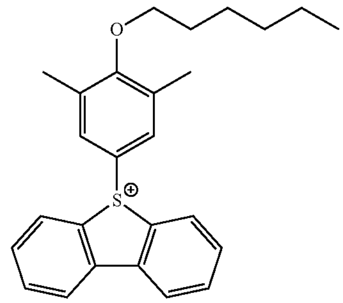
(ca-1-58)
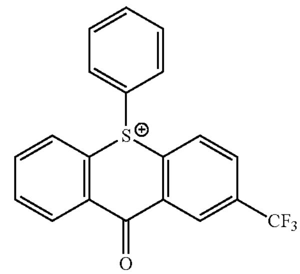
(ca-1-59)
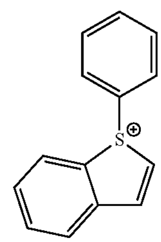
(ca-1-60)
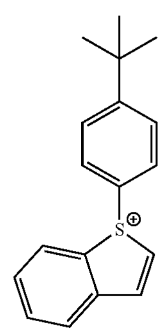
(ca-1-61)
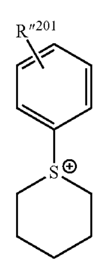

-continued (ca-1-62)

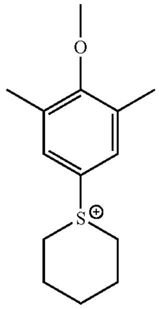

(ca-1-63)

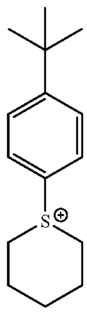

(ca-1-64)

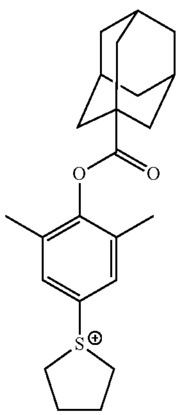

(ca-1-65)

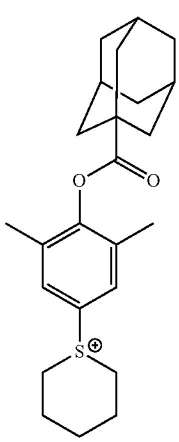

-continued (ca-1-66)

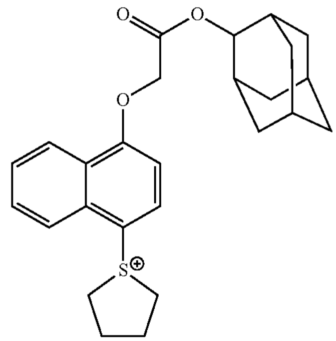

(ca-1-67)

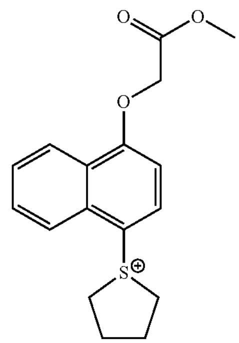

In the formula, $R''^{201}$ is a hydrogen atom or a substituent, and the substituent is the same as a substituent that $R^{201}$ to $R^{207}$ and $R^{210}$ to $R^{212}$ may have.

Specifically, preferred examples of the cation represented by general formula (ca-2) include diphenyl iodonium cation and bis (4-tert-butylphenyl) iodonium cation.

Specifically, preferred examples of the cation represented by general formula (ca-3) include cations represented by general formulae (ca-3-1) to (ca-3-6).

(ca-3-1)

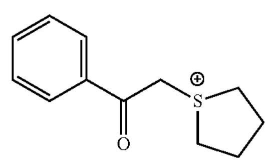

(ca-3-2)

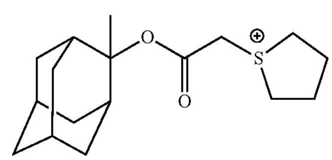

(ca-3-3)

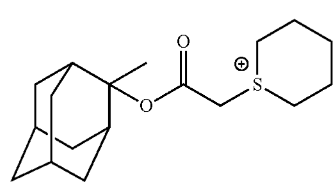

-continued
(ca-3-4)
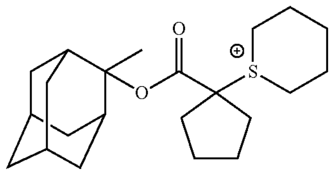
(ca-3-5)
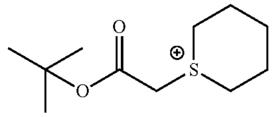
(ca-3-6)
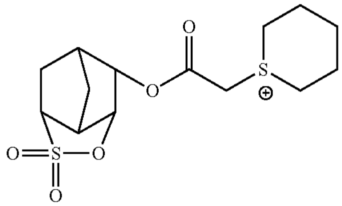
Specifically, preferred examples of the cation represented by general formula (ca-4) include cations represented by general formulae (ca-4-1) and (ca-4-2).
(ca-4-1)
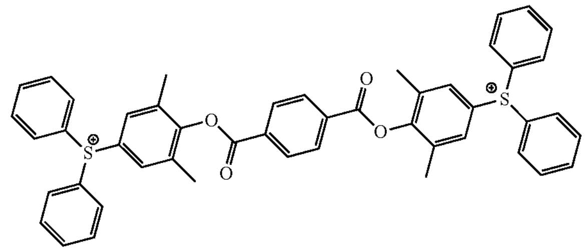
(ca-4-2)
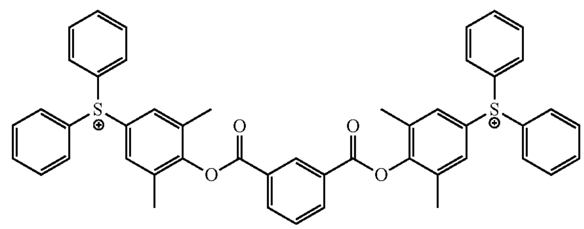
In addition, preferred examples of the cation represented by general formula (ca-5) also include cations represented by general formulae (ca-5-1) to (ca-5-3).
(ca-5-1)
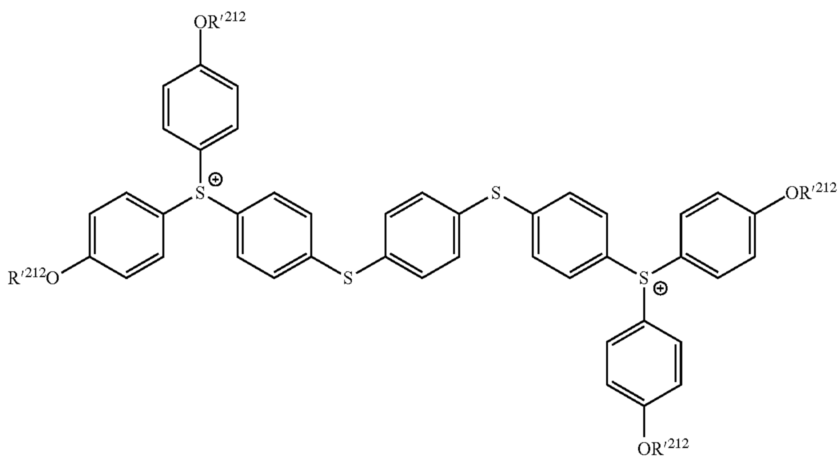
(ca-5-2)
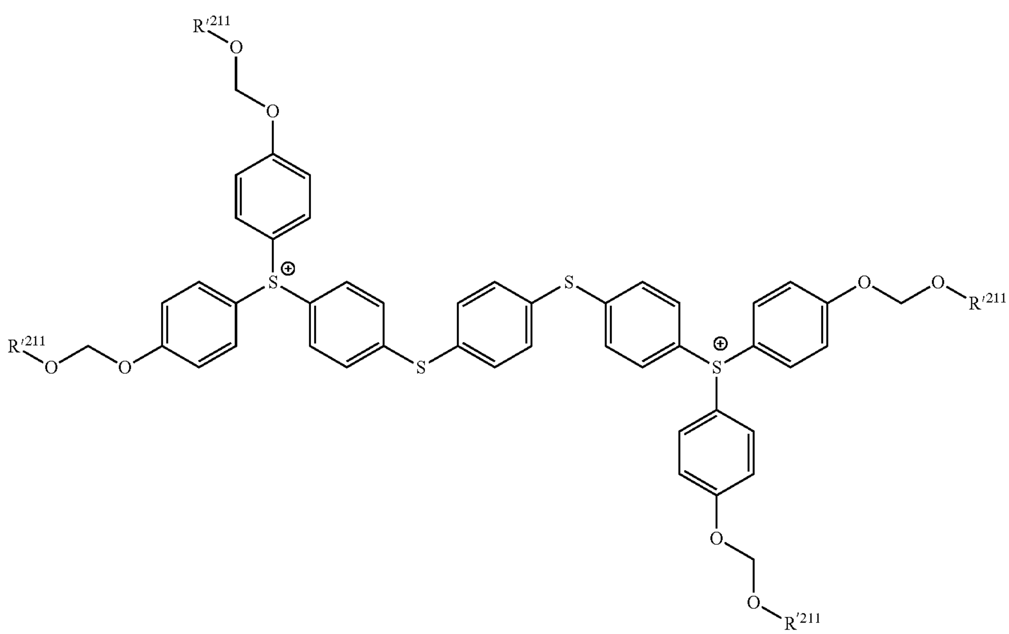

-continued (ca-5-3)

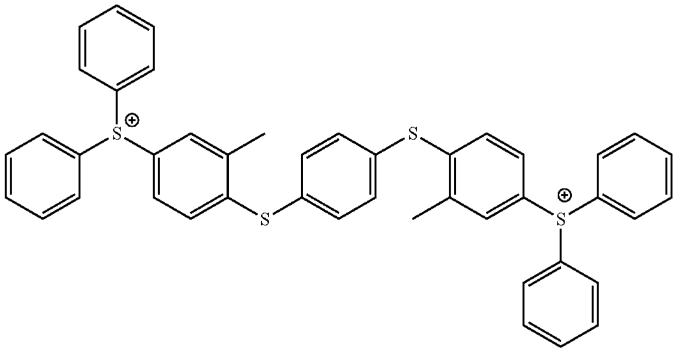

Among them, the cation part $[(M'^{m+})_{1/m}]$ is preferably a cation represented by general formula (ca-1), and is a cation represented by general formulae (ca-1-1) to (ca-1-67).

As the (B) component, the acid generator may be used alone, or two or more kinds thereof may be used in combination.

In the case where the resist composition contains the (B) component, the content of the (B) component is preferably 0.5 to 60 parts by mass, is further preferably 1 to 50 parts by mass, and is still further preferably 1 to 40 parts by mass with respect to 100 parts by mass of the (A) component.

When the content of the (B) component is set in the range, it is sufficient to form a pattern. In addition, when the respective components of the resist composition are dissolved in an organic solvent, it is easy to obtain a homogeneous solution, and the storage stability of the component as a resist composition is improved, and thus the content is preferably in the range.

Acid Diffusion Control Agent Component (D)

The resist composition of the present embodiment may contain an acid diffusion control agent component (hereinafter, referred to as "(D) component") in addition to the (A) component, or the (A) component and the (B) component. The (D) component functions as a quencher (acid diffusion control agent) that traps an acid generated upon exposure on the resist composition.

Examples of the (D) component include a photodegradable base (D1) (hereinafter, referred to as "(D1) component") which is decomposed upon exposure to lose acid diffusion controllability, and a nitrogen-containing organic compound (D2) (hereinafter, referred to as "(D2) component") which does not correspond to the (D1) component.

(D1) Component

With the resist composition containing the (D1) component, it is possible to further improve the contrast between the exposed area and the unexposed area of the resist film at the time of forming the resist pattern.

The (D1) component is not particularly limited as long as the component which is decomposed upon exposure to lose acid diffusion controllability, and preferred examples thereof include one or more compounds selected from the group consisting of a compound (hereinafter, referred to as "(d1-1) component") represented by general formula (d1-1), a compound (hereinafter, referred to as "(d1-2) component") represented by general formula (d1-2), and a compound (hereinafter, referred to as "(d1-3) component") represented by general formula (d1-3).

Since the (d1-1) to (d1-3) components are decomposed in the exposed area of the resist film, the acid diffusion controllability (basicity) is lost. For this reason, the (d1-1) to (d1-3) components do not act as a quencher in the exposed area, but act as a quencher in the unexposed area.

(d1-1)

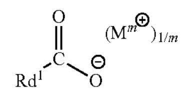

(d1-2)

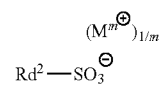

(d1-3)

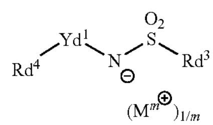

In the formulae, $Rd^1$ to $Rd^4$ are a cyclic group which may have a substituent, a chain alkyl group which may have a substituent, or a chain alkenyl group which may have a substituent. Here, it is assumed that a fluorine atom is not bonded to the carbon atom adjacent to S atom in $Rd^2$ in general formula (d1-2). $Yd^1$ is a single bond or a divalent linking group. m is an integer of equal to or greater than 1, and $M^{m+}$'s each independently represent an m-valent organic cation.

(d1-1) Component

Anion Part

In the formula (d1-1), $Rd^1$ is a cyclic group which may have a substituent, a chain alkyl group which may have a substituent, or a chain alkenyl group which may have a substituent, and examples thereof include the same group as that of $R^{101}$ in general formula (b-1).

Among them, as $Rd^1$, an aromatic hydrocarbon group which may have a substituent, an aliphatic cyclic group which may have a substituent, and a chain alkyl group which may have a substituent are preferable. Examples of the substituent that the groups may have include a hydroxyl group, an oxy group, an alkyl group, an aryl group, a fluorine atom, a fluorinated alkyl group, and lactone-containing cyclic groups respectively represented by general formulae (a2-r-1) to (a2-r-7), an ether bond, an ester bond, or a combination thereof. In the case where the ether bond and the ester bond are used as a substituent, the alkylene group may be used as being interposed therebetween. In this case, as a substituent, linking groups respectively represented by general formulae (y-al-1) to (y-al-5) are preferable.

As the aromatic hydrocarbon group, a phenyl group or a naphthyl group is further preferable.

As the aliphatic cyclic group, a group obtained by removing one or more hydrogen atoms from polycycloalkane such as adamantane, norbornane, isobornane, tricyclodecane, and tetracyclododecane is preferable.

The number of carbon atoms in a chain alkyl group is preferably 1 to 10, and specific examples include a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In the case where the chain alkyl group is a fluorinated alkyl group having a fluorine atom or a fluorinated alkyl group as a substituent, the number of carbon atoms in the fluorinated alkyl group is preferably 1 to 11, is further preferably 1 to 8, and is still further preferably 1 to 4. The fluorinated alkyl group may contain other atoms in addition to the fluorine atom. Examples of other atoms in addition to the fluorine atom include an oxygen atom, a sulfur atom, and a nitrogen atom.

$Rd^1$ is preferably a fluorinated alkyl group in which at least one hydrogen atom forming a linear alkyl group is substituted with a fluorine atom, and is particularly preferably a fluorinated alkyl group (a linear perfluoroalkyl group) in which all of the hydrogen atoms forming a linear alkyl group are substituted with a fluorine atom.

Hereinafter, preferred examples of the anion part of the (d1-1) component will be described.

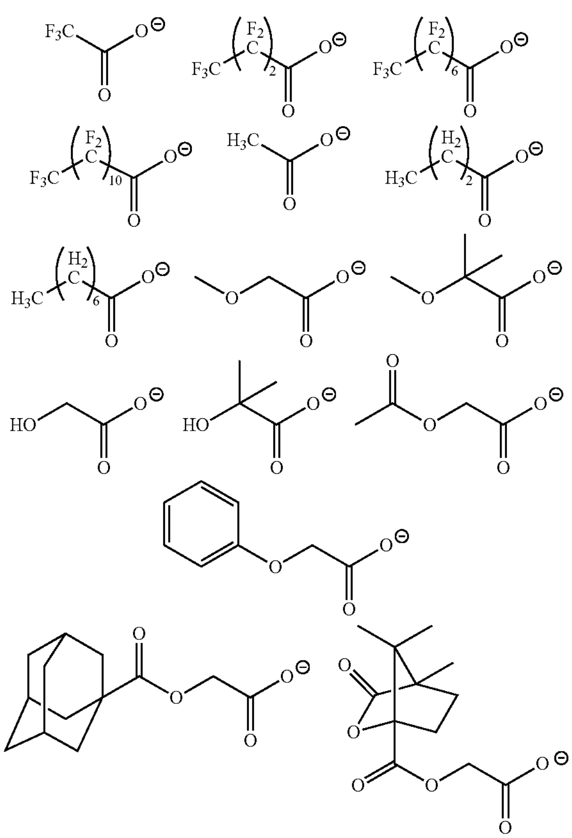

-continued

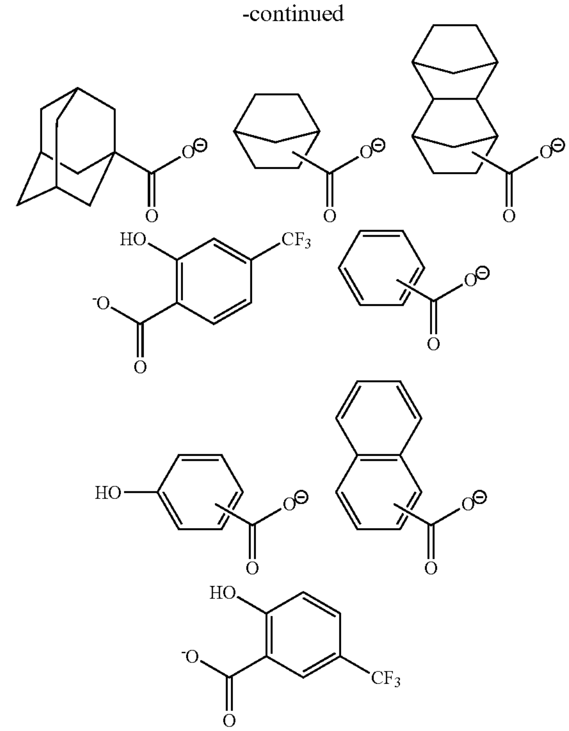

Cation Part

In general formula (d1-1), $M^{m+}$ is an m-valent organic cation.

As the organic cation of $M^{m+}$, the same cations as those respectively represented by general formulae (ca-1) to (ca-5) are preferable, the cation represented by general formula (ca-1) is further preferable, and the cations respectively represented by general formulae (ca-1-1) to (ca-1-67) are still further preferable.

The (d1-1) component may be used alone, or two or more kinds thereof may be used in combination.

(d1-2) Component

Anion Part

In general formula (d1-2), $Rd^2$ is a cyclic group which may have a substituent, a chain alkyl group which may have a substituent, or a chain alkenyl group which may have a substituent, and examples thereof include the same groups as those of $R^{101}$ in general formula (b-1).

Here, it is assumed that a fluorine atom is not bonded to the carbon atom adjacent to S atom in $Rd^2$ (the carbon atom is not fluorine-substituted). With this, the anion of the (d1-2) component becomes an appropriately weak acid anion, and thus the quenching ability of the (D) component is improved.

The $Rd^2$ is preferably a chain alkyl group which may have a substituent, or an aliphatic cyclic group which may have a substituent. The number of carbon atoms in the chain alkyl group is preferably 1 to 10, and is further preferably 3 to 10. As the aliphatic cyclic group, a group (which may have a substituent) obtained by removing one or more hydrogen atoms from adamantane, norbornane, isobornane, tricyclodecane, and tetracyclododecane is preferable, and a group obtained by removing one or more hydrogen atoms from the camphor is further preferable.

The hydrocarbon group for $Rd^2$ may have a substituent, and examples of the substituent include a substituent which is the same as the substituent which may be contained in the hydrocarbon group (an aromatic hydrocarbon group, an aliphatic cyclic group, a chain alkyl group) for $Rd^1$ of general formula (d1-1).

Specific preferred examples of the anion part having the (d1-2) component will be described as follows.

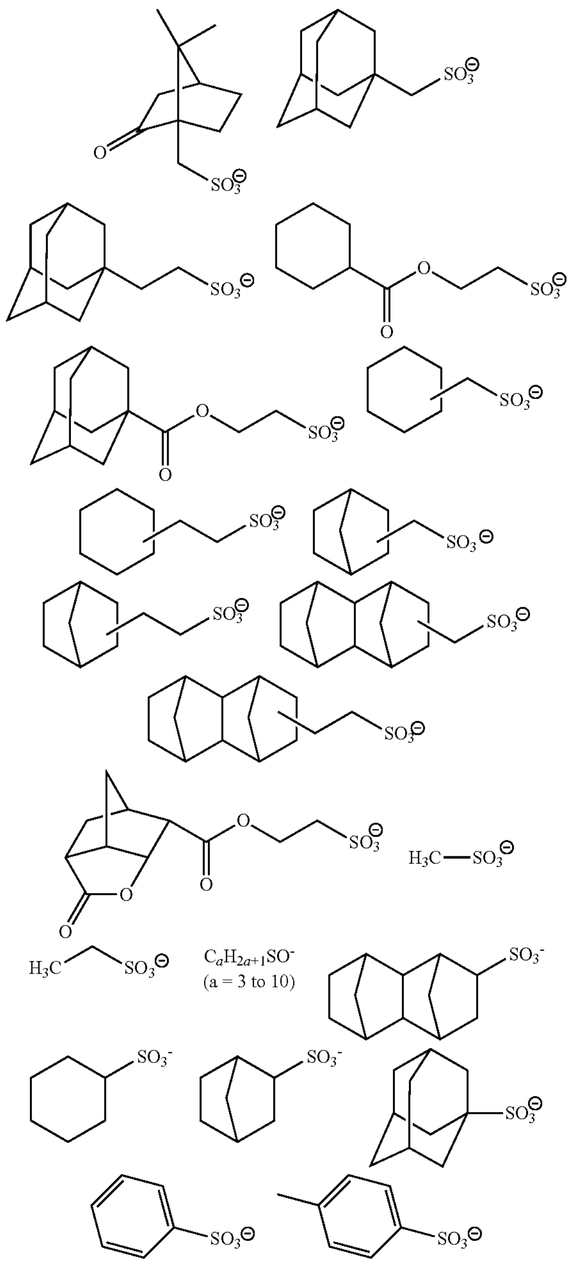

Cation Part

In general formula (d1-2), $M^{m+}$ is an m-valent organic cation, and is the same as $M^{m+}$ in general formula (d1-1).

The (d1-2) component may be used alone, or two or more kinds thereof may be used in combination.

(d1-3) Component

Anion Part

In general formula (d1-3), $Rd^3$ is a cyclic group which may have a substituent, a chain alkyl group which may have a substituent, or a chain alkenyl group which may have a substituent, and examples thereof include the same group as that of $R^{101}$ in general formula (b-1), and a cyclic group containing a fluorine atom, a chain alkyl group, or a chain alkenyl group is preferable. Among them, the fluorinated alkyl group is preferable, and the same group as the fluorinated alkyl group of $Rd^1$ is further preferable.

In the formula (d1-3), $Rd^4$ is a cyclic group which may have a substituent, a chain alkyl group which may have a substituent, or a chain alkenyl group which may have a substituent, and examples thereof include the same group as that of $R^{101}$ in general formula (b-1).

Among them, the alkyl group which may have a substituent, the alkoxy group, the alkenyl group, and the cyclic group are preferable.

The alkyl group for $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. At least one hydrogen atom in an alkyl group for $Rd^4$ may be substituted with a hydroxyl group, a cyano group, and the like.

The alkoxy group for $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among them, the methoxy group and the ethoxy group are preferable.

Examples of the alkenyl group for $Rd^4$ include the same group as that of $R^{101}$ in general formula (b-1), and a vinyl group, a propenyl group (an allyl group), a 1-methyl propenyl group, and a 2-methyl propenyl group are preferable. These groups may further have an alkyl group having 1 to 5 carbon atoms or a halogenated alkyl group having 1 to 5 carbon atoms as a substituent.

Examples of the cyclic group for $Rd^4$ include the same group as that of $R^{101}$ in general formula (b-1), and an alicyclic group which is obtained by removing one or more hydrogen atoms from cycloalkane such as cyclopentane, cyclohexane, adamantane, norbornane, isobornane, tricyclodecane, and tetracyclododecane, or an aromatic group such as a phenyl group and a naphthyl group is preferable. In the case where $Rd^4$ is an alicyclic group, the resist composition is dissolved well in an organic solvent, and thus the lithography properties become excellent. Further, in the case where $Rd^4$ is an aromatic group, in the lithography in which EUV or the like is set as an exposure light source, the resist composition is excellent in the light absorption efficiency, and thus the sensitivity and the lithography properties become excellent.

In the formula (d1-3), $Yd^1$ is a single bond or a divalent linking group.

The divalent linking group for $Yd^1$ is not particularly limited, and examples thereof include a divalent hydrocarbon group which may have a substituent (an aliphatic hydrocarbon group and an aromatic hydrocarbon group), and a divalent linking group containing a heteroatom. The examples are the same as the divalent hydrocarbon group which may have a substituent, and the divalent linking group containing a heteroatom, which are exemplified in the description of the divalent linking group for $Ya^{21}$ in general formula (a2-1).

The $Yd^1$ is preferably a carbonyl group, an ester bond, an amide bond, an alkylene group, or a combination thereof. The alkylene group is preferably a linear or branched alkylene group, and is further preferably a methylene group or an ethylene group.

Specific preferred examples of the anion part of the (d1-3) component will be described as follows.
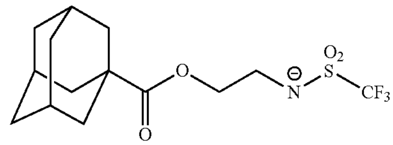
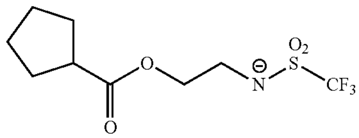
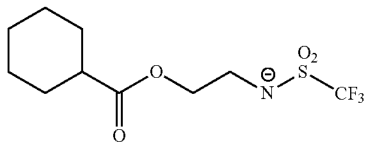
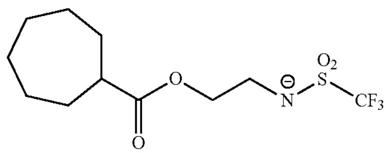
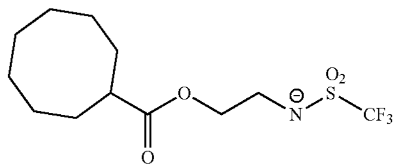
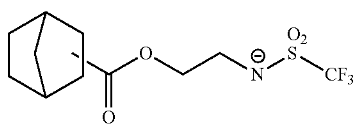
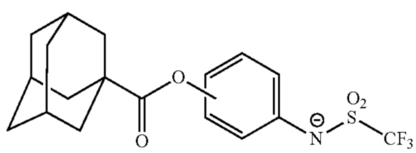
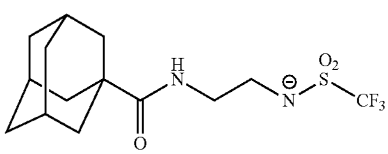
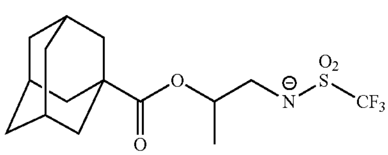
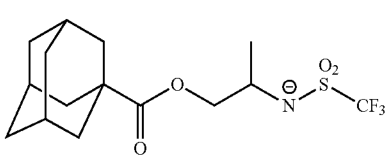
-continued
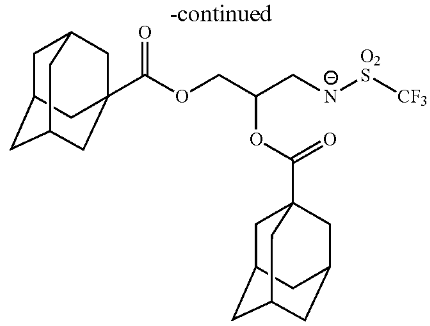
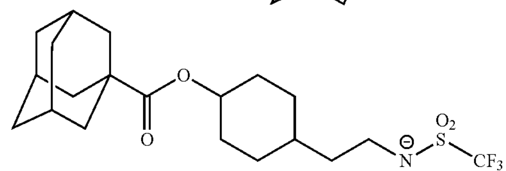
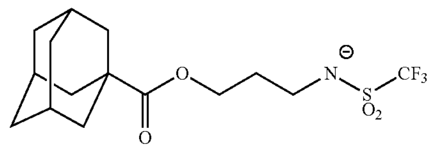
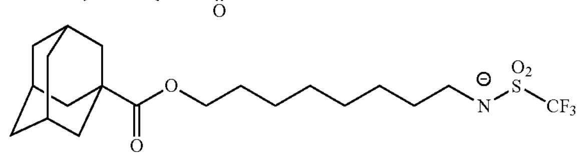
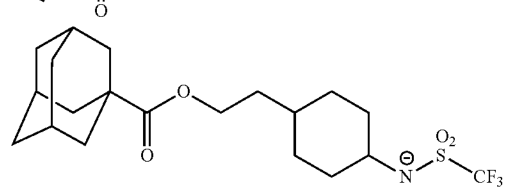
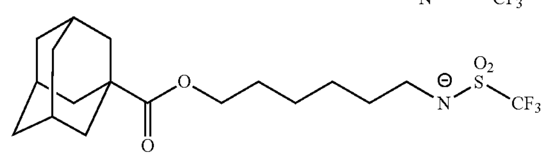
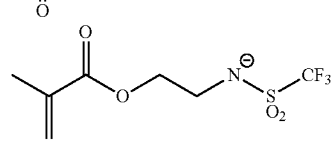
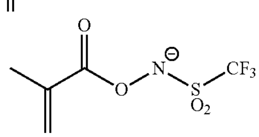
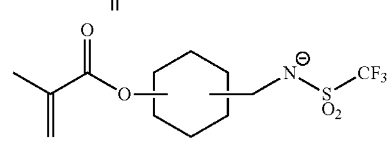
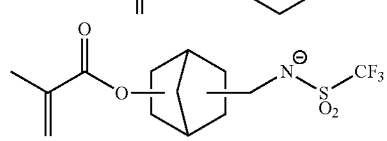
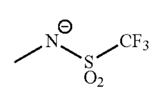
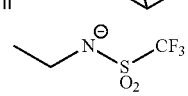
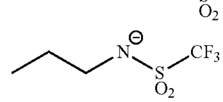
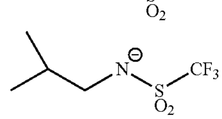
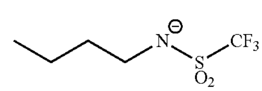

-continued

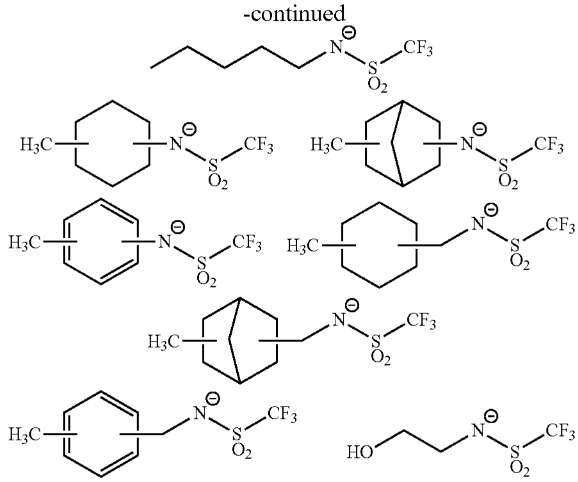

Cation Part

In the formula (d1-3), $M^{m+}$ is an m-valent organic cation, and is the same as $M^{m+}$ in general formula (d1-1).

The (d1-3) component may be used alone, or two or more kinds thereof may be used in combination.

The (D1) component may be obtained by using at least one of the (d1-1) to (d1-3) components, or using two or more kinds of components in combination.

In the case where the resist composition contains the (D1) component, the content of the (D1) component is preferably 0.5 to 10 parts by mass, is further preferably 0.5 to 8 parts by mass, and is still further preferably 1 to 8 parts by mass, with respect to 100 parts by mass of the (A) component.

When the content of the (D1) component is equal to or greater than the preferred lower limit, it is easy to obtain particularly preferable lithography properties and resist pattern shape. On the other hand, when the (D1) component is equal to or lower than the upper limit, it is possible to maintain the excellent sensitivity, and to obtain excellent throughput.

Method for Preparing (D1) Component:

The method for preparing the (d1-1) component and the (d1-2) component is not particularly limited, and these components can be prepared by using the conventional well-known methods.

In addition, the method for preparing the (d1-3) component is not particularly limited, and for example, the (d1-3) component is prepared in the same method as the method disclosed in US2012-0149916.

(D2) Component

As the acid diffusion control agent component, a nitrogen-containing organic compound component (hereinafter, referred to as "(D2) component") which does not correspond to the (D1) component is preferable.

The (D2) component is not particularly limited as long as it acts as the acid diffusion control agent, and does not correspond to the (D1) component, and may be optionally used from well-known components. Among them, aliphatic amine is preferable, and particularly, secondary aliphatic amine and tertiary aliphatic amine are further preferable.

The aliphatic amine is amine having one or more aliphatic groups, and the number of carbon atoms in the aliphatic group is preferably 1 to 12.

Examples of the aliphatic amine include amine (alkyl amine or alkyl alcohol amine) in which at least one hydrogen atom of ammonia $NH_3$ is substituted with an alkyl group having equal to or less than 12 carbon atoms, or a hydroxyalkyl group or cyclic amine.

Specific examples of the alkyl amine and the alkyl alcohol amine include monoalkyl amines such as n-hexyl amine, n-heptyl amine, n-octyl amine, n-nonyl amine, and n-decyl amine; dialkyl amines such as diethyl amine, di-n-propyl amine, di-n-heptylamine, di-n-octylamine, and dicyclohexyl amine; trialkyl amines such as trimethly amine, triethyl amine, tri-n-propyl amine, tri-n-butyl amine, tri-n-pentyl amine, tri-n-hexyl amine, tri-n-heptyl amine, tri-n-octyl amine, tri-n-nonyl amine, tri-n-decyl amine, and tri-n-dodecyl amine; and alkyl alcohol amines such as diethanol amine, triethanol amine, diisopropanol amine, triisopropanol amine, di-n-octanol amine, and tri-n-octanol amine. Among them, trialkyl amine having 5 to 10 carbon atoms is further preferable, and tri-n-pentyl amine or tri-n-octyl amine is particularly preferable.

Examples of the cyclic amine include a heterocyclic compound containing a nitrogen atom as a heteroatom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclocyclo[4.3.0]-5-nonen, 1,8-diazabicyclocyclo[5.4.0]-7-undecene, hexamethylenetetramine, and 1,4-diazabicyclo[2.2.2] octane.

Examples of other aliphatic amines include tris(2-methoxymethoxyethyl) amine, tris{2-(2-methoxyethoxy) ethyl} amine, tris{2-(2-methoxyethoxymethoxy) ethyl} amine, tris{2-(1-methoxyethoxy) ethyl} amine, tris{2-(1-ethoxyethoxy) ethyl} amine, tris{2-(1-ethoxypropoxy) ethyl} amine, tris[2-{2-(2-hydroxyethoxy) ethoxy} ethyl] amine, and triethanol amine triacetate. Among them, triethanol amine triacetate is preferable.

In addition, aromatic amine may be used as the (D2) component.

Examples of the aromatic amine include 4-dimethyl aminopyridine, pyrrole, indole, pyrazole, imidazole, and derivatives thereof, tribenzyl amine, 2,6-diisopropyl aniline, and N-tert-butoxycarbonyl pyrrolidine.

The (D2) component may be used alone, or two or more kinds thereof may be used in combination.

In the case where the resist composition contains the (D2) component, the content of the (D2) component is generally of 0.01 to 5 parts by mass with respect to 100 parts by mass of the (A) component. When the content is within the above range, the resist pattern shape, the post exposure stability, and the like are improved.

At least one compound (E) selected from the group consisting of organic carboxylic acid and oxo acid of phosphorus, and derivatives thereof.

In the resist composition of the present embodiment, in order to prevent the sensitivity from being deteriorated and to improve the resist pattern shape and the post exposure stability, at least one compound (E) (hereinafter, referred to as "(E) component") selected from the group consisting of an organic carboxylic acid and an oxo acid of phosphorus, and derivatives thereof can be contained as an optional component.

As the organic carboxylic acid, for example, an acetic acid, a malonic acid, a citric acid, a malic acid, a succinic acid, a benzoic acid, and a salicylic acid are preferable.

Examples of the oxo acid of phosphorus include a phosphoric acid, a phosphonic acid, and a phosphonic acid, and among them, a phosphonic acid is particularly preferable.

Examples of the derivative of the oxo acid of phosphorus include ester obtained by substituting the hydrogen atoms in the oxo acid with a hydrocarbon group, and examples of the hydrocarbon group include an alkyl group having 1 to 5 carbon atoms, and an aryl group having 6 to 15 carbon atoms.

Examples of the derivative of the phosphoric acid include phosphate ester such as phosphoric acid di-n-butyl ester and phosphoric acid diphenyl ester.

Examples of the derivative of the phosphonic acid include phosphonic acid ester such as phosphonic acid dimethyl ester, phosphonic acid-di-n-butyl ester, phenyl phosphonic acid, diphosphonic acid diphonyl ester, and phosphonic acid dibenzyl ester.

Examples of the derivative of the phosphinic acid include phosphinic acid ester and a phenyl phosphinic acid.

The (E) component may be used alone, or two or more kinds thereof may be used in combination.

In the case where the resist composition contains the (E) component, the content of the (E) component in the resist composition is generally of 0.01 to 5 parts by mass with respect to 100 parts by mass of the (A) component.

(F): Fluorine Additive Component

The resist composition of the present embodiment may contain a fluorine additive component (hereinafter, referred to as "(F) component") so as to impart water repellency to the resist film.

Examples of the (F) component include a fluorine-containing polymer compound which is disclosed in Japanese Unexamined Patent Application, Publication No. 2010-002870, disclosed in Japanese Unexamined Patent Application, Publication No. 2010-032994, disclosed in Japanese Unexamined Patent Application, Publication No. 2010-277043, disclosed in Japanese Unexamined Patent Application, Publication No. 2011-13569, disclosed in Japanese Unexamined Patent Application, Publication No. 2011-128226.

Specific examples of the (F) component include a polymer having a structural unit (f1) represented by general formula (f1-1). Preferred examples of the polymer include a polymer (homopolymer) consisting of a structural unit (f1) represented by general formula (f1-1); a copolymer of the structural unit (f1) and the structural unit (a1) containing an acid-decomposable group in which the polarity is increased under the action of the acid; and a copolymer of the structural unit (f1), a structural unit derived from an acrylic acid or a meth acrylic acid, and the structural unit (a1). Here, the structural unit (a1) which is copolymerized with the structural unit (f1) is preferably a structural unit derived from 1-ethyl-1-cyclooctyl (meth)acrylate.

(f1-1)

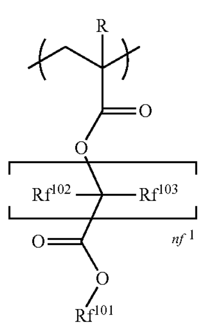

In the formula, R is the same as described above, $Rf^{102}$ and $Rf^{103}$ each independently represent a hydrogen atom, a halogen atom, an alkyl group having 1 to 5 carbon atoms, or a halogenated alkyl group having 1 to 5 carbon atoms, $Rf^{102}$ and $Rf^{103}$ may be the same as or different from each other. $nf^1$ is an integer of 1 to 5, $Rf^{101}$ is an organic group containing a fluorine atom.

In general formula (f1-1), R which is bonded to an α-position carbon atom is the same as described above. R is preferably a hydrogen atom or a methyl group.

In general formula (f1-1), examples of the halogen atom of $Rf^{102}$ and $Rf^{103}$ include a fluorine atom, a chlorine atom, a bromine atom, and an iodine atom, among them, the fluorine atom is particularly preferable. The alkyl group having 1 to 5 carbon atoms for $Rf^{102}$ and $Rf^{103}$ is the same as the alkyl group having 1 to 5 carbon atoms in R, and is preferably a methyl group or an ethyl group. Specific examples of the halogenated alkyl group having 1 to 5 carbon atoms for $Rf^{102}$ and $Rf^{103}$ include a group in which at least one hydrogen atom in an alkyl group having 1 to 5 carbon atoms is substituted with a halogen atom.

Examples of the halogen atom include a fluorine atom, a chlorine atom, a bromine atom, and an iodine atom, and the fluorine atom is particularly preferable. Among them, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is further preferable.

In general formula (f1-1), $nf^1$ is an integer of 1 to 5, is preferably an integer of 1 to 3, and is further preferably an integer of 1 or 2.

In general formula (f1-1), $Rf^{101}$ is an organic group containing a fluorine atom, and is preferably a hydrocarbon group containing a fluorine atom.

The hydrocarbon group containing a fluorine atom may be a linear, branched, or cyclic hydrocarbon group, and the number of carbon atoms in the hydrocarbon group is preferably 1 to 20, is further preferably 1 to 15, and particularly preferably 1 to 10.

Further, in the hydrocarbon group containing a fluorine atom, 25% or more of hydrogen atom in the hydrocarbon group is preferably fluorinated, 50% or more of hydrogen atom is further preferably fluorinated, and 60% or more of hydrogen atom is particularly preferably fluorinated since the hydrophobicity of the resist film at the time of immersion exposure is enhanced.

Among them, as $Rf^{101}$, a fluorinated hydrocarbon group having 1 to 6 carbon atoms is preferable, and a trifluoromethyl group, $—CH_2—CF_3$, $—CH_2—CF_2—CF_3$, $—CH(CF_3)_2$, $—CH_2—CH_2—CF_3$, and $—CH_2—CH_2—CF_2—CF_2—CF_2—CF_3$ are particularly preferable.

The mass average molecular weight (Mw) (in terms of the standard polystyrene by gel permeation chromatography) of the (F) component is preferably of 1,000 to 50,000, is further preferably of 5,000 to 40,000, and is most preferably of 10,000 to 30,000. When the mass average molecular weight is equal to or less than the upper limit of the range, the solubility in a resist solvent is sufficient in the case where the (F) component is used as a resist, and when the mass average molecular weight of the (F) component is equal to or greater than the lower limit of the range, dry etching resistance and a resist pattern cross-sectional shape are improved.

The dispersivity (Mw/Mn) of the (F) component is preferably 1.0 to 5.0, is further preferably 1.0 to 3.0, and is most preferably 1.2 to 2.5.

The (F) component may be used alone, or two or more kinds thereof may be used in combination.

In the case where the resist composition contains the (F) component, the content of the (F) component is generally of 0.5 to 10 parts by mass with respect to 100 parts by mass of the (A) component.

It is possible to contain miscible additives to the resist composition of the present embodiment as necessary, for example, in order to improve the performance of the resist film, an additional resin, a dissolution inhibitor, a plasticizer, a stabilizer, a colorant, a halation inhibitor, and a dye can be added and contained.

Organic Solvent Component (S)

The resist composition of the present embodiment can be prepared by dissolving a resist material into an organic solvent component (hereinafter, referred to as "(S) component").

The (S) component may be a component which can form a homogeneous solution by dissolving the respective components to be used, and any one of well-known conventional solvents of the chemically amplified resist composition is properly selected so as to be used as the (S) component.

Examples of the (S) component include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; a compound having an ester bond such as ethylene glycol monoacetate, diethylene glycol monoacetate, propylene glycol monoacetate, or dipropylene glycolmonoacetate, derivatives of polyhydric alcohols such as a monoalkyl ether (e.g., monomethyl ether, monoethyl ether, monopropyl ether, and monobutyl ether) or a monophenyl ether of the polyhydric alcohols or the compounds having an ester bond [among them, propylene glycol monomethyl ether acetate (PGMEA), and propylene glycol monomethyl ether (PGME), are preferable]; cyclic ethers such as dioxane, esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene; and dimethyl sulfoxide (DMSO).

The (S) component may be used alone or may be used as a mixed solvent of two or more kinds thereof.

Among them, PGMEA, PGME, γ-butyrolactone, EL, and cyclohexanone are preferable.

In addition, a mixed solvent obtained by mixing PGMEA and a polar solvent is also preferable. The mixing ratio (mass ratio) may be properly determined in consideration of the compatibility of the PGMEA with the polar solvent, and the ratio is preferably 1:9 to 9:1, and is further preferably 2:8 to 8:2.

More specifically, in the case of mixing EL or cyclohexane as the polar solvent, the mass ratio of PGMEA to EL or cyclohexane is preferably 1:9 to 9:1, and is further preferably 2:8 to 8:2. In addition, in the case of mixing PGME as a polar solvent, the mass ratio of PGMEA to PGME is preferably 1:9 to 9:1, is further preferably 2:8 to 8:2, and still further preferably 3:7 to 7:3. In addition, a mixed solvent obtained by mixing PGMEA, PGME, and cyclohexane is also preferable.

Further, as the (S) component, a mixed solvent obtained by mixing at least one selected from PGMEA and EL with γ-butyrolactone is also preferable. In this case, as the mixing ratio, the mass ratio of the former to the latter is preferably set to be of 70:30 to 95:5.

The content of the (S) component used is not particularly limited, and is properly set in accordance with the coated film thickness at a concentration that can be applied to a substrate or the like. Generally, the (S) component is used such that the solid content concentration of the resist composition is of 1% to 20% by mass, and is preferably 2% to 15% by mass.

According to the resist composition of the present embodiment, in the forming of the resist pattern, it is possible to obtain an effect of forming a resist pattern having excellent shape and improving the limit resolution.

In the forming of the resist pattern, a polymer compound having a structural unit containing a hydroxystyrene skeleton and a structural unit containing an acid-decomposable group which is decomposed by the action of the acid so as to increase the polarity is useful particularly in the case of exposing a resist film to EUV or EB.

In the resist composition of the present embodiment, a polymer compound (A1) which has a structural unit (a01) containing a hydroxystyrene skeleton and a structural unit (a02) containing a specific acid-decomposable group, and in which the content of a structural unit (a03) derived from a (α-substituted) acrylic acid or a derivative thereof is controlled to a certain amount (greater than 0 mol % and equal to or less than 10 mol %) is employed as a base material component. For this reason, in the resist composition of the present embodiment, the lithography properties are improved and the above effect can be obtained.

Method for Forming Resist Pattern

A method for forming a resist pattern according to the present embodiment of the present invention includes a step of forming a resist film on a support by using the resist composition according to the present embodiment, a step of exposing the resist film, and a step of developing the exposed resist film to form a resist pattern.

The method for forming a resist pattern of the present embodiment can be performed in the following manner.

First, the support is coated with the resist composition according to the present embodiment by using a spinner, and the coated film is subjected to a bake (Post Applied Bake (PAB)) treatment at a temperature of 80° C. to 150° C. for 40 to 120 seconds, preferably for 60 to 90 seconds, so as to form a resist film.

Then, the resist film is exposed via a mask (a mask pattern) on which a predetermined pattern is formed, or is selectively exposed without the mask pattern by lithography or the like due to direct irradiation of an electron beam by using an exposure apparatus such as an electron beam drawing apparatus, and an EUV exposure apparatus, and then is subjected to a bake (Post Exposure Bake (PEB)) treatment at a temperature of 80° C. to 150° C. for 40 to 120 seconds (preferably for 60 to 90 seconds).

Subsequently, the resist film is subjected to the developing treatment. In the developing treatment, an alkali developing solution is used in the case of the alkali developing process, and a developing solution (organic developing solution) containing an organic solvent is used in the case of the solvent developing process.

After the developing treatment, a rinse treatment is preferably performed. In the rinse treatment, water rinsing is preferably performed by using pure water in the case of the alkali developing process, and a rinsing liquid containing an organic solvent is preferably used in the case of the solvent developing process.

In the case of the solvent developing process, a treatment of removing the developing solution or the rinsing liquid which is adhered to the pattern by a supercritical fluid may be performed after the developing treatment and the rinse treatment.

Drying is performed after the developing treatment and the rinse treatment. In addition, in some cases, a bake (post bake) treatment may be performed after the developing treatment.

In this way, it is possible to form a resist pattern.

The support is not particularly limited, and it is possible to use conventionally well-known supports. Examples thereof include a substrate for electronic parts and a substrate on which a prescribed wiring pattern is formed. More specifically, examples of the support include a metallic substrate such as a silicon wafer, copper, chromium, iron, and aluminum, and a glass substrate. As the wire pattern material, for example, it is possible to use copper, aluminum, nickel, and gold.

In addition, a support obtained by providing an inorganic and/or organic film on the substrate may be used as the support. Examples of the inorganic film include an inorganic antireflection film (inorganic BARC). Examples of the organic film include an organic antireflection film (organic BARC) or a lower layer organic film obtained by using a multilayer resist method.

Here, the multilayer resist method is a method for providing at least a single layer of organic film (lower layer organic film) and at least a single layer of resist film (upper layer resist film) on the substrate, and then performing the patterning of the lower layer organic film by setting the resist pattern formed on the upper layer resist film as a mask. With such a method, it is possible to form a pattern with a high aspect ratio. That is, according to the multilayer resist method, since the required thickness can be secured by the lower layer organic film, the resist film can be thinned and a fine pattern with a high aspect ratio can be formed.

The multilayer resist method basically includes a method (two-layer resist method) of setting a two-layer structure of an upper layer resist film and a lower layer organic film, and a method (three-layer resist method) of setting a multilayer (three or more layers) structure of providing one or more intermediate layers (thin metal film and the like) between the upper layer resist film and the lower layer organic film.

The wavelength used in the exposure is not particularly limited, and examples thereof include radiations such as ArF excimer laser, KrF excimer laser, $F_2$ excimer laser, extreme ultraviolet rays (EUV), vacuum ultraviolet rays (VUV), electron beams (EB), X rays, and soft X rays. The resist composition is highly useful when being used for KrF excimer laser, ArF excimer laser, EB or EUV, is further useful when being used for ArF excimer laser, EB or EUV, and is particularly useful when being used for EB or EUV.

As a method for exposing a resist film, a typical exposure (dry exposure) performed in an inert gas such as air or nitrogen, or liquid immersion lithography may be employed.

The liquid immersion lithography is an exposing method performed in such a manner that a space between a resist film and a lens at the lowermost position of an exposure apparatus is filled with a solvent (liquid immersion medium) having a refractive index larger than the refractive index of air, and exposure (immersion exposure) is performed in that state.

The liquid immersion medium is preferably a solvent having a refractive index which is larger than the refractive index of air, and is smaller than the refractive index of the resist film to be exposed. The refractive index of the solvent is not particularly limited as long as it is within the range.

Examples of the solvent having a refractive index which is larger than the refractive index of air, and is smaller than the refractive index of the resist film include water, a fluorinated inert liquid, a silicon solvent, and a hydrocarbon solvent.

Specific examples of the fluorinated inert liquid include a liquid having a fluorine compound as a main component, such as $C_3HCl_2F_5$, $C_4F_9OCH_3$, $C_4F_9OC_2H_5$, and $C_5H_3F_7$, and the boiling point thereof is preferably 70° C. to 180° C., and is further preferably 80° C. to 160° C. When the fluorinated inert liquid has a boiling point within the range, after completion of the exposure, the medium used for the liquid immersion can be removed by a simple method.

The fluorinated inert liquid is particularly preferably a perfluoroalkyl compound in which all hydrogen atoms in an alkyl group are substituted with fluorine atoms. Specific examples of the perfluoroalkyl compound include a perfluoroalkyl ether compound and a perfluoroalkyl amine compound.

Further, specifically, examples of the perfluoroalkyl ether compound include perfluoro (2-butyl-tetrahydrofuran) (boiling point 102° C.), and examples of the perfluoroalkyl amine compound include perfluorotributylamine (boiling point of 174° C.)

As the liquid immersion medium, water is preferably used in terms of cost, safety, environmental problems, and versatility.

Examples of an alkali developing solution used for the developing treatment in the alkali developing process include 0.1% to 10% by mass of tetramethyl ammonium hydroxide (TMAH) aqueous solution.

The organic solvent containing organic developing solution used for the developing treatment in the solvent developing process may be a solvent in which the (A) component ((A) component before exposure) can be dissolved, and can be appropriately selected from well-known organic solvents. Specific examples thereof include a polar solvent such as a ketone-based solvent, an ester-based solvent, an alcohol-based solvent, a nitrile-based solvent, an amide-based solvent, and an ether-based solvent, and a hydrocarbon solvent.

The ketone-based solvent is an organic solvent containing C—C(═O)—C in the structure. The ester-based solvent is an organic solvent containing C—C(═O)—O—C in the structure. The alcohol-based solvent is an organic solvent containing an alcoholic hydroxyl group in the structure. The "alcoholic hydroxyl group" means a hydroxyl group which is bonded to a carbon atom of an aliphatic hydrocarbon group. The nitrile-based solvent is an organic solvent containing a nitrile group in the structure. The amide-based solvent is an organic solvent containing an amide group in the structure. The ether-based solvent is an organic solvent containing C—O—C in the structure.

In the organic solvent, an organic solvent which contains various kinds of functional groups characterizing each solvent in the structure is also present. In this case, it is assumed that the organic solvent corresponds to all of the organic solvents which contain the functional groups that the aforementioned organic solvent has. For example, diethylene glycol monomethyl ether corresponds to any one of the alcohol-based solvent and the ether-based solvent in the solvent kinds.

The hydrocarbon solvent consists of hydrocarbons which may be halogenated, and does not contain a substituent except for a halogen atom. Examples of the halogen atom include a fluorine atom, a chlorine atom, a bromine atom, and an iodine atom, and among them, the fluorine atom is preferable.

Among the above examples, the organic solvent containing an organic developing solution is preferably a polar solvent, and the ketone-based solvent, the ester-based solvent, and the nitrile-based solvent are preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and methyl amyl ketone (2-heptanone). Among them, the ketone-based solvent is preferably methyl amyl ketone (2-heptanone).

Examples of ester-based solvent include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycolmonomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among them, the ester-based solvent is preferably butyl acetate.

Examples of the nitrile-based solvent include acetonitrile, propionitrile, valeronitrile, and butyronitrile.

In organic developing solution, well-known additives can be mixed as necessary. Examples of the additives include a surfactant. The surfactant is not particularly limited, and examples thereof include an ionic or nonionic fluorine-based and/or silicon-based surfactant.

The surfactant is preferably a nonionic surfactant, and is further preferably a nonionic fluorine-based surfactant or a nonionic silicon-based surfactant.

In the case of mixing the surfactant, the mixing content is generally of 0.001% to 5% by mass, is preferably 0.005% to 2% by mass, and is further preferably 0.01% to 0.5% by mass, with respect to the entire content of the organic developing solution.

The developing treatment can be implemented by using a well-known developing method, and examples thereof include a method for dipping the support into the developing solution for a certain period of time (a dipping method), a method for raising the developing solution on the surface of the support by surface tension and resting for a certain period of time (a puddle method), a method for s praying the developing solution on the surface of the support (a spray method), and a method for continuously coating a support which rotates at a constant speed with the developing solution while scanning a coating nozzle (a dynamic dispense method).

As the organic solvent containing a rinsing liquid used in the rinse treatment after the developing treatment in the solvent developing process, an organic solvent in which a resist pattern is not easily dissolved can be used by appropriately selecting from the organic solvents exemplified as the organic solvent used in the organic developing solution. Typically, at least one solvent selected from a hydrocarbon solvent, a ketone-based solvent, an ester-based solvent, an alcohol-based solvent, an amide-based solvent, and an ether-based solvent is used. Among them, at least one selected from the hydrocarbon solvent, the ketone-based solvent, the ester-based solvent, the alcohol-based solvent, and the amide-based solvent is preferably used, at least one selected from the alcohol-based solvent and the ester-based solvent is further preferably used, and the alcohol-based solvent is particularly preferable.

The alcohol-based solvent used in the rinsing liquid is preferably monohydric alcohol having 6 to 8 carbon atoms, or the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among them, 1-hexanol, 2-heptanol, and 2-hexanol are preferable, and 1-hexanol and 2-hexanol are further preferable.

These organic solvents may be used alone, or two or more kinds thereof may be used in combination. In addition, an organic solvent other than the organic solvents may be used in the mixture with water. Here, when it comes to the developing properties, the mixing content in the rinsing liquid is preferably equal to or less than 30% by mass, is further preferably equal to or less than 10% by mass, is still further preferably equal to or less than 5% by mass, and is particularly preferably equal to or less than 3% by mass with respect to the total content of the rinsing liquid.

In the rinsing liquid, well-known additives can be mixed as necessary. Examples of the additives include a surfactant. Examples of the surfactant include the same surfactant, and a nonionic surfactant is preferable, a nonionic fluorine-based surfactant or a nonionic silicon-based surfactant is further preferable.

In the case of mixing the surfactant, the mixing content is generally of 0.001% to 5% by mass, is preferably 0.005% to 2% by mass, and is further preferably 0.01% to 0.5% by mass, with respect to the entire content of the rinsing liquid.

The rinse treatment (washing treatment) using a rinsing liquid can be implemented by using a well-known rinsing method. Examples of a method of the rinse treatment include a method for continuously coating a support which rotates at a constant speed with the rinsing liquid (a rotary coating method), a method for dipping the support into the rinsing liquid (a dip method) for a certain period of time, and a method for spraying the rinsing liquid to the surface of the support (a spray method).

In the method for forming a resist pattern of the present embodiment, the resist composition according to the first aspect is used, and thus it is possible to form a resist pattern having excellent shape and to improve the limit resolution.

Polymer Compound

The polymer compound of the present embodiment is a polymer compound that has a structural unit (a01) represented by general formula (a0-1), a structural unit (a02) represented by general formula (a0-2), and a structural unit (a03) represented by general formula (a0-3).

The ratio of the structural unit (a03) is greater than 0 mol % and equal to or less than 10 mol % with respect to the total of the entire structural units constituting the polymer compound.

(a0-1)

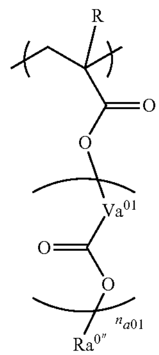

(a0-r1-1)

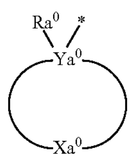

(a0-f1)

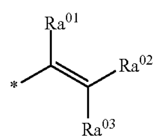

(a0-r1-2)

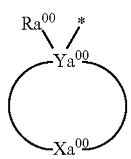

(a0-r1-3)

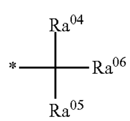

In general formula (a0-1), R is a hydrogen atom, an alkyl group having 1 to 5 carbon atoms, or a halogenated alkyl group having 1 to 5 carbon atoms. $Va^{01}$ is a divalent hydrocarbon group which may have an ether bond. $n_{a01}$ is an integer of 0 to 2. $Ra^{0''}$ is an acid dissociable group represented by general formula (a0-r1-1), (a0-r1-2), or (a0-r1-3). In general formula (a0-r1-1), $Ya^0$ represents a carbon atom. $Xa^0$ is a group which forms an alicyclic hydrocarbon group together with $Ya^0$. $Ra^0$ is an aromatic hydrocarbon group which may have a substituent, or a group represented by general formula (a0-f1). In general formula (a0-f1), $Ra^{01}$ to $Ra^{03}$ are each independently an aliphatic hydrocarbon group which may have a substituent, or a hydrogen atom. Two or more of $Ra^{01}$ to $Ra^{03}$ may be bonded to each other to form a cyclic structure. In general formula (a0-r1-2), $Ya^{00}$ represents a carbon atom. $Xa^{00}$ is a group which forms a condensed ring of an alicyclic hydrocarbon group and an aromatic hydrocarbon group together with $Ya^{00}$. $Ra^{00}$ is an alkyl group having 1 to 10 carbon atoms, an aromatic hydrocarbon group which may have a substituent, or a group represented by general formula (a0-f1). In general formula (a0-r1-3), $Ra^{04}$ and $Ra^{05}$ are each independently a monovalent chain saturated hydrocarbon group having 1 to 10 carbon atoms or a hydrogen atom. At least one hydrogen atom in the chain saturated hydrocarbon group may be substituted. $Ra^{06}$ is an aromatic hydrocarbon group which may have a substituent. A symbol of * represents a bond.

(a0-2)

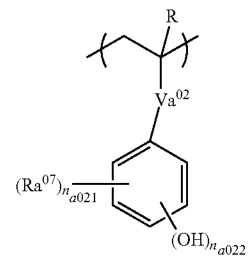

(a0-3)

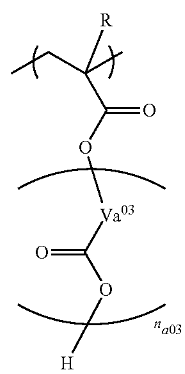

In general formula (a0-2), R is a hydrogen atom, an alkyl group having 1 to 5 carbon atoms, or a halogenated alkyl group having 1 to 5 carbon atoms. $Va^{02}$ is a divalent linking group containing a heteroatom, or a single bond. $Ra^{07}$ is a monovalent organic group. $n_{a021}$ is an integer of 0 to 3. $n_{a022}$ is an integer of 1 to 3. In general formula (a0-3), R is a hydrogen atom, an alkyl group having 1 to 5 carbon atoms, or a halogenated alkyl group having 1 to 5 carbon atoms. $Va^{03}$ is a divalent hydrocarbon group which may have an ether bond. $n_{a03}$ is an integer of 0 to 2.

In the polymer compound of the present embodiment, $Ra^{0''}$ in general formula (a0-1) is an acid dissociable group represented by general formula (a0-r1-1), and a polymer compound having a structural unit (a01) in which the total number of the carbon atoms contained in $Ya^0$, $Xa^0$, and $Ra^0$ is equal to or less than 11 is particularly useful as a base material component for a resist composition.

The polymer compound of the present embodiment is the same as the (A1) component, and the specific description thereof is the same as that of the (A1) component.

Method for preparing polymer compound ((A1) component)

The polymer compound ((A1) component) of the present embodiment can be prepared by a preparing method (I) or a preparing method (II), for example. Among them, a preparing method (II) is preferable from the viewpoint that a polymer compound is more stably synthesized.

Preparing Method (I):

The (A1) component can be prepared by dissolving the monomers that derive the respective structural units of the structural unit (a01), the structural unit (a02), and the structural unit (a03) in a polymerization solvent, and adding a radical polymerization initiator such as azobisisobutyronitrile (AIBN) and dimethyl 2,2'-azobisisobutyrate (for example, V-601) into the resultant so as to perform polymerization.

Preparing Method (II):

In addition, the (A1) component can be prepared by the preparing method including a first step of obtaining a first polymer compound by copolymerizing a monomer (hereinafter, also referred to as "monomer (m01)") that derives a structural unit (a01), a monomer (hereinafter, also referred to as "monomer (m02)") that derives a structural unit in which a hydrogen atom of a hydroxyl group in a structural unit (a02) is substituted with an acid dissociable group, and a second step of obtaining a second polymer compound by causing the first polymer compound to react with an acid component.

Examples of the acid dissociable group with which a hydrogen atom of a hydroxyl group in the structural unit (a02) is substituted include an acetal-type acid dissociable group and a tertiary alkyloxycarbonyl acid dissociable group. Among them, an acetal-type acid dissociable group is preferable from the viewpoint that the second polymer compound is more stably synthesized.

Hereinafter, the specific examples of the monomer (m02) will be described. In the formula, $R^{\alpha}$ represents a hydrogen atom, a methyl group, or a trifluoromethyl group.

(m0-2-11)

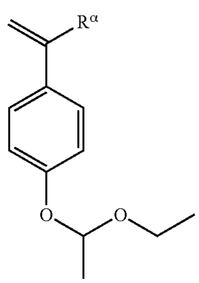

(m0-2-12)

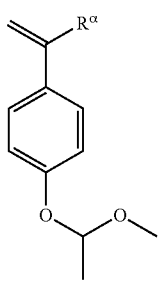

(m0-2-13)

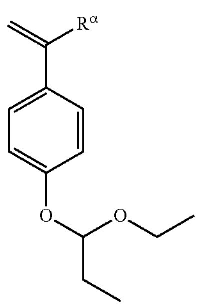

-continued (m0-2-14)

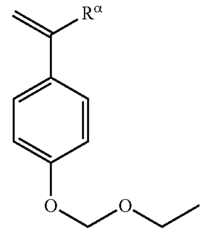

(m0-2-15)

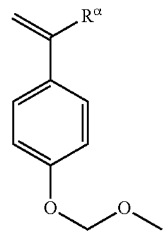

(m0-2-16)

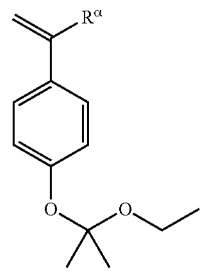

(m0-2-17)

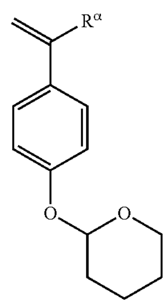

(m0-2-18)

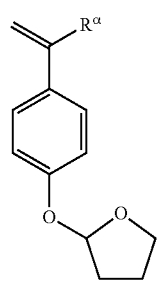

The acid component may be appropriately selected in consideration of the kind of the acid dissociable group contained in each of the monomer (m01) and the monomer (m02), and for example, an organic acid such as an acetic acid, an oxalic acid, a p-toluene sulfonic acid, a methane sulfonic acid, a trifluoromethane sulfonic acid, and a malonic acid; and an inorganic acid such as a sulfuric acid, a hydrochloric acid, a phosphoric acid, and a hydrobromic acid.

Among the acid components, a weak acid (preferably having a pKa of about 0 to 10 (25° C., in water)) is preferable, and an organic acid having a weak acid is more preferable, and an acetic acid is particularly preferable.

First Step:

A method for copolymerizing the monomer (m01) and the monomer (m02) is not particularly limited, and examples thereof include a known radical polymerization method and an anion polymerization method.

Copolymerization of the monomer (m01) and the monomer (m02) can be performed, for example, by adding and mixing the monomer (m01), the monomer (m02), and a polymerization initiator to a solvent, and heating the mixture in a nitrogen atmosphere.

The kinds of the monomer (m01) and the monomer (m02) are preferably selected in consideration of the strength of dissociation energy of each of the acid dissociable groups. Specifically, a combination of the monomer (m01) and the monomer (m02) is preferably selected such that the acid dissociable group contained in the structural unit derived from the monomer (m02) is selectively dissociated due to the action of the acid component in the second step. With this, among the second polymer compounds obtained in the second step, a ratio of the structural unit (a01) containing an acid dissociable group ($Ra^{0''}$), and a ratio of the structural unit (a02) containing a hydroxystyrene skeleton are suppressed to be more increased, and a ratio of remaining structural units (a03) is suppressed to be more decreased.

The use amount of each of the monomer (m01) and the monomer (m02) is appropriately determined in consideration of the ratio of the finally obtained polymer compound.

As the polymerization initiator, for example, in the case where a radical polymerization method is used, examples thereof include an azo compound such as 2,2'-azobisisobutyronitrile, 2,2'-azobis-(2,4-dimethyl valeronitrile), 2,2'-azobis-(4-methoxy-2,4-dimethyl valeronitrile) 2,2'-azobismethyl butyronitrile, 2,2'-azobiscyclohexane carbonitrile, cyanomethyl ethyl azoformamide, 2,2'-azobis(2-methyl propionate) dimethyl, and 2,2'-azobiscyano valeric acid; an organic peroxide such as benzoyl peroxide, lauroyl peroxide, 1,1'-bis-(t-butylperoxy) cyclohexane, 3,5,5-trimethyl hexanoyl peroxide, t-butylperoxy-2-ethyl hexanoate, and t-butyl peroxypivalate; and hydrogen peroxide.

In addition, as the polymerization initiator, for example, in the case where an anionic polymerization method is used, examples thereof include an organic alkali metal such as n-butyl lithium, s-butyl lithium, t-butyl lithium, ethyl lithium, ethyl sodium, 1,1-diphenyl hexyl lithium, and 1,1-diphenyl-3-methyl pentyl lithium.

The use amount of the polymerization initiator may be performed in accordance with the use amount of the monomer (m01) and the monomer (m02).

Examples of the solvent include aliphatic hydrocarbons such as hexane, heptane and octane; ethers such as diethyl ether and tetrahydrofuran; ketones such as acetone, methyl ethyl ketone, and methyl amyl ketone; alcohols such as methanol, ethanol and propanol; aromatic hydrocarbons such as benzene, toluene, and xylene; halogenated alkyls such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolves; aprotic polar solvents such as dimethyl formamide, dimethyl sulfoxide, and hexamethyl phosphoramide; and water.

Among them, ketones, ethers, alcohols, and esters are preferable.

The temperature condition during copolymerization of monomer (m01) and monomer (m02) is not particularly limited, and may be appropriately determined in accordance with the kinds of the polymerization initiators, for example.

For example, the temperature condition in the case of using the radical polymerization method is, for example, preferably 50° C. to 200° C., and is further preferably 60° C. to 120° C.

For example, the temperature condition in the case of using the anionic polymerization method is, for example, preferably −100° C. to 50° C., and is further preferably −80° C. to 0° C.

The reaction time during the copolymerization of the monomer (m01) and the monomer (m02) may be appropriately determined in accordance with the kind of the polymerization initiator, the temperature condition, or the like, for example, it is approximately of 0.5 to 24 hours, and preferably 0.5 to 8 hours.

Second Step

In the second step, the first polymer compound obtained in the first step and an acid component are reacted with each other so as to obtain a second polymer compound.

The reaction of the first polymer compound and the acid component can be performed, for example, by adding and mixing the first polymer compound and the acid component to a solvent under the nitrogen atmosphere.

The acid component used for the reaction is appropriately selected in consideration of the kinds of the acid dissociable group ($Ra^{0''}$), and the acid dissociable group with which a hydrogen atom of a hydroxyl group is substituted, among the first polymer compounds. It is preferable to select an acid component having an acid strength to the extent that the acid dissociable group with which a hydrogen atom of a hydroxyl group is substituted is selectively dissociated without dissociating the acid dissociable group ($Ra^{0''}$). With this, among the obtained second polymer compounds, the ratio of the structural unit (a01) containing an acid dissociable group ($Ra^{0''}$), and the ratio of the structural unit (a02) containing the hydroxystyrene skeleton are suppressed to be more increased, and the ratio of the remaining structural unit (a03) is suppressed to be more decreased.

The use amount of the acid component may be appropriately determined in accordance with the kind of the acid component and concentration condition, and is, for example, preferably 0.3 to 2.0 parts by mass, and is further preferably 0.7 to 1.6 parts by mass, with respect to 1 part by mass of the monomer (m02) used in the first step.

Examples of the solvent include the same solvents exemplified in the description for the first step. Among them, alcohols and water are preferable.

The temperature condition during the reaction of the first polymer compound and the acid component is not particularly limited, and may be appropriately determined in accordance with the kinds of the acid component, and the acid dissociable group in the first polymer compound. For example, it is preferably 0° C. to 60° C., and is further preferably 20° C. to 40° C.

The reaction time of the first polymer compound and the acid component may be appropriately determined in accordance with the kinds of the acid component, and the acid dissociable group in the first polymer compound. For example, it is preferably 1 to 24 hours, and is further preferably 3 to 10 hours.

After the second step, the reaction polymerization solution is precipitated by, for example, being added dropwise into a large amount of water or an organic solvent (for example, isopropanol, hexane, heptane, and methanol), and filtering is performed, and thereby a polymer compound may be obtained.

In addition, it is also preferable to wash the polymer compound obtained as described above with an organic solvent. Specifically, after causing the obtained polymer compound and an organic solvent to contact with each other, filtering and drying are performed. Depending on the solvent to be used, it is possible to remove unreacted monomers and the acid components by washing.

Further, the washed polymer compound may be isolated and purified as necessary. Conventionally known methods can be used for isolation and purification, and any one of them can be used alone, or two or more can be used in combination, for example, concentration, solvent extraction, distillation, crystallization, recrystallization, and chromatography.

In addition, in the preparing method (II), the monomer (m01) and the monomer (m02) are used as a monomer; however, in accordance with the properties of a desired polymer compound, other monomers may be further used in combination. That is, a polymer compound to be finally obtained may have a structural unit derived from other monomers. Examples of the structural unit derived from other monomers include the structural unit (a2) and the structural unit (a9).

Note that, at the time of the polymerization, a —$C(CF_3)_2$—OH group may be introduced to a terminal by using a chain transfer agent such as HS—$CH_2$—$CH_2$—$CH_2$—$C(CF_3)_2$—OH in combination. As such, a copolymer to which a hydroxyalkyl group in which at least one hydrogen atom in an alkyl group is substituted with a fluorine atom is introduced is effective in decreasing development defects and line edge roughness (LER: nonuniform irregularities of the side wall of line).

EXAMPLES

Hereinafter, the present invention will be more specifically described with reference to examples; however, the invention is not limited thereto.

Preparation Example of Base Material Component (Polymer Compound)

Preparing of Polymer Compound (A1)-1

10.5 g of monomer (a011), 20.0 g of p-ethoxyethoxystyrene (EESt), 1.1 g of 2,2'-azobis(2-methyl propionic acid) dimethyl (V-601) as a polymerization initiator, 62 g of methyl ethyl ketone as a solvent were added into a 300 mL flask, and polymerization reaction was performed at 85° C. for five hours. The copolymer in the polymerization solution obtained by the above polymerization reaction had a mass average molecular weight (Mw) of 8,800 and a molecular weight dispersivity (Mw/Mn) of 1.69.

Subsequently, 18.6 g of acetic acid and 265 g of methanol were added to the obtained polymerization solution, and the reaction (deprotection reaction) was performed at 30° C. for eight hours. After completion of the reaction, 380 g of heptane was added to the obtained reaction solution, the mixture was stirred and allowed to stand, and then an upper layer (a heptane layer) was removed. The mixture was concentrated up to 100 g of a lower polymer layer, and precipitation was performed in a mixed solution of 500 g of methanol and 500 g of water, followed by washing. The resulting white solid was filtered and dried overnight under reduced pressure to obtain 12.2 g of target polymer compound (A1)-1.

Regarding the obtained polymer compound (A1)-1, the mass average molecular weight (Mw) of 6,800, and the molecular weight dispersivity (Mw/Mn) of 1.64 were obtained by GPC measurement in terms of standard polystyrene.

In addition, the copolymer composition ratio (ratio of each constituent unit in the structural formula (molar ratio)) obtained by 13 carbon nuclear magnetic resonance spectrum (150 MHz_$^{13}$C-NMR) and 1 proton nuclear magnetic resonance spectrum (600 MHz_$^{1}$H-NMR) was l/m/n=31/66/3.

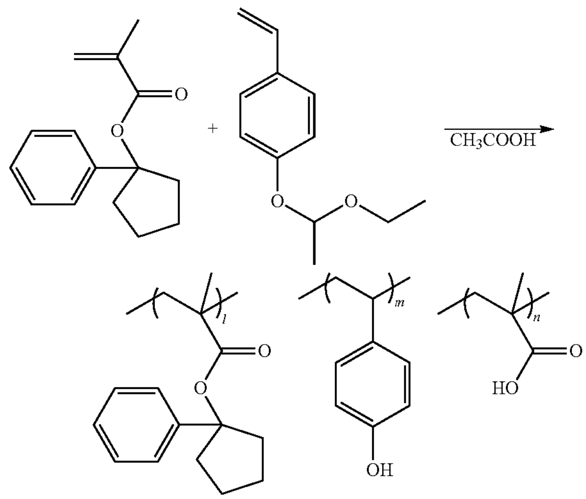

Polymer compound (A1)-1

Preparation of Polymer Compound (A1)-2

18.7 g of monomer (a012), 35.0 g of p-ethoxyethoxystyrene (EESt), 5.4 g of 2,2'-azobis(2-methyl propionic acid) dimethyl (V-601) as a polymerization initiator, 109 g of methyl ethyl ketone as a solvent were added into a 300 mL flask, and polymerization reaction was performed at 65° C. for seven hours. The copolymer in the polymerization solution obtained by the above polymerization reaction had a mass average molecular weight (Mw) of 8,800 and a molecular weight dispersivity (Mw/Mn) of 1.69.

Subsequently, 32.7 g of acetic acid and 470 g of methanol were added to the obtained polymerization solution, and the reaction (deprotection reaction) was performed at 30° C. for eight hours. After completion of the reaction, 600 g of ethyl acetate and 1,200 g of water were added to the obtained reaction solution, and the mixture was stirred and allowed to stand, and then a lower layer (an aqueous layer) was removed. An upper polymer layer was concentrated up to 150 g, and the resultant was subjected to precipitation in 1,500 g of heptane, and then washed.

The resulting white solid was filtered and dried overnight under reduced pressure to obtain 21.5 g of target polymer compound (A1)-2.

Regarding the obtained polymer compound (A1)-2, the mass average molecular weight (Mw) of 6,800, and the molecular weight dispersivity (Mw/Mn) of 1.72 were obtained by GPC measurement in terms of standard polystyrene.

In addition, the copolymer composition ratio (ratio of each constituent unit in the structural formula (molar ratio)) obtained by 13 carbon nuclear magnetic resonance spectrum (150 MHz_$^{13}$C-NMR) and 1 proton nuclear magnetic resonance spectrum (600 MHz_$^{1}$H-NMR) was l/m/n=39/60/1.

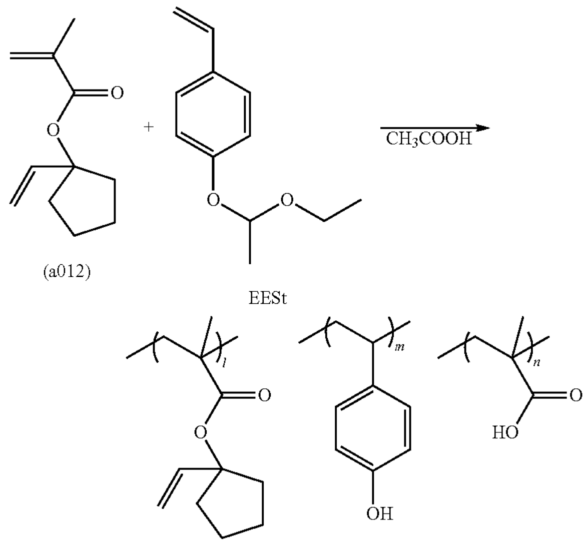

Polymer compound (A1)-2

Preparation of Polymer Compound (A1)-3

11.3 g of monomer (a013), 20.0 g of p-ethoxyethoxystyrene (EESt), 0.9 g of 2,2'-azobis(2-methyl propionic acid) dimethyl (V-601) as a polymerization initiator, 64 g of methyl ethyl ketone as a solvent were added into a 300 mL flask, and polymerization reaction was performed at 85° C. for five hours. The copolymer in the polymerization solution obtained by the above polymerization reaction had a mass average molecular weight (Mw) of 8,900 and a molecular weight dispersivity (Mw/Mn) of 1.71.

Subsequently, 18.4 g of acetic acid and 262 g of methanol were added to the obtained polymerization solution, and the reaction (deprotection reaction) was performed at 30° C. for eight hours. After completion of the reaction, 375 g of heptane was added to the obtained reaction solution, the mixture was stirred and allowed to stand, and then an upper layer (a heptane layer) was removed. Concentration was performed to provide 100 g of a lower polymer layer, and precipitation was performed in a mixed solution of 600 g of methanol and 400 g of water, followed by washing. The resulting white solid was filtered and dried overnight under reduced pressure to obtain 15.6 g of target polymer compound (A1)-3.

Regarding the obtained polymer compound (A1)-3, the mass average molecular weight (Mw) of 6,900, and the molecular weight dispersivity (Mw/Mn) of 1.65 were obtained by GPC measurement in terms of standard polystyrene.

In addition, the copolymer composition ratio (ratio of each constituent unit in the structural formula (molar ratio)) obtained by 13 carbon nuclear magnetic reasonance spectrum (150 MHz_$^{13}$C-NMR) and 1 proton nuclear magnetic reasonance spectrum (600 MHz_$^{1}$H-NMR) was l/m/n=34/65/1.

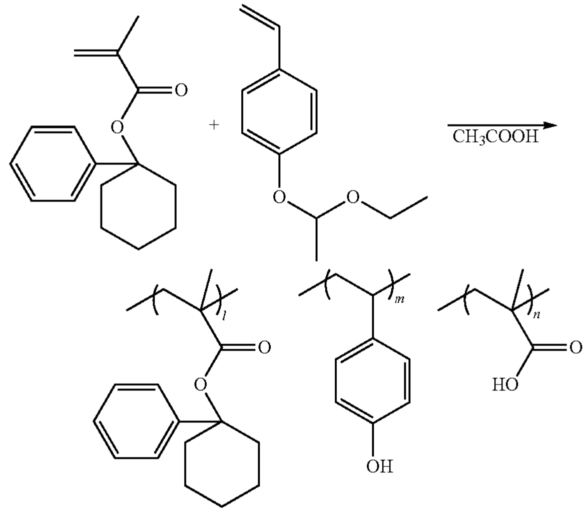

Polymer compound (A1)-3

Preparation of Polymer Compound (A2)-1

10.5 g of monomer (a011), 16.9 g of p-acetoxystyrene (PACS), 1.1 g of 2,2'-azobis (2-methyl propionic acid) dimethyl (V-601), and 54 g of methyl ethyl ketone as a solvent were added into a 300 mL flask, and polymerization reaction was performed at 85° C. for five hours. The copolymer in the polymerization solution obtained by the above polymerization reaction had an average molecular weight (Mw) of 8,000, and a molecular weight dispersivity (Mw/Mn) of 1.70.

Subsequently, 12.0 g of triethyl amine, 45 g of methanol, and 3.0 g of water were added into the obtained polymerization solution, and then reaction was performed for eight hours while heating to reflux (deprotection reaction). After completion of the reaction, the reaction solution was concentrated, the obtained copolymer was dissolved in 30 g of acetone, and the resultant was subjected to precipitation in 300 g of water, and then washed. The resulting white solid was filtered and dried overnight under reduced pressure to obtain 10.2 g of target polymer compound (A2)-1.

Regarding the obtained polymer compound (A2)-1, the mass average molecular weight (Mw) of 5,700, and the molecular weight dispersivity (Mw/Mn) of 1.75 were obtained by GPC measurement in terms of standard polystyrene.

In addition, the copolymer composition ratio (ratio of each constituent unit in the structural formula (molar ratio)) obtained by 13 carbon nuclear magnetic resonance spectrum (150 MHz_$^{13}$C-NMR) and 1 proton nuclear magnetic resonance spectrum (600 MHz_$^{1}$H-NMR) was l/m/n=18/65/17.

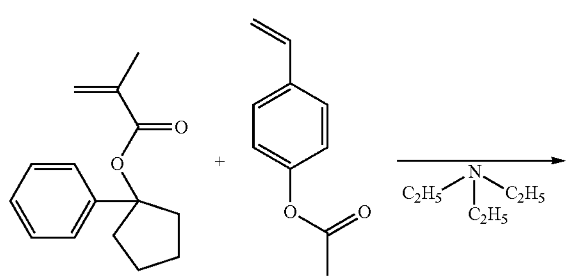

-continued

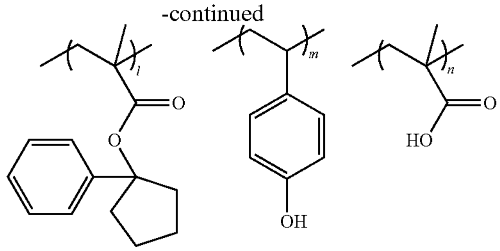

Polymer compound (A2)-1

Preparation of Polymer Compound (A2)-2

A target polymer compound (A2)-2 was obtained by performing the radical polymerization on the monomer (a01), the monomer (a21), and the monomer (a91) at a predetermined molar ratio.

Regarding the obtained polymer compound (A2)-2, the mass average molecular weight (Mw) of 7,600, and the molecular weight dispersivity (Mw/Mn) of 1.92 were obtained by GPC measurement in terms of standard polystyrene.

In addition, the copolymer composition ratio (ratio of each structural unit in the structural formula (molar ratio)) obtained by 13 carbon nuclear magnetic resonance spectrum (150 MHz_$^{13}$C-NMR) and 1 proton nuclear magnetic resonance spectrum (600 MHz_$^{1}$H-NMR) was l/m/n=45/30/25.

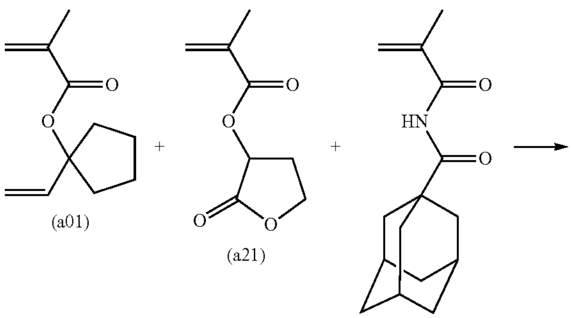

(a01) (a21) (a91)

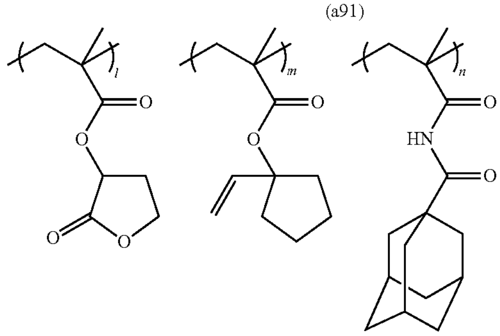

Polymer compound (A2)-2

Preparation of Resist Composition

Examples 1 to 3 and Comparative Example 1

The components indicated in Table 1 were mixed and dissolved to prepare a resist composition (2.0% by mass of solid content concentration) of the respective examples. [0295]

TABLE 1

| | (A) component | | (B) component | (D) component | (S) component |
|---|---|---|---|---|---|
| Example 1 | (A)-1 [50] | (A)-5 [50] | (B)-1 [20] | (D)-1 [3] | (S)-1 [6000] |
| Example 2 | (A)-2 [50] | (A)-5 [50] | (B)-1 [20] | (D)-1 [3] | (S)-1 [6000] |
| Example 3 | (A)-3 [50] | (A)-5 [50] | (B)-1 [20] | (D)-1 [3] | (S)-1 [6000] |
| Comparative Example 1 | (A)-4 [50] | (A)-5 [50] | (B)-1 [20] | (D)-1 [3] | (S)-1 [6000] |

Each abbreviation in Table 1 has the following meaning. In addition, the numerical value in the brackets is the compounding amount (parts by mass).

(A)-1: the polymer compound (A1)-1

(A)-2: the polymer compound (A1)-2

(A)-3: the polymer compound (A1)-3

(A)-4: the polymer compound (A2)-1

(A)-5: the polymer compound (A2)-2

(B)-1: acid generator including the compound represented by the following Chemical formula (B-1)

(D)-1: acid diffusion control agent including the compound represented by the following Chemical formula (D-1)

(S)-1: mixed solvent of propylene glycol monomethyl ether acetate/propylene glycol monomethyl ether=20/80 (mass ratio)

(B-1)

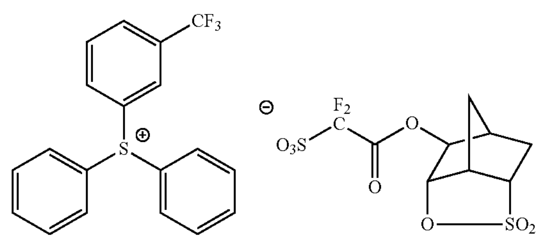

(D-1)

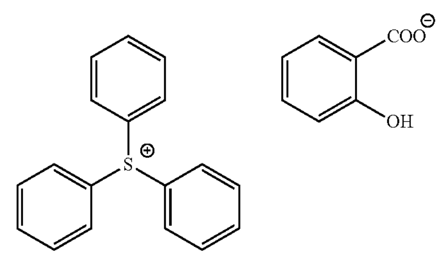

Formation of Resist Pattern

An 8-inch silicon substrate treated with hexamethyl disilazane (HMDS) was coated with the resist composition of each example with a spinner, was subjected to a pre-baking (PAB) treatment at 110° C. for 60 seconds on a hot plate, and was dried, thereby forming a resist film having a film thickness of 30 nm.

Next, on the resist film, lithography (exposure) was performed using an electron beam drawing apparatus JEOL-JBX-9300FS (manufactured by JEOL Ltd.) at an acceleration voltage of 100 kV setting a 1:1 line and space pattern (hereinafter, referred to as an "LS pattern") having a line width of 50 to 16 nm as a target size. Thereafter, a post exposure bake (PEB) treatment was performed at 110° C. for 60 seconds.

Then, the resist film was subjected to an alkali developing at 23° C. for 60 seconds with an aqueous solution containing 2.38% by mass of tetramethyl ammonium hydroxide (TMAH) "NMD-3" (product name, prepared by Tokyo Ohka Kogyo Co., Ltd).

Thereafter, water rinsing was performed for 60 seconds with pure water.

As a result, a 1:1 LS pattern having a line width of 50 to 16 nm was formed.

Evaluation of Optimum Exposure Amount (Eop)

The optimum exposure amount (μC/cm$^2$) at which the LS pattern having a target size was formed was obtained by the above resist pattern forming method, and was shown as "Eop (μC/cm$^2$)" in Table 2.

Evaluation of Limit Resolution

The limit resolution at the Eop, specifically, when the LS pattern is formed by gradually increasing the exposure amount from the optimum exposure amount Eop, the minimum dimension of the pattern resolved without collapse was measured by a scanning electron microscope S-9380 (manufactured by Hitachi High-Technologies Corporation), and was shown as "resolution performance (nm)" in Table 2.

Evaluation of LS Pattern Shape

The shape of the LS pattern formed by the above "Formation of resist pattern" was observed by using a scanning electron microscope (SEM, acceleration voltage of 800 V, product name: SU-8000, manufactured by Hitachi High-Technologies Corporation), and was shown as "shape" in Table 2.

TABLE 2

| | PAB (° C.) | PEB (° C.) | Eop (μC/cm$^2$) | Resolution (nm) | Shape |
|---|---|---|---|---|---|
| Example 1 | 110 | 110 | 86 | 22 | Rectangular shape |
| Example 2 | 110 | 110 | 89 | 22 | Rectangular shape |
| Example 3 | 110 | 110 | 87 | 24 | Rectangular shape |
| Comparative Example 1 | 110 | 110 | 82 | 40 | Rectangular shape |

From the results shown in Table 2, it is possible to confirm that the resist compositions in examples to which the present invention is applied can form a resist pattern having excellent shape in the forming of the resist pattern and improve the limit resolution.

What is claimed is:

1. A resist composition which generates an acid upon exposure and whose solubility in a developing solution changes under the action of an acid, the composition comprising:

a base material (A) whose solubility in the developing solution changes under the action of an acid and an acid generator component (B), wherein the base material (A) comprises a polymer compound (A1) having a structural unit (a01), a structural unit (a02), and a structural unit (a03), wherein a ratio of the structural unit (a03) in the polymer compound (A1) is greater than 0 mol % and equal to or less than 10 mol % with respect to the total of all the structural units constituting the polymer compound (A1), the structural unit (a01) is represented by general formula (a0-1) shown below:

(a0-1)

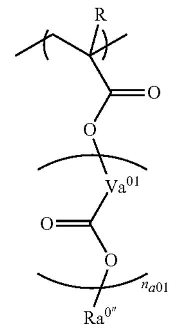

wherein R is a hydrogen atom, an alkyl group having 1 to 5 carbon atoms, or a halogenated alkyl group having 1 to 5 carbon atoms, $Va^{01}$ is a divalent hydrocarbon group which may have an ether bond, $n_{ao1}$ is an integer of 0 to 2, and $Ra^{0''}$ is an acid dissociable group represented by general formula (a0-r1-1), (a0-r1-2), or (a0-r1-3) shown below:

(a0-r1-1)

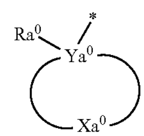

(a0-r1-2)

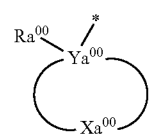

(a0-r1-3)

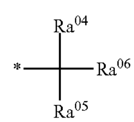

wherein in general formula (a0-r1-1), $Ya^0$ represents a carbon atom, $Xa^0$ is a group which forms an alicyclic hydrocarbon group together with $Ya^0$, $Ra^0$ is an aromatic hydrocarbon group which may have a substituent, or a group represented by general formula (a0-f1) shown below:

(a0-f1)

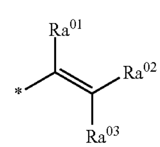

wherein $Ra^{01}$ to $Ra^{03}$ are each independently an aliphatic hydrocarbon group which may have a substituent, or a hydrogen atom, and two or more of $Ra^{01}$ to $Ra^{03}$ may be bonded to each other to form a cyclic structure;

in general formula (a0-r1-2), $Ya^{00}$ represents a carbon atom, $Xa^{00}$ is a group which forms a condensed ring of an alicyclic hydrocarbon group and an aromatic hydrocarbon group together with $Ya^{00}$, and $Ra^{00}$ is an alkyl group having 1 to 10 carbon atoms, an aromatic hydrocarbon group which may have a substituent, or a group represented by general formula (a0-f1) shown above;

in general formula (a0-r1-3), $Ra^{04}$ and $Ra^{05}$ are each independently a monovalent chain saturated hydrocarbon group having 1 to 10 carbon atoms or a hydrogen atom, at least one hydrogen atom of the chain saturated hydrocarbon group may be substituted, and $Ra^{06}$ is an aromatic hydrocarbon group which may have a substituent; and a symbol of * represents a bond;

the structural unit (a02) is represented by general formula (a0-2) shown below:

(a0-2)

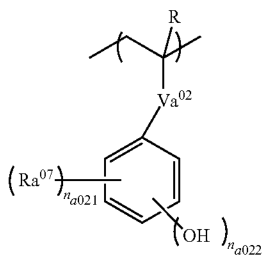

wherein R is a hydrogen atom, an alkyl group having 1 to 5 carbon atoms, or a halogenated alkyl group having 1 to 5 carbon atoms, $Va^{02}$ is a divalent linking group containing a heteroatom, or a single bond, $Ra^{w}$ is a monovalent organic group, $n_{a021}$ is an integer of 0 to 3, and $n_{ao22}$ is an integer of 1 to 3; and the structural unit (a03) is represented by general formula (a0-3) shown below:

(a0-3)

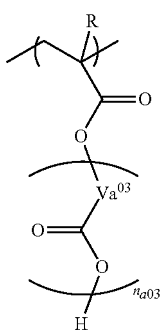

wherein R is a hydrogen atom, an alkyl group having 1 to 5 carbon atoms, or a halogenated alkyl group having 1 to 5 carbon atoms, $Va^{03}$ is a divalent hydrocarbon group which may have an ether bond, and $n_{a03}$ is an integer of 0 to 2.

2. The resist composition according to claim 1, wherein $Ra^{0''}$ in general formula (a0-1) is an acid dissociable group represented by general formula (a0-r1-1), and the total number of the carbon atoms contained in $Ya^0$, $Xa^0$, and $Ra^0$ is 11 or less.

3. A method for forming a resist pattern, comprising:

forming a resist film on a support by using the resist composition according to claim 1;

exposing the resist film; and developing the exposed resist film to form a resist pattern.

4. The method for forming a resist pattern according to claim 3, wherein the resist film is exposed to extreme ultraviolet ray (EUV) or an electron beam (EB).

5. A polymer compound comprising a structural unit (a01), a structural unit (a02), and a structural unit (a03), wherein a ratio of the structural unit (a03) is greater than 0 mol % and equal to or less than 10 mol % with respect to the total of the entire structural units constituting the polymer compound;

the structural unit (a01) is represented by general formula (a0-1) shown below:

(a0-1)

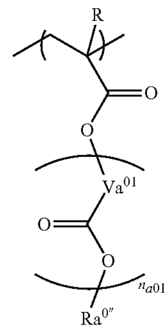

wherein R is a hydrogen atom, an alkyl group having 1 to 5 carbon atoms, or a halogenated alkyl group having 1 to 5 carbon atoms, $Va^{01}$ is a divalent hydrocarbon group which may have an ether bond, $n_{ao1}$ is an integer of 0 to 2, and $Ra^{0''}$ is an acid dissociable group represented by general formula (a0-r1-1), (a0-r1-2), or (a0-r1-3) shown below:

(a0-r1-1)

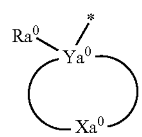

(a0-r1-2)

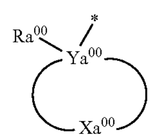

(a0-r1-3)

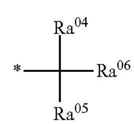

wherein in general formula (a0-r1-1), $Ya^0$ represents a carbon atom, $Xa^0$ is a group which forms an alicyclic hydrocarbon group together with $Ya^0$, $Ra^0$ is an aromatic hydrocarbon group which may have a substituent, or a group represented by general formula (a0-f1) shown below:

(a0-f1)

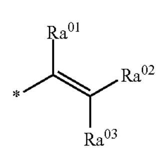

wherein $Ra^{01}$ to $Ra^{03}$ are each independently an aliphatic hydrocarbon group which may have a substituent, or a hydrogen atom, and two or more of $Ra^{01}$ to $Ra^{03}$ may be bonded to each other to form a cyclic structure;

in general formula (a0-r1-2), $Ya^{00}$ represents a carbon atom, $Xa^{00}$ is a group which forms a condensed ring of an alicyclic hydrocarbon group and an aromatic hydrocarbon group together with $Ya^{00}$, and $Ra^{00}$ is an alkyl group having 1 to 10 carbon atoms, an aromatic hydrocarbon group which may have a substituent, or a group represented by general formula (a0-f1) shown above;

in general formula (a0-r1-3), $Ra^{04}$ and $Ra^{05}$ are each independently a monovalent chain saturated hydrocarbon group having 1 to 10 carbon atoms or a hydrogen atom, at least one hydrogen atom of the chain saturated hydrocarbon group may be substituted, and $Ra^{06}$ is an aromatic hydrocarbon group which may have a substituent; and a symbol of * represents a bond;

the structural unit (a02) is represented by general formula shown below:

(a0-2)

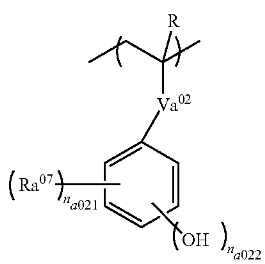

wherein R is a hydrogen atom, an alkyl group having 1 to 5 carbon atoms, or a halogenated alkyl group having 1 to 5 carbon atoms, $Va^{02}$ is a divalent linking group containing a heteroatom, or a single bond, $Ra^{07}$ is a monovalent organic group, $n_{a021}$ is an integer of 0 to 3, and $n_{a022}$ is an integer of 1 to 3; and the structural unit (a03) is represented by general formula (a0-3) shown below:

(a0-3)

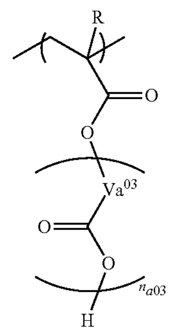

wherein R is a hydrogen atom, an alkyl group having 1 to 5 carbon atoms, or a halogenated alkyl group having 1 to 5 carbon atoms, $Va^{03}$ is a divalent hydrocarbon group which may have an ether bond, and $n_{a03}$ is an integer of 0 to 2.

6. The polymer compound according to claim 5, wherein $Ra_{0''}$ in general formula (a0-1) is an acid dissociable group represented by general formula (a0-r1-1), and the total number of the carbon atoms contained in $Ya^0$, $Xa^0$, and $Ra^0$ is 11 or less.

* * * * *

UNITED STATES PATENT AND TRADEMARK OFFICE

CERTIFICATE OF CORRECTION

PATENT NO. : 10,295,905 B2
APPLICATION NO. : 15/651177
DATED : May 21, 2019
INVENTOR(S) : Yoshitaka Komuro et al.

It is certified that error appears in the above-identified patent and that said Letters Patent is hereby corrected as shown below:

In the Specification

Column 6, Line 25, "substituent)($R^{\alpha 0}$)" should be --substituent ($R^{\alpha 0}$)--.

Column 28, Line 58, "$—[Y^{21}—C(=O)—O]_{m'}—Y^{22}—$," should be -- $—[Y^{21}—C(=O)—O]_{m''}—Y^{22}—$,--.

Column 93, Line 43, "$C_aH_{2a+1}SO^{-}$" should be --$C_aH_{2a+1}SO_3^{-}$--.

Column 98, Line 29, "nonen," should be --nonene,--.

Column 99, Line 15, "diphonyl" should be --diphenyl--.

Column 115, Line 64, "reasonance" should be --resonance--.

Column 115, Line 66, "reasonance" should be --resonance--.

In the Claims

Column 120, Line 20 (Claim 1), "$n_{ao1}$" should be --$n_{a01}$--.

Column 121, Line 29 (Claim 1), "$Ra^{w}$" should be --$Ra^{07}$--.

Column 121, Line 31 (Claim 1), "$n_{ao22}$" should be --$n_{a022}$--.

Column 122, Line 29 (Claim 5), "$n_{ao1}$" should be --$n_{a01}$--.

Column 124, Line 31 (Claim 6), "$Ra_{0''}$" should be --$Ra^{0''}$--.

Signed and Sealed this
Twenty-fourth Day of September, 2019

Andrei Iancu
*Director of the United States Patent and Trademark Office*